(12) United States Patent
Yamamoto et al.

(10) Patent No.: US 6,733,954 B2
(45) Date of Patent: May 11, 2004

(54) SEMICONDUCTOR MODULE SUBSTRATE SHEET, SEMICONDUCTOR MODULE SUBSTRATE SHEET FABRICATING METHOD AND SEMICONDUCTOR MODULE

(75) Inventors: Kunitoshi Yamamoto, Kyoto (JP); Koichiro Tsuji, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 0 days.

(21) Appl. No.: 10/396,419

(22) Filed: Mar. 26, 2003

(65) Prior Publication Data

US 2003/0157437 A1 Aug. 21, 2003

Related U.S. Application Data

(62) Division of application No. 09/601,766, filed as application No. PCT/JP99/00576 on Feb. 10, 1999, now Pat. No. 6,573,028.

(30) Foreign Application Priority Data

Feb. 10, 1998 (JP) .............................. 10-44628

(51) Int. Cl.[7] .................................. G03C 5/56
(52) U.S. Cl. ...................... 430/311; 430/312; 430/313; 430/318; 430/394; 430/396
(58) Field of Search ................................ 430/311, 312, 430/313, 318, 394, 396

(56) References Cited

U.S. PATENT DOCUMENTS

| 4,804,615 A | 2/1989 | Larson et al. ............... 430/314 |
| 4,883,571 A | 11/1989 | Kondo et al. ............... 204/478 |
| 6,174,562 B1 | 1/2001 | Bergstedt .................... 430/311 |

FOREIGN PATENT DOCUMENTS

| JP | 5-67694 | 3/1993 |
| JP | 9-129780 | 5/1997 |

*Primary Examiner*—Mark F. Huff
*Assistant Examiner*—Daborah Chacko-Davis
(74) *Attorney, Agent, or Firm*—Wenderoth, Lind & Ponack, L.L.P.

(57) ABSTRACT

Through holes are formed at four peripheral edges of a plurality of semiconductor chip placement regions of an insulating substrate, except for coupling portions partially arranged thereat. A substrate sheet for semiconductor module is used in which connecting portions between inner lead portions and outer lead portions arranged on both surfaces of the substrate are formed in pattern on the side wall surface of the through hole. The semiconductor chip is mounted on each region, electrode terminals thereof and the inner lead portions are electrically connected to each other, the chip is sealed, and then the coupling portions are cut.

5 Claims, 57 Drawing Sheets

SEMICONDUCTOR MODULE SUBSTRATE SHEET, SEMICONDUCTOR MODULE SUBSTRATE SHEET FABRICATING METHOD AND SEMICONDUCTOR MODULE

This application is a divisional application of Ser. No. 09/601,766, filed Aug. 8, 2000 now U.S. Pat. No. 6,573,028 which is a national stage application of International Application Number PCT/JP99/00576 filed on Feb. 10, 1999.

TECHNICAL FIELD

The present invention relates to a semiconductor module substrate sheet that constitutes a semiconductor module with one or a plurality of semiconductor chips of monolithic IC's, hybrid IC's, multi-tip IC's, diodes, transistors, thyristors, or the like mounted thereon, a method for fabricating the semiconductor module substrate sheet and a semiconductor module constructed of the substrate sheet mounted with semiconductor chips mounted thereon.

BACKGROUND ART

Conventionally, a semiconductor package of a monolithic IC, a hybrid IC, a multi-tip IC, a diode, a transistor, a thyristor, or the like has been formed by punching by using a press, or by etching a metal conductor of a die pad and leads on which a semiconductor chip is mounted as represented by a lead frame, mounting the semiconductor chip on the die pad, and electrically connecting the electrode terminals of the semiconductor chip with inner lead sections of the leads by way of thin metal wires by bonding or similar means. Thereafter, the semiconductor chip and at least the inner lead sections on the through hole side are encapsulated and the outer lead sections of the leads are bonded by means of a die for the mounting of the semiconductor package on a printed wiring board.

However, the lead frame, which is required to support the semiconductor chip by the die pad and to be bent for the mounting thereof on the printed wiring board, has therefore, been required to have a rigidity. For the above reasons, the metallic lead frame has not been able to have a reduced thickness, and consequently, pure copper, which has good electrical conductivity, has been hard to use. Furthermore, the adjacent outer lead sections have connected portions partially connected with each other when the semiconductor chip or the like is encapsulated. Therefore, after the encapsulating process, a process has been required for cutting the connected portions (called the tie bar) with a die or the like, so the outer lead sections have independent pins.

In view of the above, there have been lately devised a number of various types of semiconductor packages 914 in which the lead material is not required to have rigidity, obviating the need for cutting the many tie bars during the fabricating process. One of the types is formed by bending a flexible substrate of a film 15 or the like provided with inner lead sections 5 and outer lead sections 6 (see FIG. 70), bonding this to a substrate 13 of the semiconductor package 914 so that the outer lead sections 6 are formed on the rear surface of the substrate 13 and so that the inner lead sections 5 and the outer lead sections 6 are connected together by way of respective connection sections 7 provided on side surfaces of the substrate 13. Thereafter, a semiconductor chip 10 is mounted on the substrate 13, and the semiconductor chip 10 is connected with the inner lead sections 5 by way of wires 11. Thereafter, the semiconductor chip 10 or the like is encapsulated with an encapsulating section 12, allowing the semiconductor package 914 to be surface-mountable (see FIG. 71).

However, the above method, which requires many fabricating steps including the formation of the inner lead sections and the like on a film and then the bending and bonding of the film, has disadvantageously been troublesome.

In recent years, some semiconductor packages such as IC's except for diodes, transistors, and thyristors, have been required to more seriously cope with high-density mounting of semiconductor chips. In accordance with this, the inner lead sections to be electrically bonded by wire bonding or similar method to the electrode terminals of the semiconductor chip are required to have an increased number of pins and narrower pitches. In the case of the semiconductor package having an increased number of pins and narrower pitches as described above, even a slight error in positional alignment occurring in the film bending and bonding stages cannot be ignored, and this positional alignment error disadvantageously has caused difficulties in maintaining the dimensional accuracy.

Accordingly, the object of the present invention is to solve the aforementioned issues and to provide a semiconductor module which can be fabricated in a reduced number of fabricating steps, a semiconductor module substrate sheet to be used for the fabricating process, and a method for fabricating the sheet.

DISCLOSURE OF INVENTION

In order to achieve the aforementioned object, the present invention is constructed as follows.

According to a first aspect of the present invention, there is provided a semiconductor module substrate sheet comprising an insulating substrate having a semiconductor chip placement region on which a semiconductor chip can be placed. A plurality of inner lead sections are formed on a surface identical to that of the semiconductor chip placement region of the insulating substrate and respectively electrically connected to a plurality of electrode terminals of the semiconductor chip placed on the semiconductor chip placement region so as to form a semiconductor module. A plurality of outer lead sections are formed on a surface opposite to that of the semiconductor chip placement region of the insulating substrate, and a plurality of connecting sections respectively connect the plurality of inner lead sections to the plurality of outer lead sections on a side wall surface of the insulating substrate.

According to a second aspect of the present invention, there is provided a semiconductor module substrate sheet as defined in the first aspect, comprising a recess of a size capable of receiving the semiconductor chip in the semiconductor chip placement region.

According to a third aspect of the present invention, there is provided a semiconductor module substrate sheet as defined in the first or second aspect, wherein the insulating substrate has through holes and the plurality of connecting sections are formed on side wall surfaces of the through holes.

According to a fourth aspect of the present invention, there is provided a semiconductor module substrate sheet as defined in the third aspect, wherein the through holes of the insulating substrate are arranged on the two opposite sides of the semiconductor chip placement region having a rectangular shape.

According to a fifth aspect of the present invention, there is provided a semiconductor module substrate sheet as defined in the third aspect, wherein the through holes of the insulating substrate are arranged on four sides of the semiconductor chip placement region having a rectangular shape.

According to a sixth aspect of the present invention, there is provided a semiconductor module substrate sheet as defined in the first or second aspect, wherein the insulating substrate has a recess at its edge, and the plurality of connecting sections are formed on a side wall surface of the recess.

According to a seventh aspect of the present invention, there is provided a semiconductor module substrate sheet as defined in the first or second aspect, wherein the plurality of connecting sections are formed on the side wall surface of the edge of the insulating substrate.

According to an eighth aspect of the present invention, there is provided a semiconductor module substrate sheet as defined in any one of the first through seventh aspects, wherein the plurality of inner lead sections are arranged so as to respectively extend from the plurality of connecting sections toward the semiconductor chip placement region, and the plurality of outer lead sections are arranged so as to respectively extend from the plurality of connecting sections toward a region corresponding to the semiconductor chip placement region on a rear surface of the substrate sheet.

According to a ninth aspect of the present invention, there is provided a semiconductor module substrate sheet as defined in any one of the third through fifth aspects, wherein the plurality of inner lead sections are arranged so as to respectively extend from the plurality of connecting sections in a direction opposite to the semiconductor chip placement region. Meanwhile, the plurality of outer lead sections are arranged so as to respectively extend from the plurality of connecting sections in a direction opposite to a region corresponding to the semiconductor chip placement region on a rear surface of the substrate sheet.

According to a 10th aspect of the present invention, there is provided a method for fabricating the semiconductor module substrate sheet defined in any one of the first through ninth aspect. The method comprises providing metal layers on both surfaces of the insulating substrate and the side wall surface of the insulating substrate. Thereafter photoresist films are formed on the metal layers. The formed photoresist films are then partially exposed to light and then developed for patterning of etching resist layers that exist in portions to be left as the inner lead sections and the outer lead sections and portions to be left as the connecting sections on the side wall surface. Thereafter, the metal layer is removed by etching portions that are not covered with the etching resist layers. Thereafter, the etching resist layer is removed to form the inner lead sections, the outer lead sections, and the connecting sections.

According to an 11th aspect of the present invention, there is provided a method for fabricating the semiconductor module substrate sheet defined in any one of the first through ninth aspects. The method comprises forming photoresist films on both surfaces of the insulating substrate and the side wall surface of the insulating substrate. Thereafter, the photoresist films are then partially exposed to light and then developed the same for patterning of plating resist layers that exist in unnecessary portions of the inner lead sections and the outer lead sections and unnecessary portions of the connecting sections on the side wall surface. Thereafter, the inner lead sections, the outer lead sections, and the connecting sections in portions that belong to both surfaces of the insulating substrate and the side wall surface are formed by performing electroless plating or electroplating and are not covered with the plating resist layer.

According to a 12th aspect of the present invention, there is provided a semiconductor module substrate sheet fabricating method as defined in the 10th aspect, wherein the photoresist film is a photocurable type when patterning the etching resist layer. The exposing to light is performed with a first mask in which lead pattern forming-sections for forming the inner lead sections and connection pattern forming-sections for forming the connecting sections transmit light and the other portions do not transmit light. A light control sheet diffuses or refracts incident light and then emits the light from a side opposite from an incident side superposed on one surface of the substrate. The exposing to light is then performed with a second mask in which lead pattern forming-sections for forming the outer lead sections and connection pattern forming-sections for forming the connecting sections transmit light and the other portions do not transmit light. A light control sheet diffuses or refracts incident light and then emits the light from a side opposite from an incident side superposed on the other surface of the substrate, resulting in curing only exposed portions of the photoresist film. Thereafter, the photoresist film is developed for the removal of uncured portions other than cured portions to form the etching resist layer in portions where the inner lead sections, the outer lead sections, and the connecting sections are formed.

According to a 13th aspect of the present invention, there is provided a semiconductor module substrate sheet fabricating method as defined in the 10th aspect, wherein the photoresist film is a photolysis type when patterning the etching resist layer. The exposing to light is performed with a third mask in which lead pattern forming-sections for forming the inner lead sections and connection pattern forming-sections for forming the connecting sections obstruct light and the other portions transmit light. A light control sheet diffuses or refracts incident light and then emits the light from a side opposite from an incident side superposed on one surface of the substrate. The exposing to light is then performed with a fourth mask in which lead pattern forming-sections for forming the outer lead sections and connection pattern forming-sections for forming the connecting sections obstruct light and the other portions transmit light. A light control sheet diffuses or refracts incident light and then emits the light from a side opposite from an incident side superposed on the other surface of the substrate, resulting in photolysis of only exposed portions of the photoresist film. Thereafter, the photoresist film is developed for the removal of only portions that have undergone photolysis to form the etching resist layer in portions where the inner lead sections, the outer lead sections, and the connecting sections are formed.

According to a 14th aspect of the present invention, there is provided a semiconductor module substrate sheet fabricating method as defined in the 10th aspect, wherein the photoresist film is a photocurable type when patterning the etching resist layer. The exposing to light is performed with a fifth mask in which lead pattern forming-sections for forming either one of the inner lead sections and the outer lead sections and connection pattern forming-sections for forming the connecting sections transmit light and the other portions do not transmit light. A light control sheet diffuses or refracts incident light and then emits the light from a side opposite from an incident side superposed on one surface of the substrate. The exposing to light is performed with a sixth mask in which only lead pattern forming-sections for forming the other one of the inner lead sections and the outer lead sections transmit light and the other portions do not transmit light superposed on the other surface of the substrate, resulting in curing of only exposed portions of the photoresist film. Thereafter, the photoresist film is developed for the removal of uncured portions other than cured portions to form the etching resist layer in portions where the inner lead sections, the outer lead sections, and the connecting sections are formed.

According to a 15th aspect of the present invention, there is provided a semiconductor module substrate sheet fabricating method as defined in the 10th aspect, wherein the photoresist film is a photolysis type when patterning the etching resist layer. The exposing to light is performed with a seventh mask in which lead pattern forming-sections for forming either one of the inner lead sections and the outer lead sections and connection pattern forming-sections for forming the connecting sections obstruct light and the other portions transmit light. A light control sheet diffuses or refracts incident light and then emits the light from a side opposite from an incident side superposed on one surface of the substrate. The exposing to light is then performed with an eighth mask in which lead pattern forming-sections for forming the other one of the inner lead sections and the outer lead sections and sections to be superposed on the through holes obstruct light and the other portions transmit light superposed on the other surface of the substrate, resulting in photolysis of only exposed portions of the photoresist film. Thereafter, the photoresist film is developed for the removal of portions that have undergone photolysis to form the etching resist layer in portions where the inner lead sections, the outer lead sections, and the connecting sections are formed.

According to a 16th aspect of the present invention, there is provided a semiconductor module substrate sheet fabricating method as defined in the 11th aspect, wherein the photoresist film is a photocurable type when patterning the plating resist layer. The exposing to light is performed with a ninth mask in which lead pattern forming-sections for forming the inner lead sections and connection pattern forming-sections for forming the connecting sections do not transmit light and the other portions transmit light. A light control sheet diffuses or refracts incident light and then emits the light from a side opposite from an incident side superposed on one surface of the substrate. The exposing to light is then performed with a tenth mask in which lead pattern forming-sections for forming the outer lead sections and connection pattern forming-sections for forming the connecting sections do not transmit light and the other portions transmit light. A light control sheet then diffuses or refracts incident light and then emits the light from a side opposite from an incident side superposed on the other surface of the substrate, resulting in curing of only exposed portions of the photoresist film. Thereafter, the photoresist film is developed for the removal of uncured portions other than cured portions to form the plating resist layer in portions other than portions where the inner lead sections, the outer lead sections, and the connecting sections are formed.

According to a 17th aspect of the present invention, there is provided a semiconductor module substrate sheet fabricating method as defined in the 11th aspect, wherein the photoresist film is a photolysis type when patterning the plating resist layer. The exposing to light is performed with an eleventh mask in which lead pattern forming-sections for forming the inner lead sections and connection pattern forming-sections for forming the connecting sections transmit light and the other portions obstruct light. A light control sheet that diffuses or refracts incident light and then emits the light from a side opposite from an incident side superposed on one surface of the substrate. The exposing to light is then performed with a twelfth mask in which lead pattern forming-sections for forming the outer lead sections and connection pattern forming-sections for forming the connecting sections transmit light and the other portions obstruct light. Another light control sheet diffuses or refracts incident light and then emits the light from a side opposite from an incident side superposed on the other surface of the substrate, resulting in photolysis of only exposed portions of the photoresist film Thereafter, the photoresist film is developed for the removal of only portions that have undergone photolysis to form the plating resist layer in portions other than portions where the inner lead sections, the outer lead sections, and the connecting sections are formed.

According to an 18th aspect of the present invention, there is provided a semiconductor module substrate sheet fabricating method as defined in the 11th aspect, wherein the photoresist film is a photocurable type when patterning the plating resist layer. The exposing to light is performed with a thirteenth mask in which lead pattern forming-sections for forming either one of the inner lead sections and the outer lead sections and connection pattern forming-sections for forming the connecting sections do not transmit light and the other portions transmit light. A light control sheet diffuses or refracts incident light and then emits the light from a side opposite from an incident side superposed on one surface of the substrate. The exposing to light is then performed with a fourteenth mask in which lead pattern forming-sections for forming the other one of the inner lead sections and the outer lead sections and portions to be superposed on the through holes do not transmit light and the other portions transmit light superposed on the other surface of the substrate, resulting in curing of only exposed portions of the photoresist film. Thereafter, the photoresist film is developed for the removal of uncured portions other than cured portions to form the plating resist layer in portions other than portions where the inner lead sections, the outer lead sections, and the connecting sections are formed.

According to a 19th aspect of the present invention, there is provided a semiconductor module substrate sheet fabricating method as defined in the 11th aspect, wherein the photoresist film is a photolysis type when patterning the plating resist layer. The exposing to light is performed with a fifteenth mask in which lead pattern forming-sections for forming either one of the inner lead sections and the outer lead sections and connection pattern forming-sections for forming the connecting sections transmit light and the other portions obstruct light. A light control sheet diffuses or refracts incident light and then emits the light from a side opposite from an incident side superposed on one surface of the substrate. The exposing to light is then performed with a sixteenth mask in which only lead pattern forming-sections for forming the other one of the inner lead sections and the outer lead sections transmit light and the other portions obstruct light superposed on the other surface of the substrate, resulting in photolysis of only exposed portions of the photoresist film. Thereafter, the photoresist film is developed for the removal of only portions that have undergone photolysis to form the plating resist layer in portions other than portions where the inner lead sections, the outer lead sections, and the connecting sections are formed.

According to a 20th aspect of the present invention, there is provided a semiconductor package substrate sheet fabricated by the semiconductor module substrate sheet fabricating method defined in any one of the 10th through 19th aspects.

According to a 21st aspect of the present invention, there is provided a substrate sheet as defined in any one of the first through ninth and 20th aspects, provided with a metal conductor section having a size equal to or larger than a size of the semiconductor chip placed in the semiconductor chip placement region.

According to a 22nd aspect of the present invention, there is provided a substrate sheet as defined in any one of the first through ninth and 20th aspects, wherein a first metal conductor section having a size equal to or larger than a size of the semiconductor chip is placed in the semiconductor chip placement region, and a second metal conductor section is provided in a region on a rear surface side of the insulating substrate oppositely from the first metal conductor section located on a front surface side of the insulating substrate across the insulating substrate. The first metal conductor section and the second metal conductor section are connected with each other by way of through holes.

According to a 23rd aspect of the present invention, there is provided a substrate sheet as defined in the 22nd aspect, wherein hole portions of the through holes that connect the first metal conductor section with the second metal conductor section are filled up with resin.

According to a 24th aspect of the present invention, there is provided a substrate sheet as defined in the 23rd aspect, wherein metal layers are further placed on the first metal conductor section and the second metal conductor section, respectively. The first and second metal condition sections are connected with each other by way of the through holes with the hole portions of the through holes filled up with the resin. The metal layer covering the first metal conductor section, the second metal conductor section, and hole portions of the through holes filled up with the resin.

According to a 25th aspect of the present invention, there is provided a substrate sheet as defined in any one of the 21st through 24th aspects, wherein the metal conductor section has the inner lead sections or the outer lead sections partially extended to the semiconductor chip placement region so as to be formed with a size capable of mounting the semiconductor chip.

According to a 26th aspect of the present invention, there is provided a semiconductor substrate sheet in which an insulating substrate is provided with through holes, connecting sections are provided on side wall surface oppositely from a semiconductor chip placement region, inner lead sections are extended in a direction away from the connecting sections, and outer lead sections are extended from the connecting sections in a direction away from a region corresponding to a rear surface of the semiconductor-chip placement region. A a metal conductor section is formed in the semiconductor chip placement region.

According to a 27th aspect of the present invention, there is provided a semiconductor substrate sheet in which an insulating substrate is provided with through holes, connecting sections are provided on a side wall surface oppositely from a semiconductor chip placement region, inner lead sections are extended in a direction away from the connecting sections, and outer lead sections are extended from the connecting sections in a direction away from a region corresponding to a rear surface of the semiconductor chip placement region. Further, other connecting sections are provided so as to not come in contact with the connecting sections on the side wall surface located on the semiconductor chip placement region side of the through holes. A metal conductor section is provided for the semiconductor chip placement region, a metal layer section is provided for a region corresponding to the rear surface of the semiconductor chip placement region, and the metal conductor section and the metal layer section are connected together by way of said other connecting sections.

According to a 28th aspect of the present invention, there is provided a substrate sheet as defined in the 26th or 27th aspect, wherein the through holes are filled up with resin.

According to a 29th aspect of the present invention, there is provided a substrate sheet as defined in any one of the 21st through 28th aspects, wherein the metal conductor section placed on a surface of the substrate sheet on which the inner lead sections are formed has a flat front surface.

According to a 30th aspect of the present invention, there is provided a substrate sheet as defined in any one of the 21st through 28th aspects, wherein the metal conductor section placed on a surface of the substrate sheet on which the inner lead sections are formed has minute undulations or patterned recesses on its front surface.

According to a 31st aspect of the present invention, there is provided a semiconductor module in which the semiconductor chip is placed in the semiconductor chip placement region of the substrate sheet defined in any one of the first through ninth and 20th through 29th aspects, and the plurality of electrode terminals of the semiconductor chip are electrically connected with the plurality of inner lead sections, respectively.

According to a 32nd aspect of the present invention, there is provided a semiconductor module in which the semiconductor chip is placed in the semiconductor chip placement region of the substrate sheet defined in any one of the first through ninth and 20th through 29th aspects, and the plurality of electrode terminals of the semiconductor chip are electrically connected with the plurality of inner lead sections by way of wires, respectively.

According to a 33rd aspect of the present invention, there is provided a semiconductor module in which the semiconductor chip is placed in the semiconductor chip placement region of the substrate sheet defined in any one of the first through ninth and 20th through 29th aspects, and bumps formed on the plurality of electrode terminals located on a rear surface of the semiconductor chip are electrically connected with the plurality of inner lead sections, respectively.

According to a 34th aspect of the present invention, there is provided a semiconductor module in which the semiconductor chip is placed in the semiconductor chip placement region of the substrate sheet defined in any one of the first through ninth and 20th through 29th aspects, and the plurality of electrode terminals located on a rear surface of the semiconductor chip are electrically connected with the plurality of inner lead sections by way of anisotropic conductive adhesive, respectively.

According to a 35th aspect of the present invention, there is provided a semiconductor module in which the semiconductor chip is received and held in a recess located in the semiconductor chip placement region of the substrate sheet defined in any one of the first through ninth and 20th through 29th aspects.

According to a 36th aspect of the present invention, there is provided a semiconductor module obtained by providing the substrate sheet defined in any one of the first through ninth and 20th through 29th aspects with a plurality of rectangular semiconductor chip placement regions. A semiconductor chip is placed in each of the plurality of semiconductor chip placement regions. The plurality of electrode terminals of the semiconductor chip are electrically connected with the plurality of inner lead sections. Thereafter, the substrate sheet is cut in correspondence with each of the semiconductor chip placement regions.

BRIEF DESCRIPTION OF THE DRAWINGS

These and other aspects and features of the present invention will become clear from the following description taken in conjunction with the preferred embodiments thereof with reference to the accompanying drawings, in which:

FIG. 57 is a sectional view taken along the line B—B of FIG. 35;

FIG. 58 is a sectional view taken along the line A—A of FIG. 45;

DETAILED DESCRIPTION OF THE INVENTION

Figure 1:
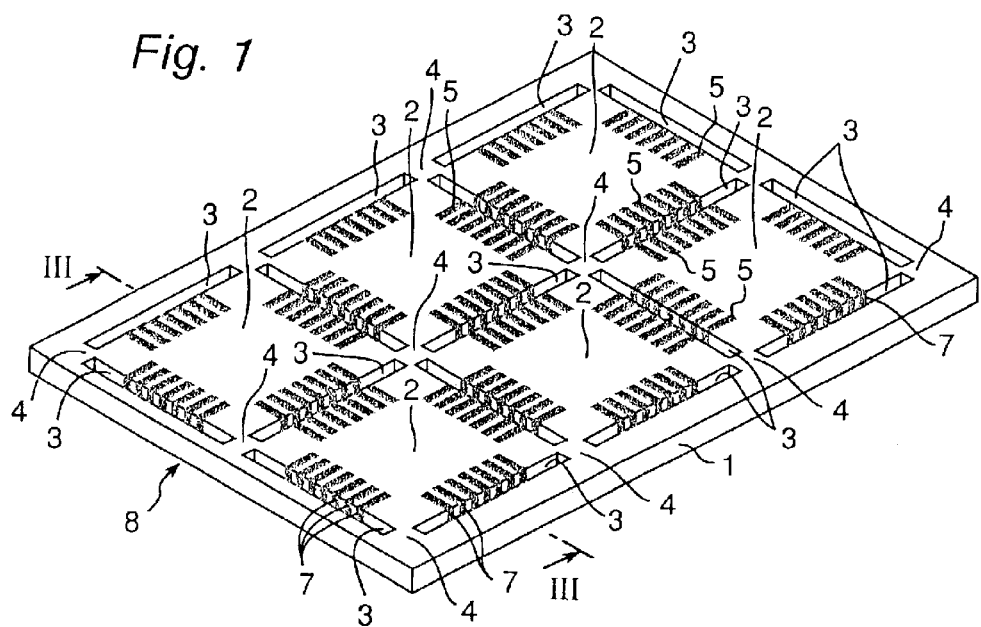
FIG. 1 is a perspective view showing the front surface of a semiconductor module substrate sheet according to a first embodiment of the present invention.

Before the description of the present invention proceeds, it is to be noted that like parts are designated by like reference numerals throughout the accompanying drawings.

Semiconductor module substrate sheets, methods for fabricating the sheets, and semiconductor module fabricating methods according to various embodiments of the present invention will be described in detail hereinbelow with reference to the drawings.

Reference is first made to a semiconductor module substrate sheet, a semiconductor module employing the substrate sheet, and a method for fabricating the module according to a first embodiment of the present invention.

Figure 2:
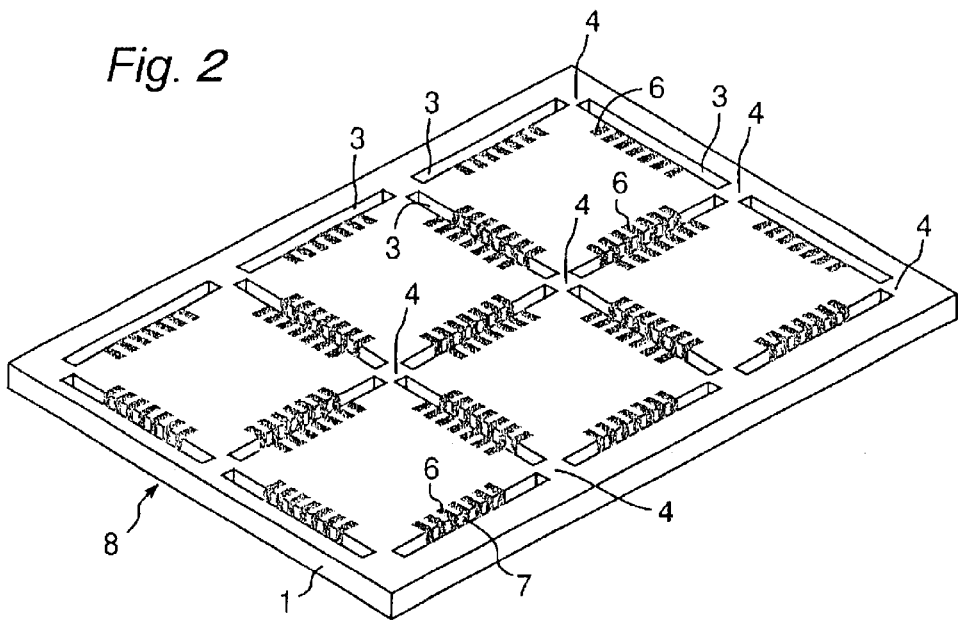
FIG. 2 is a perspective view showing the rear surface of the substrate sheet of FIG. 1.
Figure 3:
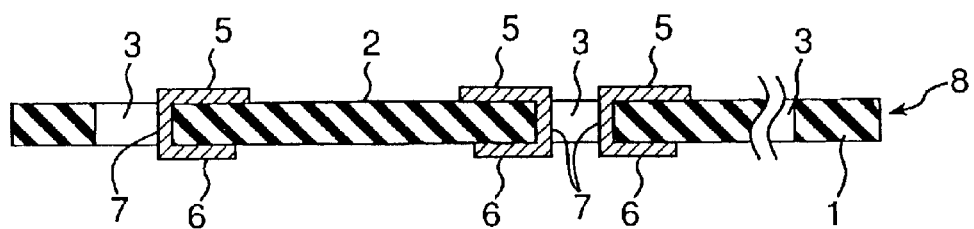
FIG. 3 is a sectional view taken along the line III—III of FIG. 1.

FIG. 1 is a perspective view showing the front surface of a semiconductor module substrate sheet 8 according to the first embodiment of the present invention. FIG. 2 is a perspective view showing the rear surface of the substrate sheet 8 of FIG. 1. FIG. 3 is a sectional view taken along the line III—III of FIG. 1. In these Figures, the semiconductor module substrate sheet 8 includes an insulating substrate 1 having six rectangular semiconductor chip placement regions 2, linear through holes 3 provided on four sides of each semiconductor chip placement region 2 except for a connecting portion 4 located at each of four corner portions of each semiconductor chip placement region 2, a number of inner lead sections 5 (patterned parallel to one another and illustrated in a number fewer than the actual number in FIG. 1) formed in a direction from each through hole 3 of each semiconductor chip placement region 2 toward the center region of the semiconductor chip placement region 2 on one surface of the insulating substrate 1, a number of outer lead sections 6 (patterned parallel to one another and illustrated in a number fewer than the actual number in FIG. 2) formed in a direction from each through hole 3 of each semiconductor chip placement region 2 toward the center region of a region corresponding to the rear surface of the semiconductor chip placement region 2 on the other surface of the insulating substrate 1, and a number of connecting sections 7 (patterned parallel to one another and illustrated in number fewer than the actual number in FIGS. 1 and 2) that are formed between the inner lead sections 5 and the outer lead sections 6 provided on the insulating substrate 1 on the side wall surface on the semiconductor chip placement region side of each through hole 3. The connecting sections 7 electrically connect the inner lead sections 5 with the outer lead sections 6.

As the insulating substrate 1, there can be employed a laminate of synthetic fiber cloth base epoxy resin, glass cloth/paper composite epoxy resin, glass cloth glass nonwoven glass fabric composite epoxy resin, glass cloth base epoxy resin, glass cloth base Teflon resin, a resin such as polyetherimide resin, polysulfone resin, polyethersulfone resin, benzocyclobutene resin, BT resin, Teflon resin, a ceramic of, aluminum nitride, silicon carbide, or alumina. The insulating substrate 1 has a thickness of, for example, 0.1 mm to 0.2 mm.

Figure 4A:
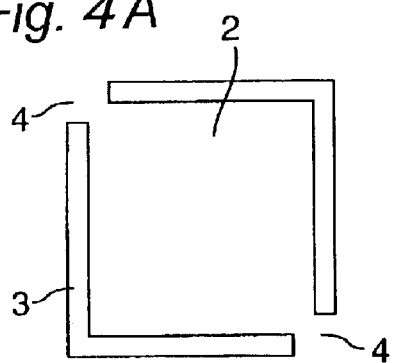
FIGS. 4A, 4B, 4C, and 4D are plan views showing various modified examples of a through hole of the semiconductor module substrate sheet of the first embodiment.
Figure 4C:
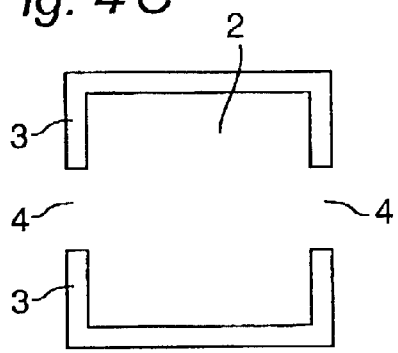
Figure 4B:
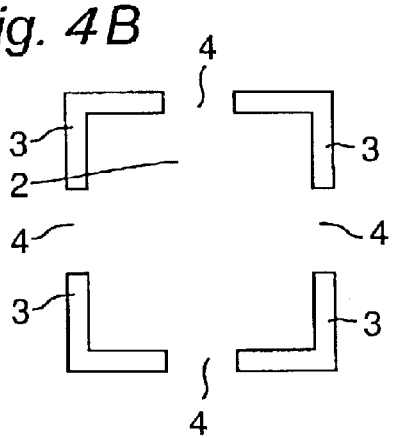
Figure 4D:
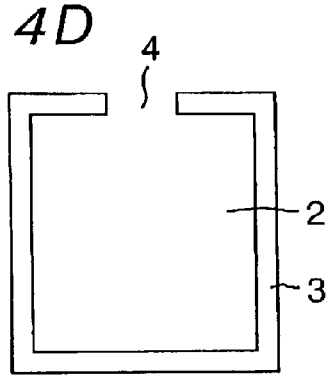

The linear through holes 3 are formed on four sides of each semiconductor chip placement region 2 except for the connecting portions 4 at four corners of the semiconductor chip placement region 2. Each semiconductor chip placement region 2 is a square or rectangle whose one side has a size of about 0.5 mm to 50 mm. Each through hole 3 has a width of not smaller than 0.1 mm at least for the formation of the connecting sections 7 on the side wall surfaces inside the holes thereof, the width being normally set to about 0.3 mm to 3 mm. The structure of the connecting portions 4 is not limited to the structure of FIG. 1 so long as each semiconductor chip placement region 2 can be sufficiently supported as part of the substrate sheet and the desired connecting sections 7 can be formed on the side wall surfaces of the through holes 3 and can be formed in an arbitrary pattern. For example, the connecting portions 4 may be reduced in number by appropriately connecting adjacent through holes 3 as shown in FIGS. 4A through 4D. Conversely, the connecting portions 4 may be increased in number by increasing the number of through holes 3, although this is not specifically shown. As shown in FIGS. 4B, 4C, and 4D, the positions in which the connecting portions 4 are formed may be changed to positions other than the corner portions of each semiconductor chip placement region 2. Although the through hole 3 is shared by adjacent semiconductor chip placement regions 2 in FIG. 1, the through hole 3 may be independently provided for each semiconductor chip placement region (not shown). As a method for forming the through holes 3 through the substrate sheet, there are enumerated press working, router working, drilling, laser beam machining, and the like.

As respective materials for the inner lead sections 5, the outer lead sections 6, and the connecting sections 7, a metal of copper, nickel, gold, or the like is preferable, and the inner lead sections 5, the outer lead sections 6, and the connecting sections 7 are formed in the thickness of, for example, 0.1 μm to 50 μm.

Figure 5:
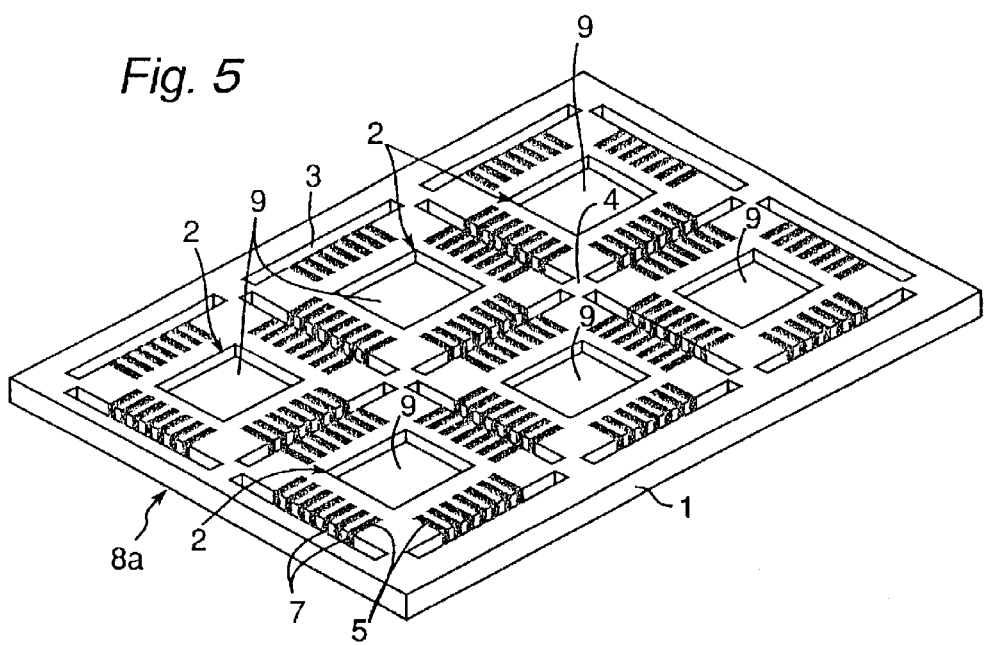
FIG. 5 is a perspective view showing the front surface of a substrate sheet according to a modified example of the first embodiment.

As a semiconductor module substrate sheet 8a according to a modified example of the first embodiment of the present invention, as shown in FIG. 5, a recess 9 of a size capable of receiving a semiconductor chip 10 may be provided at the center of each semiconductor chip placement region 2 on a surface thereof where the inner lead sections 5 are formed, so that the semiconductor chip 10 is received and held in the recess 9, allowing the semiconductor chip 10 to be more stably supported on the substrate sheet 8a.

Figure 6:
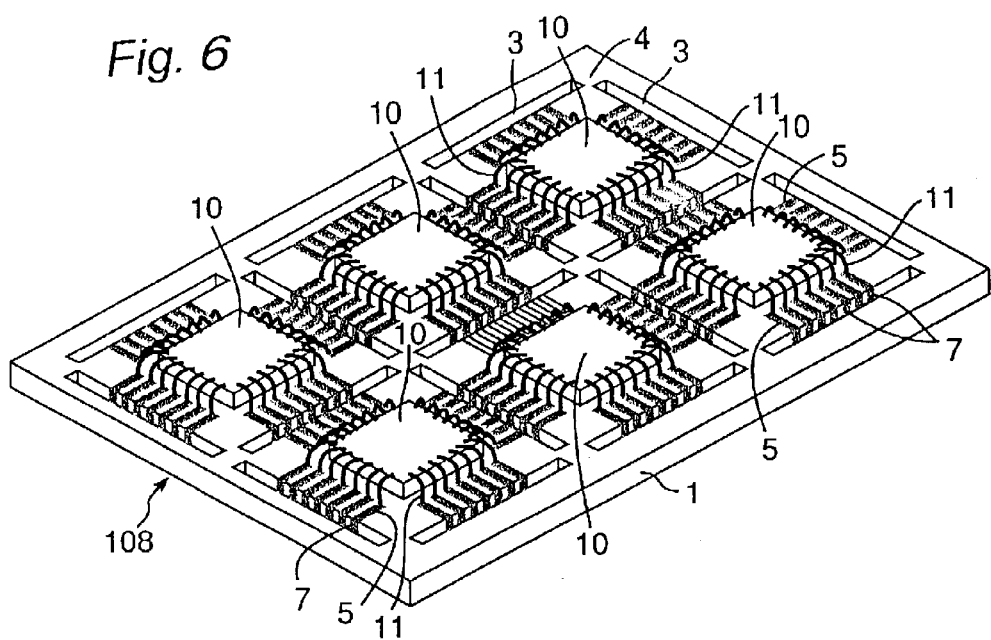
FIG. 6 is a perspective view showing a semiconductor module aggregate in which six semiconductor chips are placed in six semiconductor chip placement regions through the semiconductor module fabricating process of the first embodiment.

Through the fabricating processes of the semiconductor module of the first embodiment that employs the substrate sheet 8 having the aforementioned structure, as shown in FIG. 6, the semiconductor chips 10 are fixed in the six semiconductor chip placement regions 2 of the substrate sheet 8 with an adhesive or the like, and thereafter the electrode terminals of the semiconductor chips 10 are electrically connected to the corresponding inner lead sections 5 by way of wires 11 of gold or the like. Through this process, there can be obtained a semiconductor module aggregate 108 constructed of six semiconductor modules in a state in which the semiconductor modules are connected together via the connecting portions 4 as shown in FIG. 6. The semiconductor modules may be conveyed to the next process or the like or shipped as components in the form of the semiconductor module aggregate 108.

Figure 7:
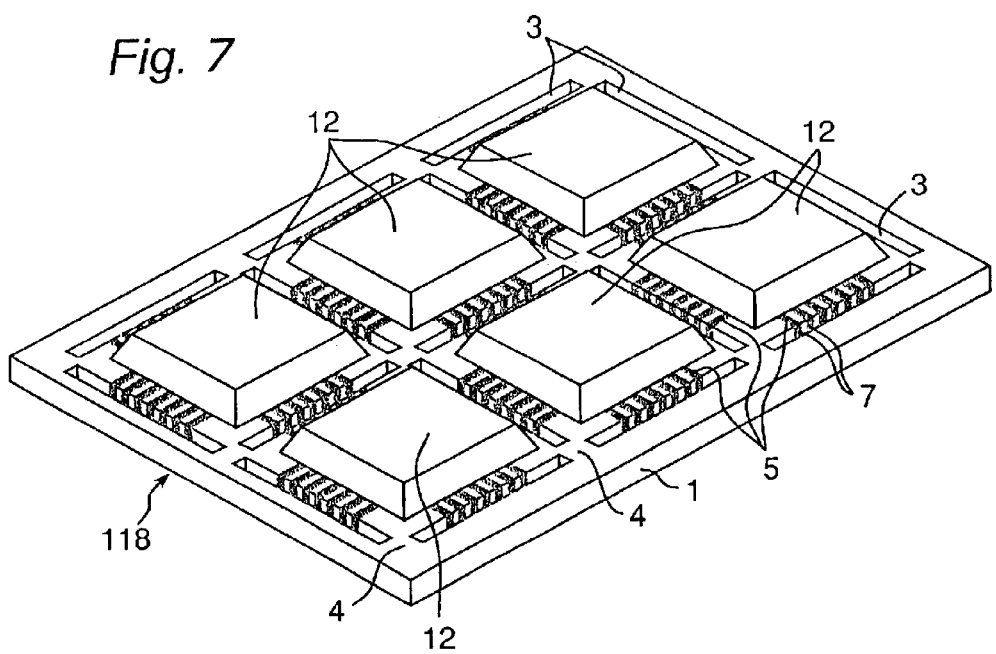
FIG. 7 is a perspective view showing a semiconductor package aggregate obtained by encapsulating the semiconductor chips mounted on the semiconductor chip placement regions of the semiconductor modules of the semiconductor module aggregate fabricated through the semiconductor module fabricating process of the first embodiment.

When performing encapsulation of the semiconductor module aggregate 108, the semiconductor chip 10 placed in each semiconductor chip placement region 2 of the six semiconductor modules 100 of the semiconductor module aggregate 108 is encapsulated, forming a semiconductor package aggregate 118 as shown in FIG. 7. This encapsulating work is to encapsulate the respective electrode terminals of the semiconductor chips 10 and at least the through hole side of the inner lead sections 5. An encapsulation section 12 to be formed through the encapsulation may be covered with a hollow lid of ceramic or metal or the like, coated with a resin by means of a dispenser or the like, or injection molded with a resin, such as epoxy resin or phenol resin. The semiconductor packages may be conveyed to the next process or the like or shipped as a component in the form of the semiconductor package aggregate 118.

Figure 8:
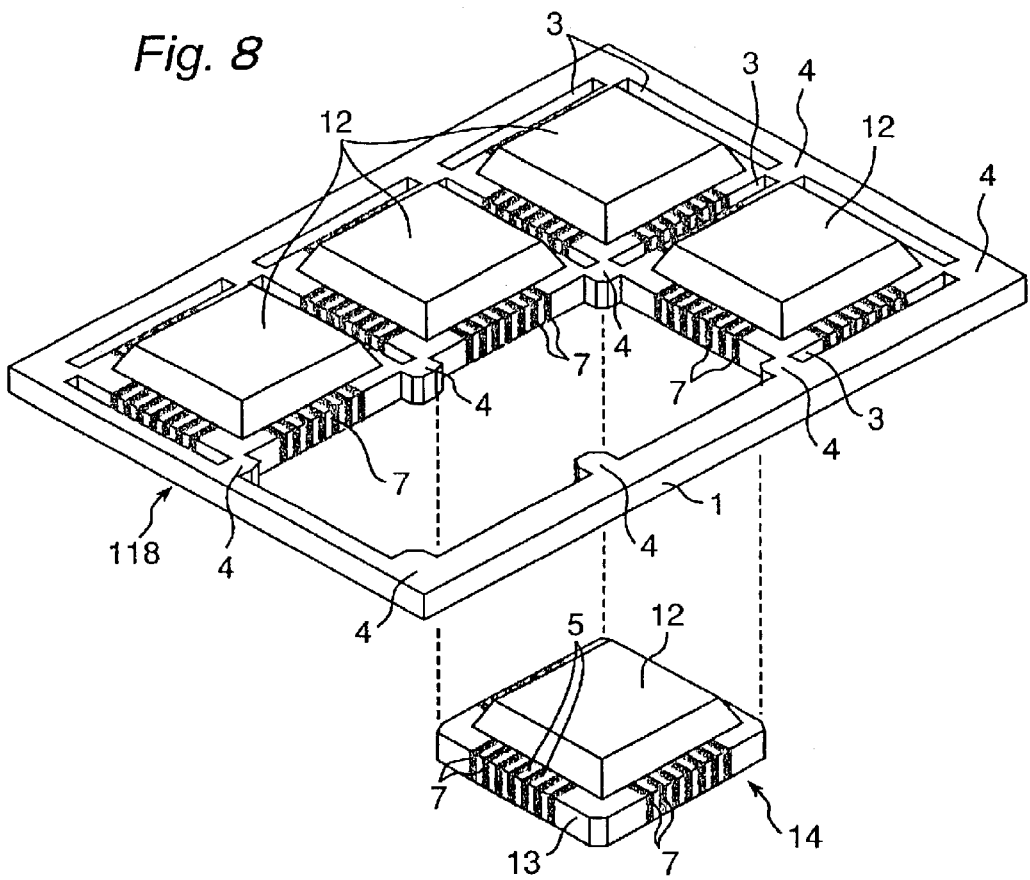
FIG. 8 is a perspective view showing a state in which semiconductor packages are cut one by one from the substrate sheet of the semiconductor package aggregate fabricated in FIG. 7.

When performing separation into individual semiconductor packages 14, as shown in FIG. 8, the semiconductor packages 14 are cut from the semiconductor package aggregate 118 one at a time or collectively in a multitude at a time at the portion where the through holes 3 are not formed, i.e., the connecting portions 4 in the present embodiment. Through this separation, by cutting the respective connecting portions 4 in the shortest distance across the end portions of the through holes 3 of adjacent two sides of each semiconductor chip placement region 2, a small flat surface is formed at each corner. The cutting method is not always limited to the above-mentioned cutting for the formation of the small flat surface at each corner. For the cutting, there is used punching press, router working, laser bean machining, V cutting, dicer cutting, or the like.

Figure 9:
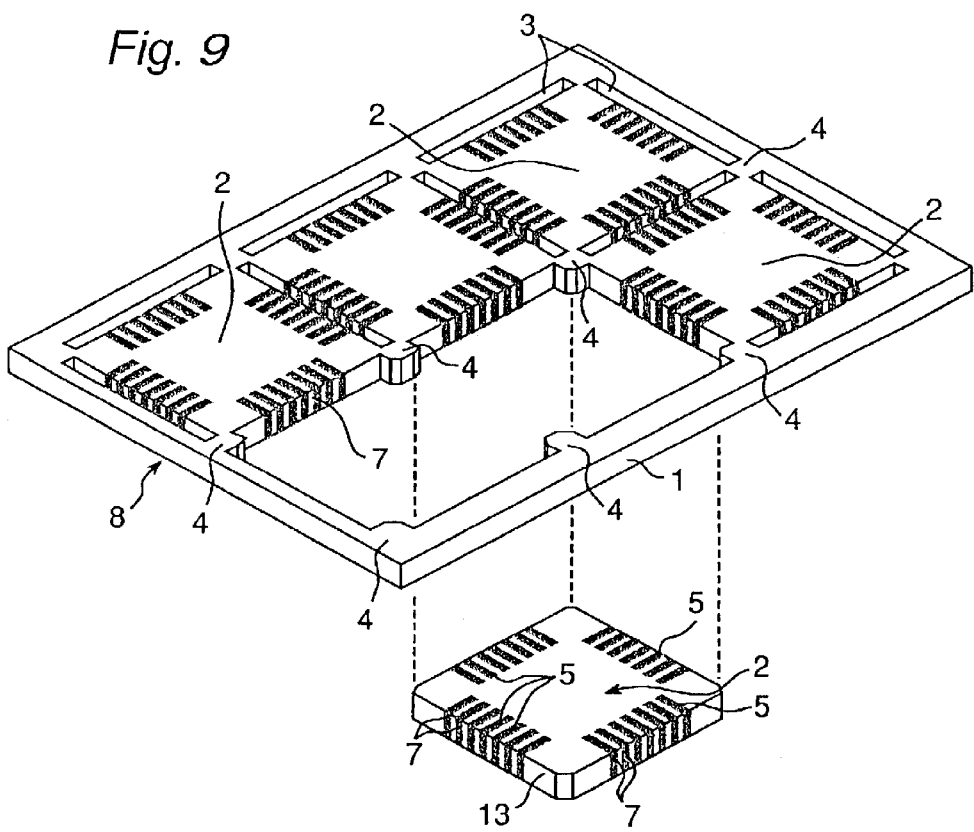
FIG. 9 is a perspective view showing a state in which semiconductor module substrates are cut one by one from the substrate sheet through a semiconductor module fabricating process according to a modified example of the first embodiment.

In the semiconductor module fabricating steps, according to a modified example of the first embodiment employing, the substrate sheet 8 having the aforementioned construction, as shown in FIG. 9, the insulating substrate, or the substrate 13, corresponding to one semiconductor module 100, may be cut from the semiconductor module substrate sheet 8 prior to the mounting of the semiconductor chip 10 on the substrate 13. In detail, the substrate 13 is cut from the semiconductor module substrate sheet 8 of FIG. 9 one at a time or collectively in a multitude at a time at the portions where the through holes 3 are not formed, i.e., the connecting portions 4 in the present embodiment. Through this separation, the connecting portions 4 are cut in the shortest distance across the end portions of the through holes 3 of two adjacent sides of each semiconductor chip placement region 2 of each substrate 13. For the cutting, a punching press, router working, laser beam machining, V cutting, dicer cutting, or the like, is used.

Figure 10:
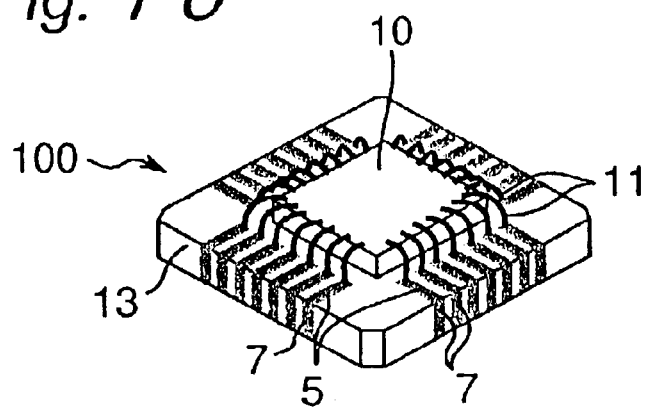
FIG. 10 is a perspective view showing a semiconductor module obtained by mounting a semiconductor chip on the semiconductor chip placement region of the semiconductor module substrate cut from the substrate sheet in FIG. 9.
Figure 12:
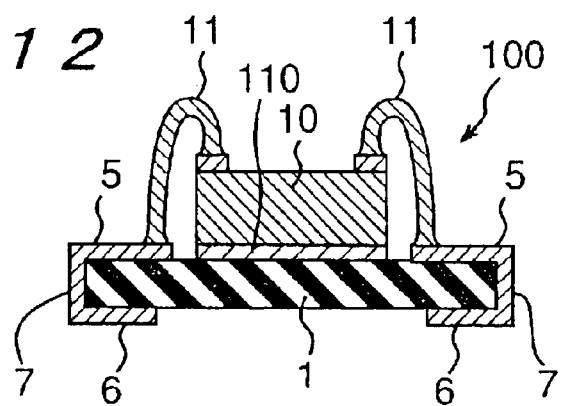
FIG. 12 is a sectional view of the semiconductor module of FIG. 10.

Next, as shown in FIGS. 10 and 12, the semiconductor chip 10 is fixed in the semiconductor chip placement region 2 of the separated substrate 13 with by an adhesive 110 or the like. Thereafter, the electrode terminals of the semiconductor chip 10 are electrically connected with the corresponding inner lead sections 5 by way of the wires 11 of gold or the like, thereby obtaining the semiconductor module 100 shown in FIG. 12. Each semiconductor module may be conveyed to the next step process or the like or shipped as a component in the form of the semiconductor module 100.

Figure 11:
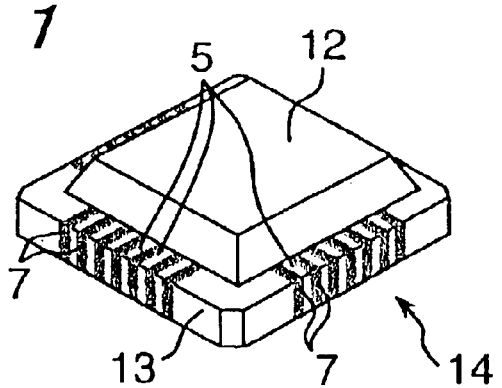
FIG. 11 is a perspective view showing a semiconductor package obtained by encapsulating the semiconductor module of FIG. 10.

Next, when performing encapsulation of the semiconductor module 100, the semiconductor chip 10 mounted on each semiconductor chip placement regions 2 of the semiconductor module 100 is encapsulated, forming a semiconductor package 14 as shown in FIG. 11. This encapsulating work is to encapsulate the respective electrode terminals of the semiconductor chip 10 and at least the through hole side of the respective inner lead sections 5. An encapsulation section 12 to be formed through the encapsulation may be covered with a hollow lid of ceramic or metal or the like, coated with a resin by means of a dispenser or the like, or injection molded with a resin such as epoxy resin or phenol resin. Each semiconductor package may be conveyed to the next process or the like or shipped as a component in the form of the semiconductor package 14.

Figure 13:
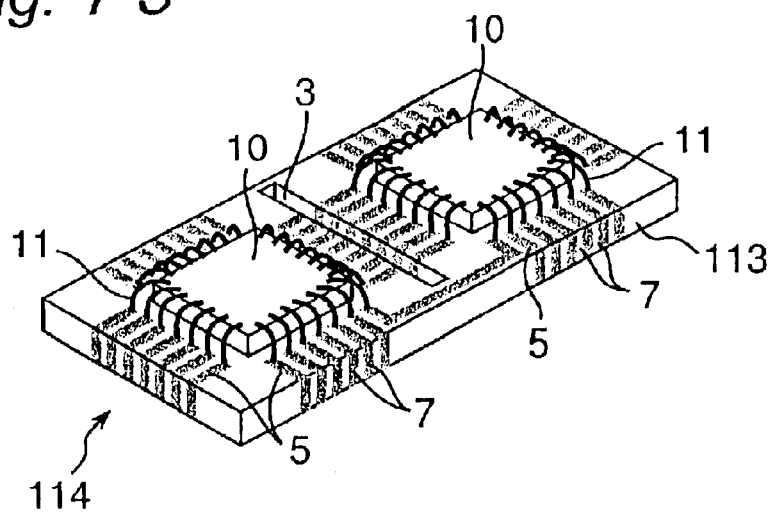
FIG. 13 is a perspective view of a multiple semiconductor module in a state in which two semiconductor chips of FIG. 10 are mounted on a substrate.

Although the semiconductor modules 100 are separated one by one according to the aforementioned semiconductor module fabricating method, the present invention is not limited to this. As shown in FIG. 13, it is acceptable to obtain a multiple semiconductor module 114 in a state in which two semiconductor modules 100 are mounted on a substrate 113, corresponding to two substrates 13, by separating the semiconductor modules by two and electrically connecting both the modules. As a method for electrically connecting the two semiconductor modules 100, it is proper to form special inner lead, sections on the front surface side of the substrate sheet for the electrical connection of the two semiconductor modules 100 as shown in FIG. 13, form special outer lead sections having a shape similar to those of the special inner lead sections shown in FIG. 13 on the rear surface side of the substrate sheet for the electrical connection of the two semiconductor modules 100 although not shown in concrete, or electrically connect the inner lead sections with the outer lead sections by way of metal layers or internal layer wirings on the internal surface of the through hole. It is also acceptable to obtain a multiple semiconductor module in which a greater number of semiconductor modules are mounted on one substrate by separating the semiconductor modules 100 in threes or greater arbitrary numbers. Even in this case, the three or greater arbitrary number of semiconductor modules 100 are appropriately electrically connected in a similar manner.

According to the aforementioned first embodiment .and modified examples, the outer leads 6 can be led to the region that corresponds to the semiconductor chip placement region 2 and is located on the rear surface of the substrate sheet beyond the through holes 3. This can reduce the dimensions of the whole semiconductor chip module and the dimensions of the whole semiconductor package.

Reference is next made to a semiconductor module substrate sheet, a semiconductor module employing the substrate sheet, and a method for fabricating the module according to a second embodiment of the present invention.

Figure 14:
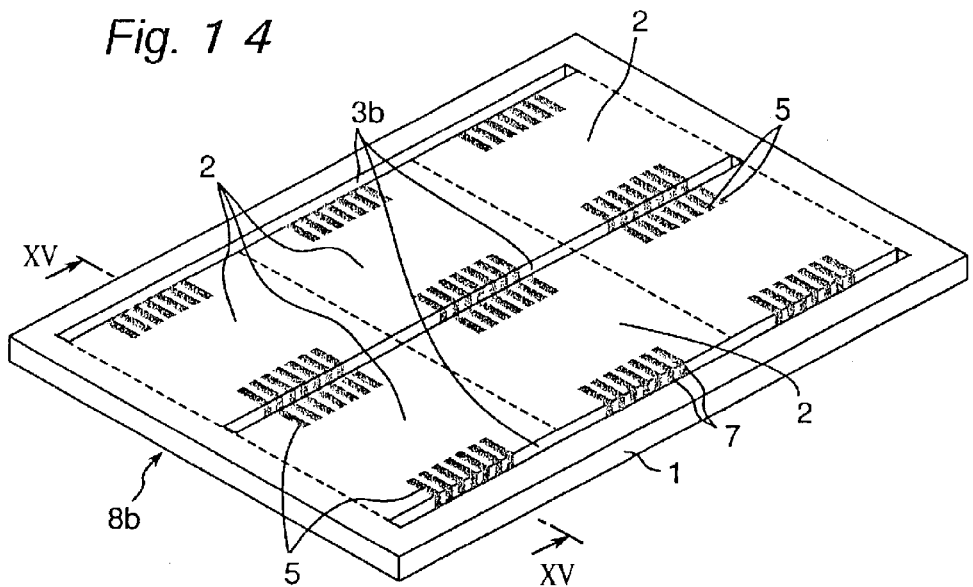
FIG. 14 is a perspective view showing the front surface of a semiconductor module substrate sheet according to a second embodiment of the present invention.
Figure 15:
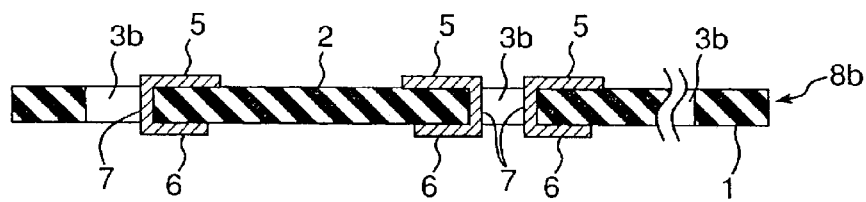
FIG. 15 is a sectional view taken along the line XV—XV of FIG. 14.
Figure 16:
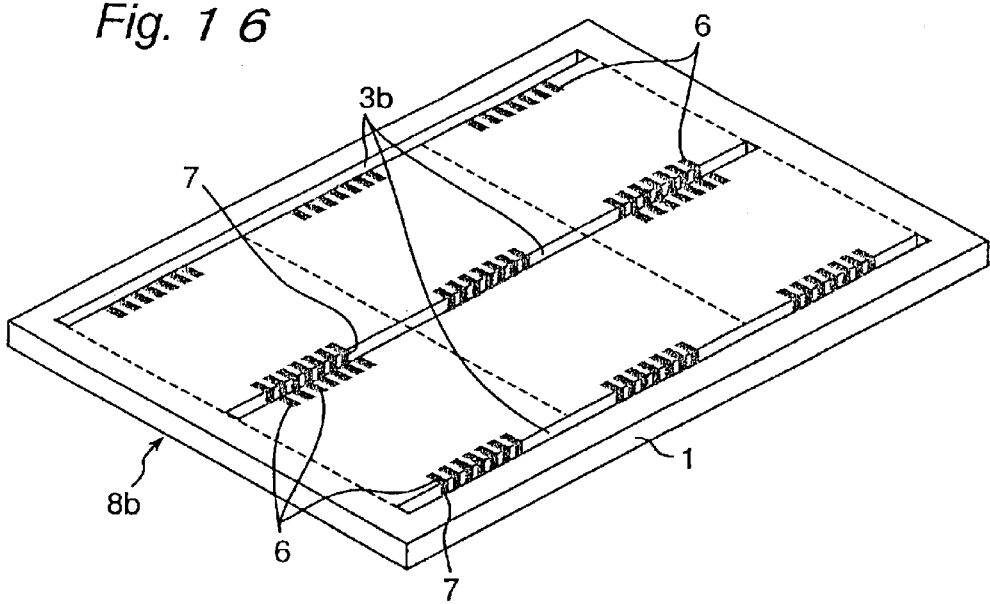
FIG. 16 is a perspective view showing the rear surface of the semiconductor module substrate sheet of the second embodiment of FIG. 14.

The semiconductor module substrate sheet 8b of this second embodiment differs from the semiconductor module substrate sheet 8 of the first embodiment in that through holes 3b are provided not on the four sides, but only on two opposite sides of each semiconductor chip placement region 2. The through holes 3b are continuous elongated holes corresponding to three semiconductor chip placement regions 2 arranged adjacently along the lengthwise direction of the substrate sheet 8b. Therefore, the inner lead sections 5, the outer lead sections 6, and the connecting sections 7 for connecting these inner and outer lead sections are provided for the through holes 3b located not on the four sides, but only on the two opposite sides of each semiconductor chip placement region 2, as shown in FIGS. 14, 15, and 16.

According to this second embodiment, by comparison with the first embodiment, the through holes are required to be provided on the two sides of each semiconductor chip placement region, instead of the provision of the through holes on the four sides thereof. This arrangement is therefore able to reduce the number of through holes 3 corresponding to one semiconductor module, reduce the work of processing the through holes 3 through the substrate sheet 8b for the achievement of cost reduction, and reduce the number of inner lead sections 5, the outer lead sections 6, and the connecting sections 7 for connecting these inner and outer lead sections.

Figure 17:
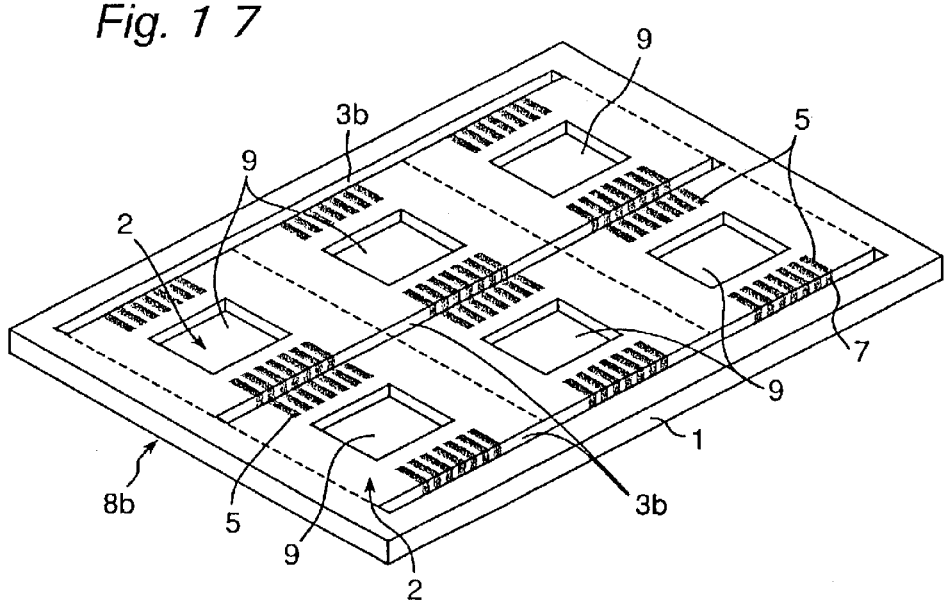
FIG. 17 is a perspective view of the front surface of the semiconductor module substrate sheet according to a modified example of the second embodiment.

As a semiconductor module substrate sheet 8b according to a modified example of the second embodiment of the present invention, as shown in FIG. 17, it is acceptable to provide a recess 9 having a size capable of receiving a semiconductor chip 10b at the center of each semiconductor chip placement region 2 on the surface on which the inner lead sections 5 are formed, and receive and hold the semiconductor chip 10b in the recess 9, thereby assuring a more stable hold on the substrate sheet 8.

Figure 18:
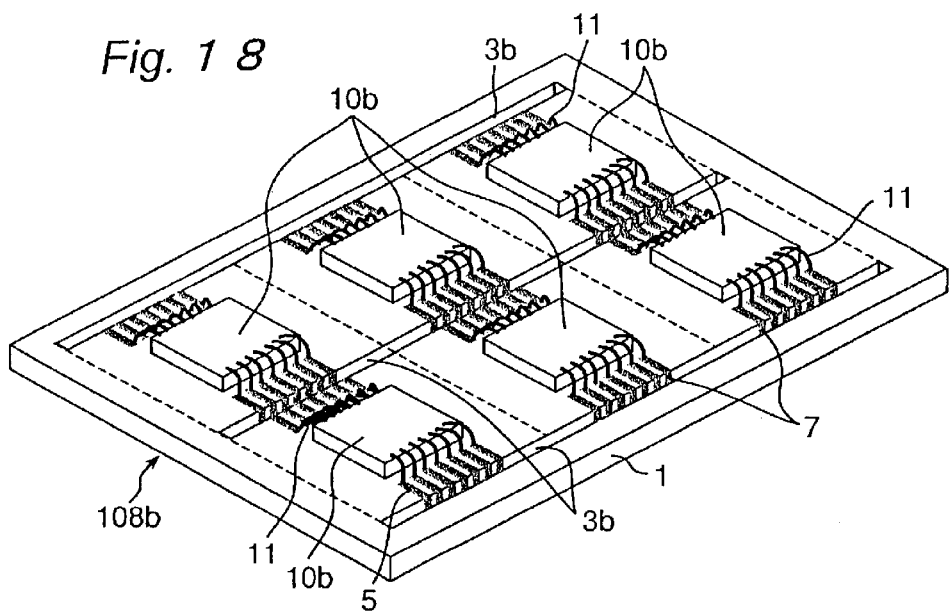
FIG. 18 is a perspective view showing a semiconductor module aggregate obtained by mounting six semiconductor chips on six semiconductor chip placement regions through the semiconductor module fabricating process of the second embodiment.

In the semiconductor module fabricating process of the second embodiment employing the substrate sheet 8b having the aforementioned structure, as shown in FIG. 18, the semiconductor chips 10b are fixed in the six semiconductor chip placement regions 2 of the substrate sheet 8b with an adhesive or the like. Thereafter, the respective electrode terminals of the respective semiconductor chips 10b are electrically connected with the corresponding respective inner lead sections 5 by way of wires 11 of gold or the like. Through these steps, a semiconductor module aggregate 108b constructed of six mutually connected semiconductor modules as shown in FIG. 18 can be obtained. The semiconductor modules may be conveyed to the next step or the like or shipped as components in the form of the semiconductor module aggregate 108b.

Figure 19:
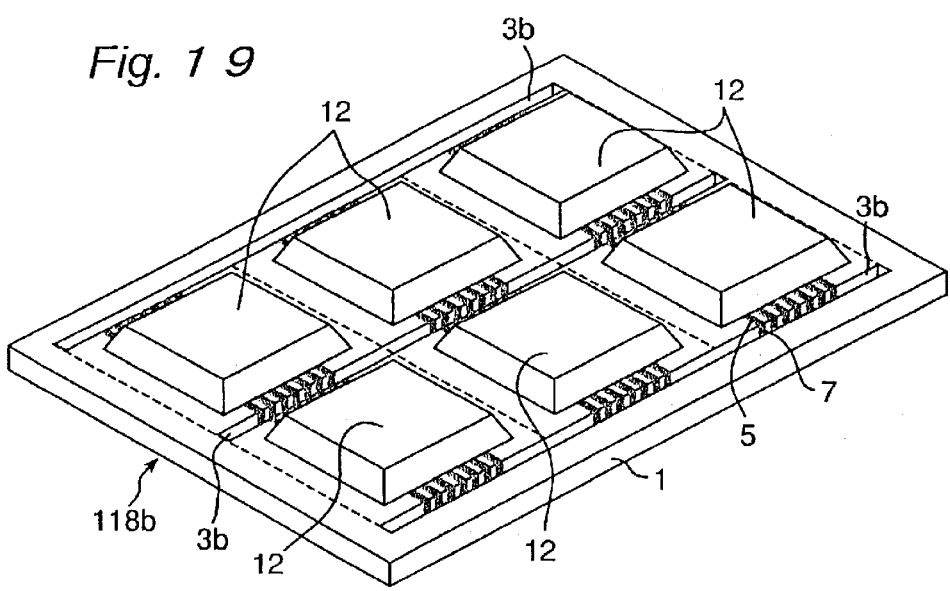
FIG. 19 is a perspective view showing a semiconductor package aggregate obtained by encapsulating the semiconductor chips mounted on the semiconductor chip placement regions of the semiconductor modules of the semiconductor module aggregate fabricated through the semiconductor module fabricating process of the second embodiment.

When performing encapsulation of the semiconductor module aggregate 108b, the semiconductor chips 10b mounted on the respective semiconductor chip placement regions 2 of the six semiconductor modules 100b of the semiconductor module aggregate 108b are each encapsulated, forming a semiconductor package aggregate 118b as shown in FIG. 19. This encapsulating work is to encapsulate the respective electrode terminals of the semiconductor chips 10b and at least the through hole side of the respective inner lead sections 5. An encapsulation section 12 to be formed through the encapsulation may be covered with a hollow lid of ceramic or metal or the like, coated with a resin by means of a dispenser or the like, or injection molded with a resin such as epoxy resin or phenol resin. The semiconductor packages may be conveyed to the next step process or the like or shipped as components in the form of the semiconductor package aggregate 118b.

Figure 20:
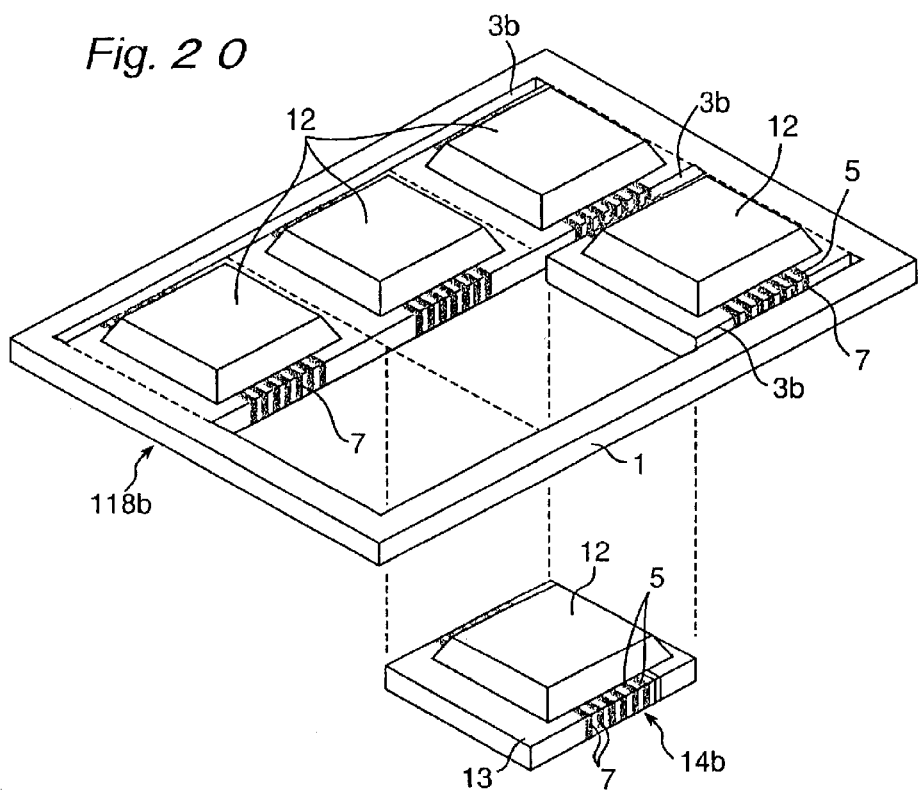
FIG. 20 is a perspective view showing a state in which semiconductor packages are cut one by one from the substrate sheet of the semiconductor package aggregate fabricated in FIG. 19.

When performing separation into individual semiconductor packages 14b, as shown in FIG. 20, the semiconductor packages 14b are cut from the semiconductor package aggregate 118b one at a time or collectively in the multitude at a time outside each semiconductor chip placement region 2 into a rectangular shape roughly parallel to the remaining two sides where the through holes 3 of each semiconductor chip placement region 2 are not formed. For the cutting, there a punching press, router working, laser beam machining, V cutting, dicer cutting, or the like, is used.

Figure 21:
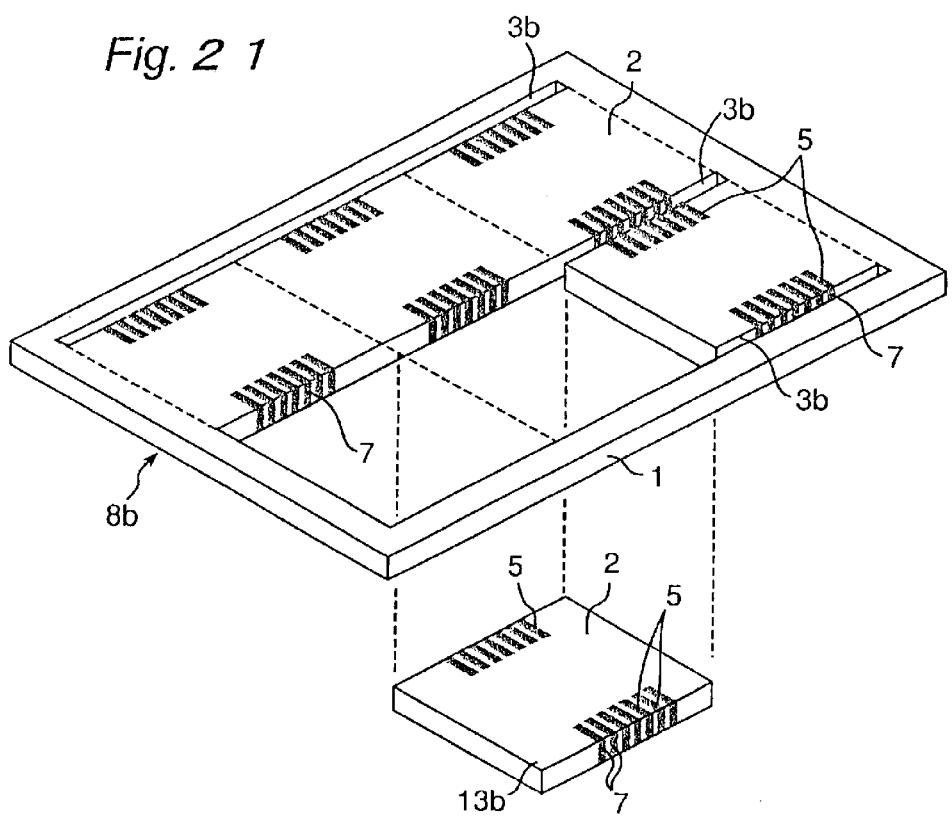
FIG. 21 is a perspective view showing a state in which semiconductor module substrates are cut one by one from the substrate sheet through the semiconductor module fabricating process of the modified example of the second embodiment.

In the semiconductor module fabricating processes of the aforementioned modified example of the second embodiment employing the substrate sheet 8b having the aforementioned structure, as shown in FIG. 21, the insulating substrate, or the substrate 13b corresponding to one semiconductor module 100b may be cut from the semiconductor module substrate sheet 8b prior to the mounting of the semiconductor chip 10b on the substrate 13b. In detail, the substrate 13b is cut from the semiconductor module substrate sheet 8b of FIG. 21 one at a time or collectively in the multitude at a time outside each semiconductor chip placement region 2 into a rectangular shape roughly parallel to the portions which belong to each semiconductor chip placement region 2 and in which the through holes 3 are not formed, i.e., the remaining two sides where the through holes 3 of each semiconductor chip placement region 2 are not formed in this embodiment. For the cutting, a punching press, router working, laser beam machining, V cutting, dicer cutting, or the like, is used.

Figure 22:
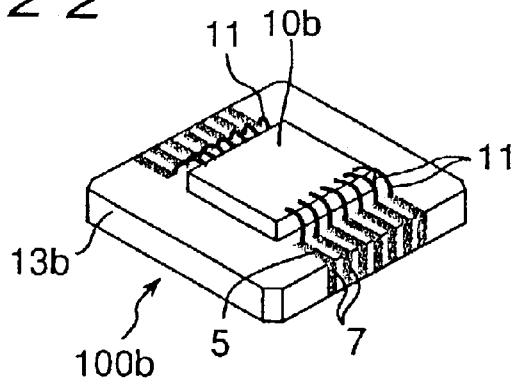
FIG. 22 is a perspective view showing a semiconductor module constructed by mounting a semiconductor chip on the semiconductor chip placement region of the semiconductor module substrate cut from the substrate sheet in FIG. 21.

Next, as shown in FIG. 22, the semiconductor chip 10b is fixed in the semiconductor chip placement region 2 of the separated substrate 13b with an adhesive 110 or the like (see FIG. 12 for the sectional view, since the view is similar to that of FIG. 12; it is to be noted that the semiconductor chip 10 corresponds to the semiconductor chip 10b). Thereafter, the respective electrode terminals of the semiconductor chip 10b are electrically connected with the corresponding respective inner lead sections 5 by way of the wires 11 of gold or the like, obtaining the semiconductor module 100b. Each semiconductor module may be conveyed to the next step or the like, or shipped as a component in the form of the semiconductor module 100b.

Figure 23:
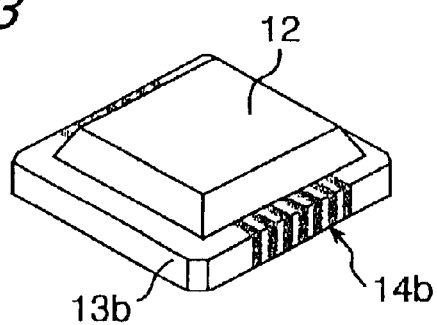
FIG. 23 is a perspective view showing a state in which a semiconductor package is constructed by encapsulating the semiconductor module of FIG. 22.

Next, when performing encapsulation of the semiconductor module 100b, the semiconductor chip 10b mounted on each semiconductor chip placement region 2 of the semiconductor module 100b is encapsulated, forming a semiconductor package 14b as shown in FIG. 23. This encapsulating work is to encapsulate the respective electrode terminals of the semiconductor chip 10b and at least the through hole side of the respective inner lead sections 5. An encapsulation section 12 to be formed through the encapsulation may be covered with a hollow lid of ceramic or metal or the like, coated with a resin by means of a dispenser or the like, or injection molded with a resin such as epoxy resin or phenol resin. Each semiconductor package may be conveyed to the next step or the like, or shipped as a component in the form of the semiconductor package 14b.

Figure 24:
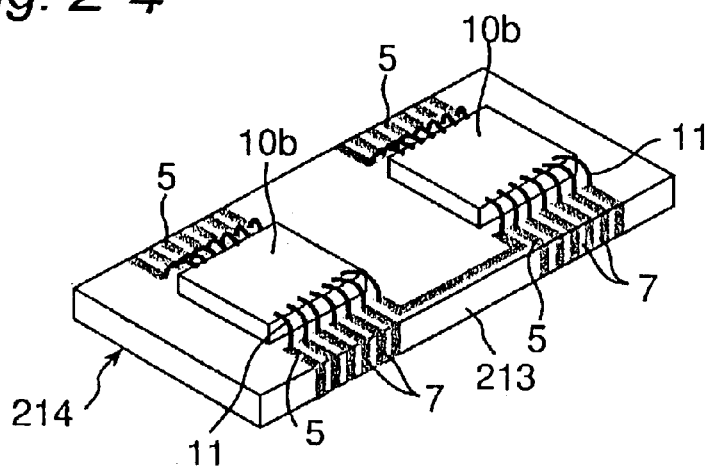
FIG. 24 is a perspective view of a multiple semiconductor module in a state in which two semiconductor chips are placed on a substrate.

Although the semiconductor modules 100b are separated one by one according to the aforementioned semiconductor module fabricating method, the present invention is not limited to this. As shown in FIG. 24, it is acceptable to obtain a multiple semiconductor module 214 in a state in which two semiconductor modules 100 are mounted on a substrate 213 corresponding to two substrates 13b by separating the semiconductor modules as pairs and electrically connecting both the modules as shown in FIG. 24. As a method for electrically connecting the two semiconductor modules 100b, it is proper to form special inner lead sections on the front surface side of the substrate sheet for the electrical connection of the two semiconductor modules 100b as shown in FIG. 24, form special outer lead sections having a shape similar to those of the special inner lead sections shown in FIG. 24 on the rear surface side of the substrate sheet for the electrical connection of the two semiconductor modules 100b, although not shown, or electrically connect the inner lead sections with the outer lead sections by way of metal layers or internal layer wirings on the internal surface of the through hole. It is also acceptable to obtain a multiple semiconductor module in which a greater number of semiconductor modules are mounted on one substrate by separating the semiconductor modules 100b in threes or greater arbitrary numbers. Even in this case, the three or greater arbitrary number of semiconductor modules 100b are appropriately electrically connected in a similar manner.

According to the aforementioned second embodiment and modified examples, the outer leads 6 can be led to the region that corresponds to the semiconductor chip placement region 2 and is located on the rear surface of the substrate sheet beyond the through holes 3b. This can reduce the dimensions of the whole semiconductor chip module and the dimensions of the whole semiconductor package. By providing the through holes 3b on opposite two sides of the semiconductor chip placement region 2, the semiconductor chip placement regions 2 can be arranged close to one another along the two sides where no through hole is required to be formed. Therefore, the semiconductor chips can be arranged in high density on the substrate sheet, and a greater number of semiconductor modules can be formed, reducing the cost.

Reference is next made to a semiconductor module substrate sheet, a semiconductor module employing the substrate sheet, and a method for fabricating the module according to a third embodiment of the present invention.

Figure 25:
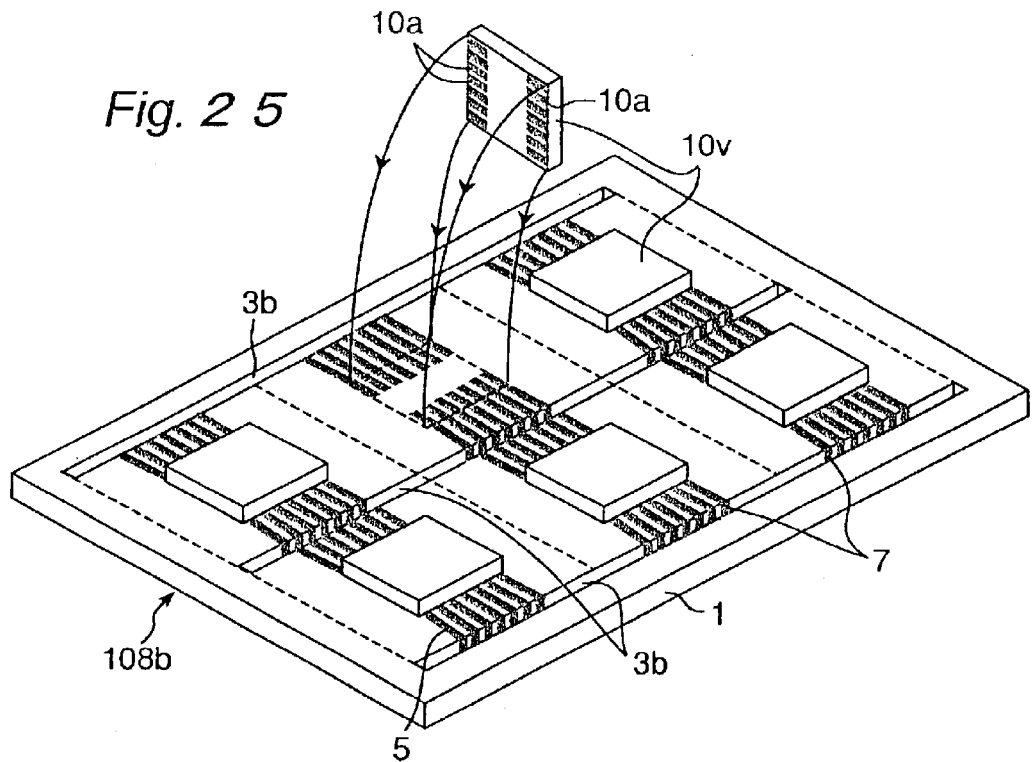
FIG. 25 is a perspective view showing a semiconductor module aggregate obtained by mounting six semiconductor chips on six semiconductor chip placement regions through the semiconductor module fabricating process employing a semiconductor module substrate sheet according to a third embodiment of the present invention.

As shown in FIG. 25, this third embodiment differs from the second embodiment in that the inner lead sections 5 extend into the semiconductor chip placement region 2 on the semiconductor module substrate sheet 8b of the second embodiment and their end portions are directly connected (down-face connected) to electrode terminals 10a provided on the bottom surfaces of semiconductor chips 10v, obviating the need for the wires 11.

Figure 26:
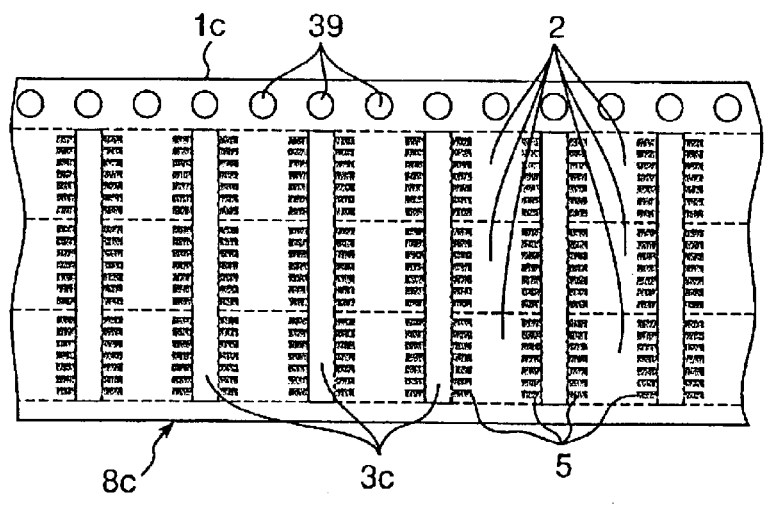
FIG. 26 is a plan view of a semiconductor module substrate sheet according to a modified example of the third embodiment of the present invention.

According to a modified example of this third embodiment, there may be a semiconductor module substrate sheet 8c obtained by connecting numbers of substrate sheets 8b with one another in the direction of width, as shown in FIG. 26. An insulating substrate 1c and through holes 3c of FIG. 26 correspond to the insulating substrate 1 and the through holes 3b of FIG. 25, respectively. According to this substrate sheet 8c, positional alignment perforations 39 are continuously formed at regular intervals outside the semiconductor chip placement regions 2 of one edge in the direction of width. With the positional alignment perforations 39 thus provided, the respective electrode terminals of the semiconductor chip 10 and the respective inner lead sections 5 can be bonded together by inserting positional alignment pins (not shown) in the positional alignment perforations 39 to fix the semiconductor module substrate sheet 8c in a specified position. After completing the bonding, it is also possible to pull the positional alignment pins out of the positional alignment perforations 39 once, move the substrate sheet 8c by a specified pitch, insert the pins again into the positional alignment perforations 39 opposite to the positional alignment pins, and fix the substrate sheet 8c into the specified position for the execution of the next bonding work. Through these steps, the respective electrode terminals of the semiconductor chip 10 and the respective inner lead sections 5 can be bonded together without deviation. Although this modified example is illustrated as a modified example of the third embodiment, a similar arrangement can be provided according to the first or second embodiment.

Figure 27:
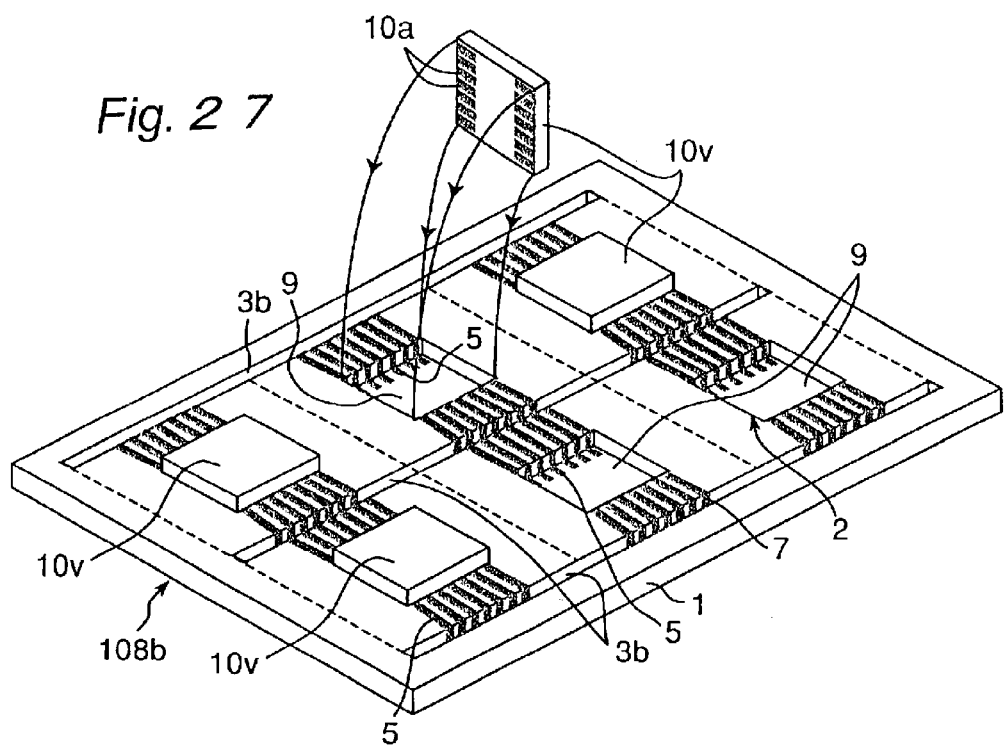
FIG. 27 is a perspective view showing a semiconductor module aggregate obtained by mounting six semiconductor chips on six semiconductor chip placement regions through the semiconductor module fabricating process employing a semiconductor module substrate sheet according to another modified example of the third embodiment of the present invention.

As a semiconductor module substrate sheet according to a modified example of the third embodiment of the present invention, as shown in FIG. 27, it is acceptable to more stably hold the semiconductor chips 10v on the substrate sheet 8 by providing a recess 9 of a size capable of receiving each semiconductor chip 10v at the center of each semiconductor chip placement region 2 on the surface on which the inner lead sections 5 are formed and holding the semiconductor chip 10v in the recess 9.

Figure 28:
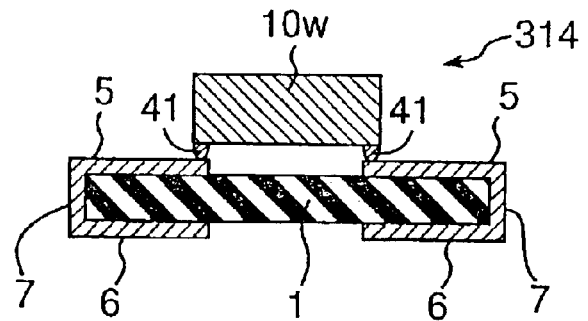
FIG. 28 is a sectional view of a semiconductor module according to a modified example of the third embodiment of the present invention.

According to the aforementioned third embodiment, specifically, it is acceptable to obtain a semiconductor module 314 by preparing a semiconductor chip 10w having hemispheric bumps 41, as shown in FIG. 28, provided on electrode terminals 10a located on the bottom surface of the semiconductor chip 10v, mounting the semiconductor chip 10w on the substrate sheet in place of the semiconductor chip 10v in FIG. 25 or FIG. 27, and electrically connecting the bumps 41 to the inner lead sections 5.

Figure 29:
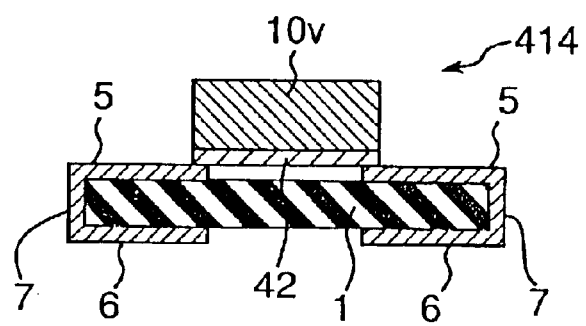
FIG. 29 is a sectional view of a semiconductor module according to another modified example of the third embodiment of the present invention.

In the third embodiment, it is acceptable to obtain a semiconductor module 414 by electrically bonding (downface connecting) the electrode terminals 10a located on the bottom surface of the semiconductor chip 10v to the inner lead sections 5 with interposition of an anisotropic conductive adhesive 42, as shown in FIG. 29.

Figure 30:
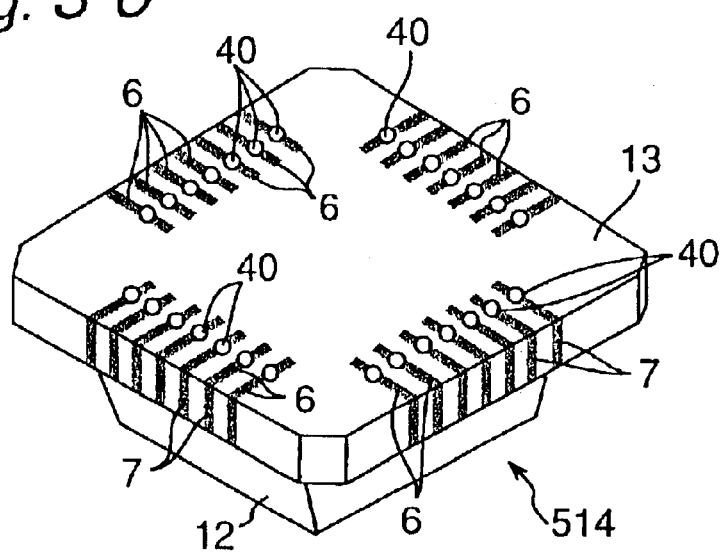
FIG. 30 is a sectional view of a semiconductor package according to yet another modified example of the third embodiment of the present invention.

Furthermore, in the first through third embodiments, the other embodiments described later, and the modified examples of the other embodiments, it is acceptable to provide bumps 40 at the end portions of the outer lead sections 6 on the rear surface of the substrate sheet as shown in FIG. 30, and electrically connect a semiconductor package 514 or a semiconductor module to another circuit board or component.

According to the aforementioned third embodiment and modified examples, the outer leads 6 can be led to the region that corresponds to the semiconductor chip placement region 2 and is located on the rear surface of the substrate sheet beyond the through holes 3b, and this can reduce the dimensions of the whole semiconductor chip module and the dimensions of the whole semiconductor package. The dimensions of the whole semiconductor chip module and the dimensions of the whole semiconductor package can be reduced by the connecting portions of the wires and the inner lead sections. Furthermore, the wires are formed so as to rise above the semiconductor chip as illustrated. Therefore, a space is necessary above the semiconductor chip by that much. However, by eliminating the wires, such a space can be eliminated, allowing the semiconductor module or the semiconductor package to be reduced in height.

Reference is next made to a semiconductor module substrate sheet according to a fourth embodiment of the present invention.

Figure 31:
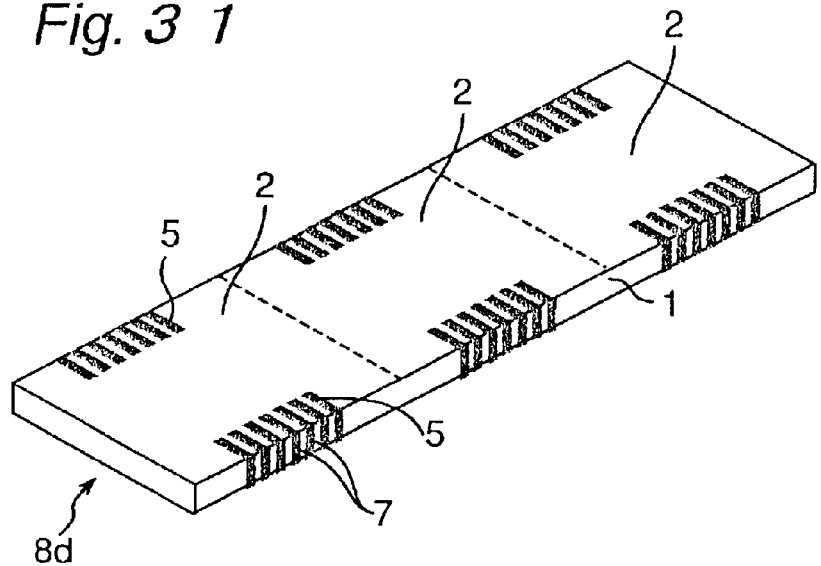
FIG. 31 is a perspective view showing the front surface of a semiconductor module substrate sheet according to a fourth embodiment of the present invention.

The semiconductor module substrate sheet 8d of this fourth embodiment differs from the semiconductor module substrate sheet 8b of the second embodiment in that the substrate sheet is constructed of a rectangular insulating substrate 1 having no through holes 3, as shown in FIG. 31. That is, in FIG. 31, three semiconductor chip placement regions 2 are arranged adjacently, and opposite edge portions along the longitudinal direction of the substrate sheet 8d are provided with inner lead sections 5, outer lead sections 6, and connecting sections 7 for connecting the inner and outer lead sections. According to this fourth embodiment, the efforts for forming the through holes can be saved by comparison with the aforementioned embodiments, and therefore, the substrate sheet becomes less expensive.

According to this fourth embodiment, the outer leads 6 can be led from the opposite edge portions along the longitudinal direction of the substrate sheet 8d to the region that corresponds to the semiconductor chip placement region 2 and are located on the rear surface of the substrate sheet. This can reduce the dimensions of the whole semiconductor chip module and the dimensions of the whole semiconductor package.

Reference is next made to a semiconductor module substrate sheet according to a fifth embodiment of the present invention.

Figure 32:
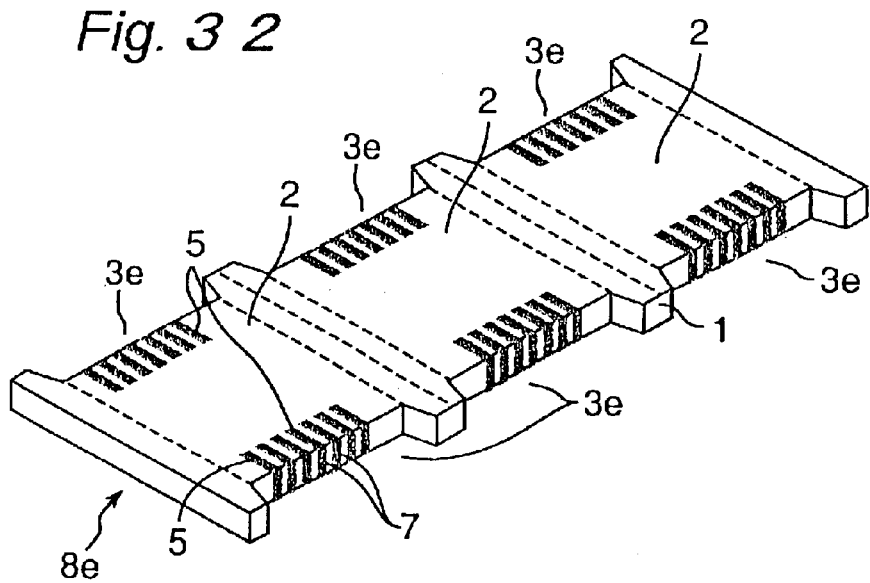
FIG. 32 is a perspective view showing the front surface of a semiconductor module substrate sheet according to a fifth embodiment of the present invention.

The semiconductor module substrate sheet 8e of this fifth embodiment differs from the semiconductor module substrate sheet 8b of the second embodiment in that the substrate sheet is constructed of a rectangular insulating substrate 1 which has no through holes 3 and of which the portions where the connecting sections 7 are formed are more recessed than the other portions, as shown in FIG. 32. That is, in FIG. 32, three semiconductor chip placement regions 2 are arranged adjacently, and opposite edge portions along the longitudinal direction of the substrate sheet 8e are provided with recesses 3e that are more recessed than the other portions, in the vicinity of the portions where the respective connecting sections 7 of the three semiconductor chip placement regions 2 are formed. The inner lead sections 5, the outer lead sections 6, and the connecting sections 7 for connecting the inner and outer lead sections are provided in the vicinity of the recesses 3e. According to this fifth embodiment, the efforts for forming the through holes can be reduced by comparison with the first through third embodiments. Therefore, the substrate sheet becomes less expensive. Furthermore, the connecting sections 7 are provided in the recesses 3e which are more recessed than the other portions, in the opposite edge portions along the longitudinal direction of the substrate sheet 8e. Therefore, when handling the substrate sheet 8d, the connecting sections 7, the inner lead sections 5, and the outer lead sections 6 are damaged less than those of the rectangular substrate sheet 8d of FIG. 31.

According to the aforementioned fifth embodiment, the outer leads 6 can be led from the opposite edge portions along the longitudinal direction of the substrate sheet 8e to the region that corresponds to the semiconductor chip placement region 2 and are located on the rear surface of the substrate sheet. This can reduce the dimensions of the whole semiconductor chip module and the dimensions of the whole semiconductor package.

Reference is next made to a semiconductor module substrate sheet according to a sixth embodiment of the present invention.

Figure 33:
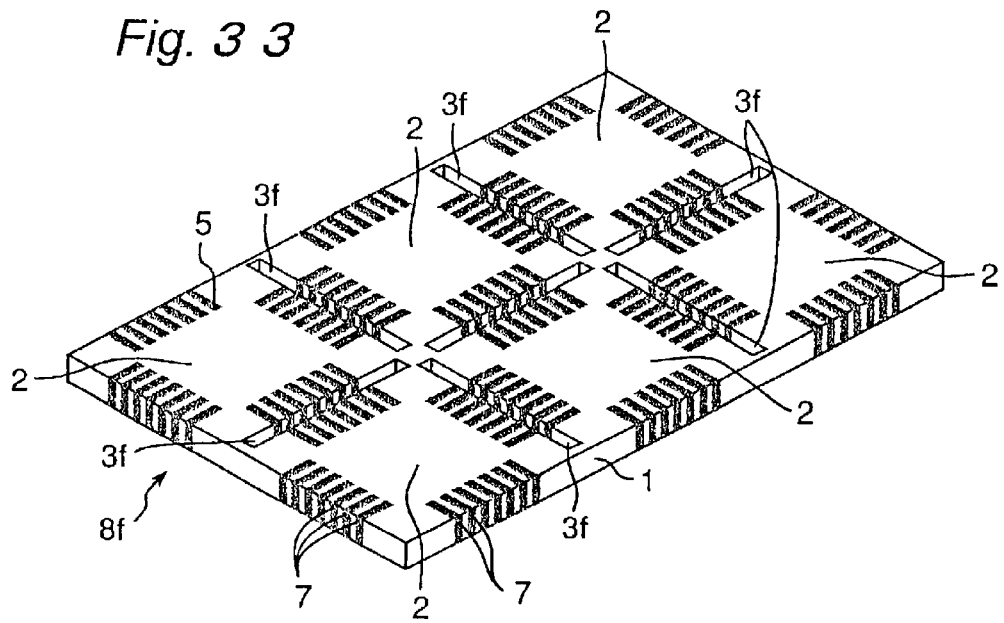
FIG. 33 is a perspective view showing the front surface of a semiconductor module substrate sheet according to a sixth embodiment of the present invention.

The semiconductor module substrate sheet 8f of this sixth embodiment differs from the semiconductor module substrate sheet 8b of the second embodiment in that the substrate sheet is constructed of a rectangular insulating substrate 1 having no outside through hole 3 that might surround the six semiconductor chip placement regions 2, as shown in FIG. 33. That is, in FIG. 33, six semiconductor chip placement regions 2 are arranged adjacently, the through holes 3 are provided only between adjacent semiconductor chip placement regions 2, and opposite edge portions along the longitudinal direction and widthwise direction of the substrate sheet 8f are provided with inner lead sections 5, outer lead sections 6, and connecting sections 7 for connecting the inner and outer lead sections. According to this sixth embodiment, the efforts for forming the through holes can be reduced by comparison with the aforementioned embodiments. Therefore, the substrate sheet becomes less expensive.

According to the above sixth embodiment, the outer leads 6 can be led from the opposite edge portions along the longitudinal direction of the substrate sheet 8f to the region that corresponds to the semiconductor chip placement region 2 and is located on the rear surface of the substrate sheet. This can reduce the dimensions of the whole semiconductor chip module and the dimensions of the whole semiconductor package.

Reference is next made to a semiconductor module substrate sheet according to a seventh embodiment of the present invention.

Figure 34:
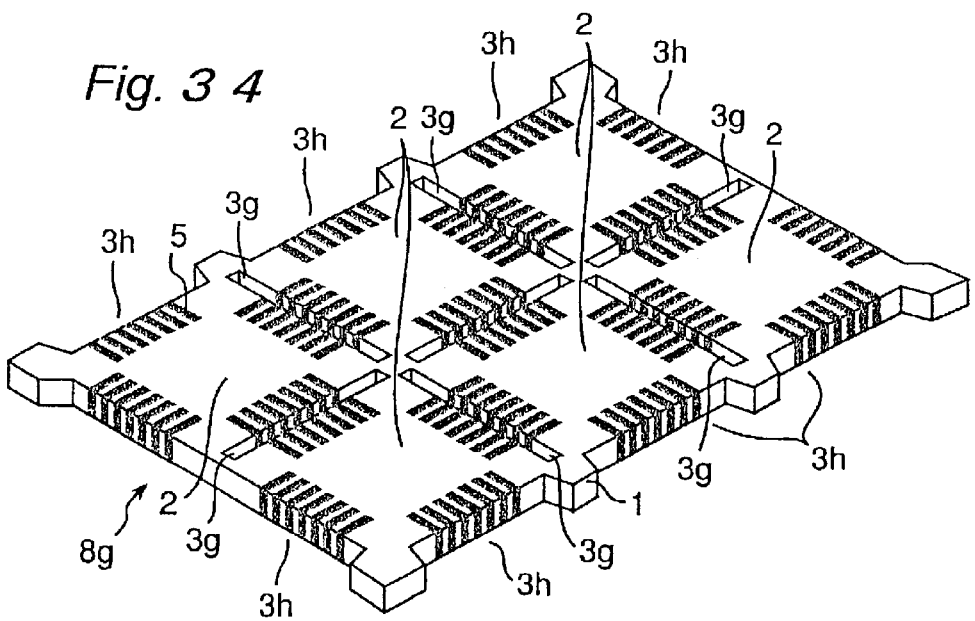
FIG. 34 is a perspective view showing the front surface of a semiconductor module substrate sheet according to a seventh embodiment of the present invention.

The semiconductor module substrate sheet 8g of this seventh embodiment differs from the semiconductor module substrate sheet 8b of the second embodiment in that the substrate sheet is constructed of a rectangular insulating substrate 1 provided with recesses 3h that are more recessed than the other portions, in the vicinity of the portions where the connecting sections 7 are formed in place of the through holes 3 that surround the six semiconductor chip placement regions 2, as shown in FIG. 34. That is, in FIG. 34, six semiconductor chip placement regions 2 are arranged adjacently, and respective opposite edge portions along the longitudinal direction and the widthwise direction of the substrate sheet 8g are provided with recesses 3h that are more recessed than the other portions, in the vicinity of the portions where the connecting sections 7 of the six semiconductor chip placement regions 2 are formed. The inner lead sections 5, the outer lead sections 6, and the connecting sections 7 for connecting the inner and outer lead sections are provided in the vicinity of the recesses 3h. According to this seventh embodiment, the efforts for forming the through holes can be saved by comparison with the first through third embodiments. Therefore, the substrate sheet becomes less expensive. Furthermore, the connecting sections 7 are provided in the recesses 3h that are more recessed than the other portions in the opposite edge portions along the longitudinal direction of the substrate sheet 8g. Therefore, when handling the substrate sheet 8g, the connecting sections 7, the inner lead sections 5, and the outer lead sections 6 are damaged less than those of the rectangular substrate sheet 8f of FIG. 33.

According to the aforementioned seventh embodiment, the outer leads 6 can be led from the opposite edge portions along the longitudinal direction of the substrate sheet 8g to the region that corresponds to the semiconductor chip placement region 2 and are located on the rear surface of the substrate sheet. This can reduce the dimensions of the whole semiconductor chip module and the dimensions of the whole semiconductor package.

Reference is next made to a semiconductor module substrate sheet according to an eighth embodiment of the present invention.

Figure 35:
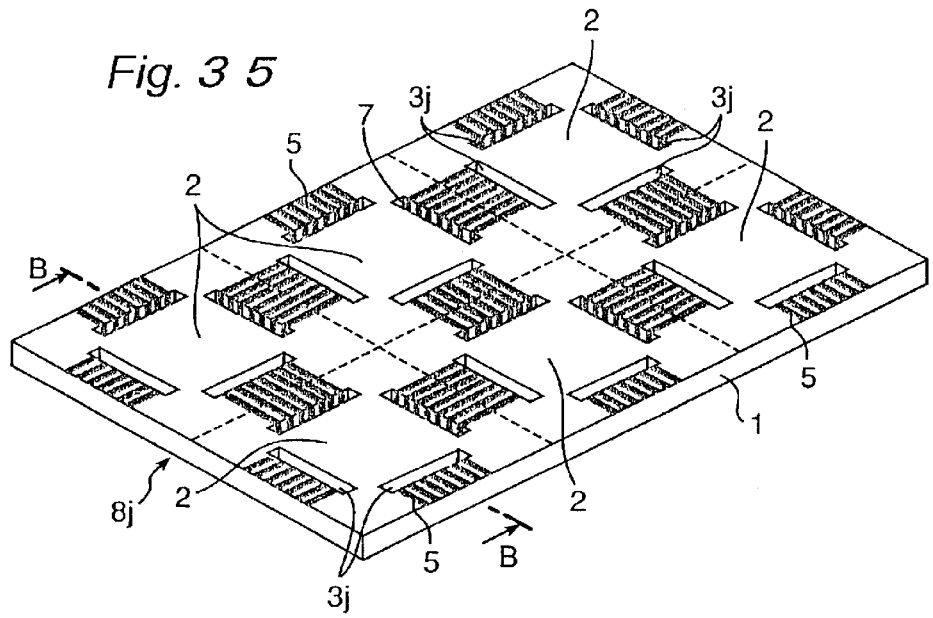
FIG. 35 is a perspective view showing the front surface of a semiconductor module substrate sheet according to an eighth embodiment of the present invention.
Figure 36:
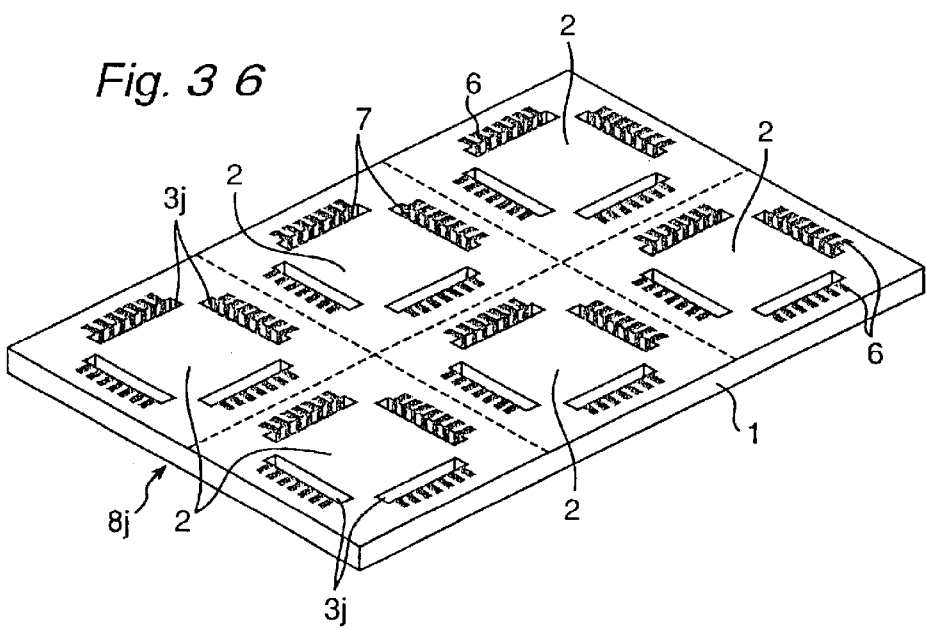
FIG. 36 is a perspective view showing the rear surface of the semiconductor module substrate sheet of the eighth embodiment of the present invention.

A semiconductor module substrate sheet 8j of this eighth embodiment differs from the semiconductor module substrate sheet 8 of the first embodiment in that the connecting sections 7 are arranged on the side wall surface of through holes 3j oppositely from the semiconductor chip placement region. The inner lead sections 5 are arranged in a direction in which the inner lead sections extend from the connecting sections 7 away from the semiconductor chip placement region 2. The outer lead sections 6 are arranged in a direction in which the outer lead sections extend from the connecting sections 7 away from the region corresponding to the rear surface of the semiconductor chip placement region 2, as shown in FIGS. 35, 36, and 57.

Figure 37A:
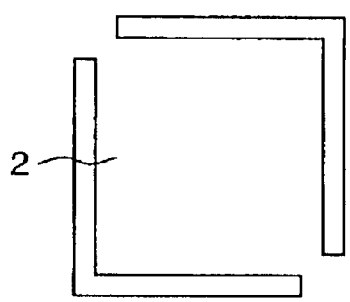
FIGS. 37A, 37B, 37C, and 37D are plan views showing various modified examples of through holes of the semiconductor module substrate sheet of the eighth embodiment.
Figure 37C:
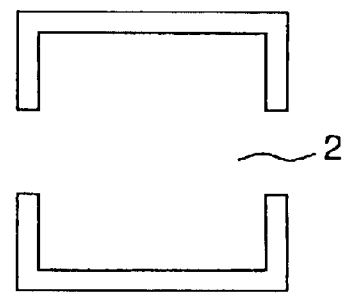
Figure 37B:
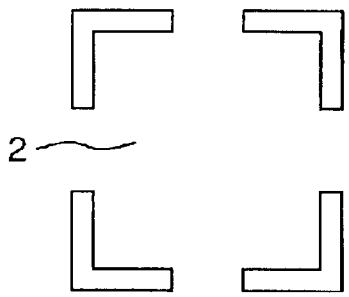
Figure 37D:
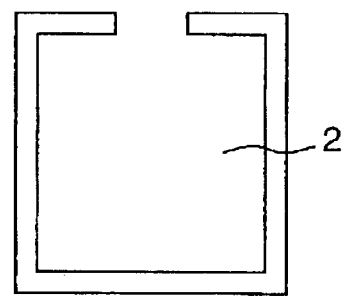

The through holes 3j are similar to the through holes 3. That is, the linear through holes 3j are formed on the four sides of each semiconductor chip placement region 2 except for the four corners of the semiconductor chip placement region 2. Each semiconductor chip placement region 2 is a square or rectangle whose one side has a size of, for example, about 0.5 mm to 50 mm. Each through hole 3j has a width of not smaller than 0.1 mm at least for the formation of the connecting sections 7 on the side wall surface inside the hole thereof, the width being normally set to about 0.3 mm to 3 mm. The structure of the arrangement, shape, and so on of the through holes 3j is not limited to the structure of FIG. 35, so long as the desired connecting sections 7 can be formed on the side wall surfaces of the through holes 3j and may be provided in any way. For example, as shown in FIGS. 37A through 37D, the through holes 3j may be reduced in number by appropriately connecting adjacent through holes 3j, or the through holes 3j may be conversely increased in number, although not shown. Furthermore, as shown in FIGS. 37B, 37C, and 37D, the through holes 3j may be arranged so as to extend through the corner portions without being limited to their arrangement in the portion of each side of each semiconductor chip placement region 2. As a method for forming the through holes 3j through the substrate sheet, there are enumerated press working, router working, drilling, laser beam machining, and the like.

Figure 38:
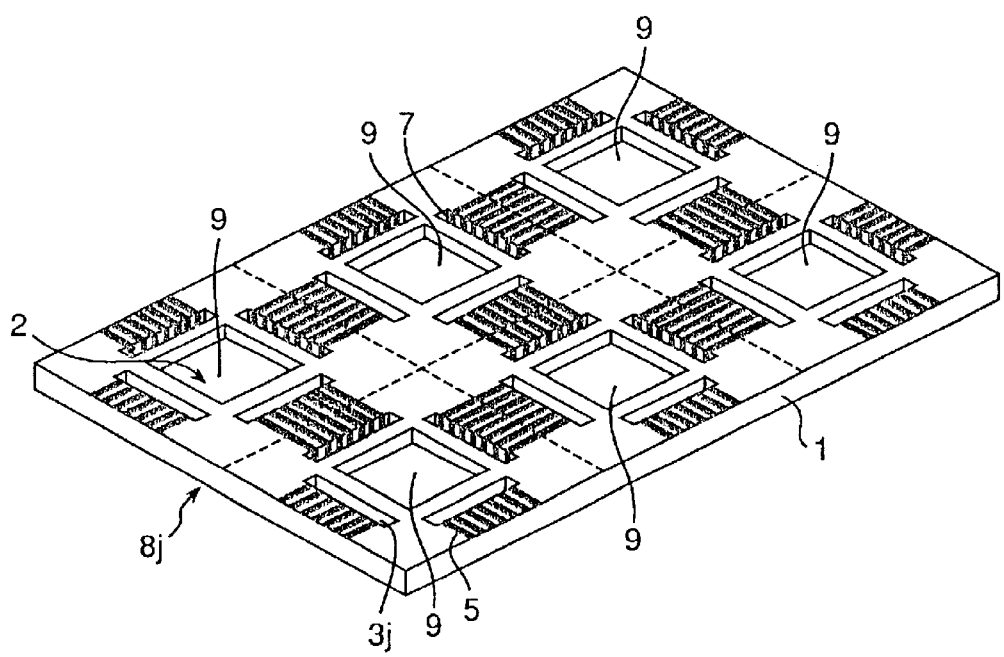
FIG. 38 is a perspective view showing the front surface of a semiconductor module substrate sheet according to a modified example of the eighth embodiment of the present invention.

As a semiconductor module substrate sheet 8j according to a modified example of the eighth embodiment of the present invention, as shown in FIG. 38, a recess 9 of a size capable of receiving the semiconductor chip 10 may be provided at the center of each semiconductor chip placement region 2 on a surface thereof where the inner lead sections 5 are formed, so that the semiconductor chip 10 is received and held in the recess 9, allowing the semiconductor chip 10 to be more stably held on the substrate sheet 8.

Figure 39:
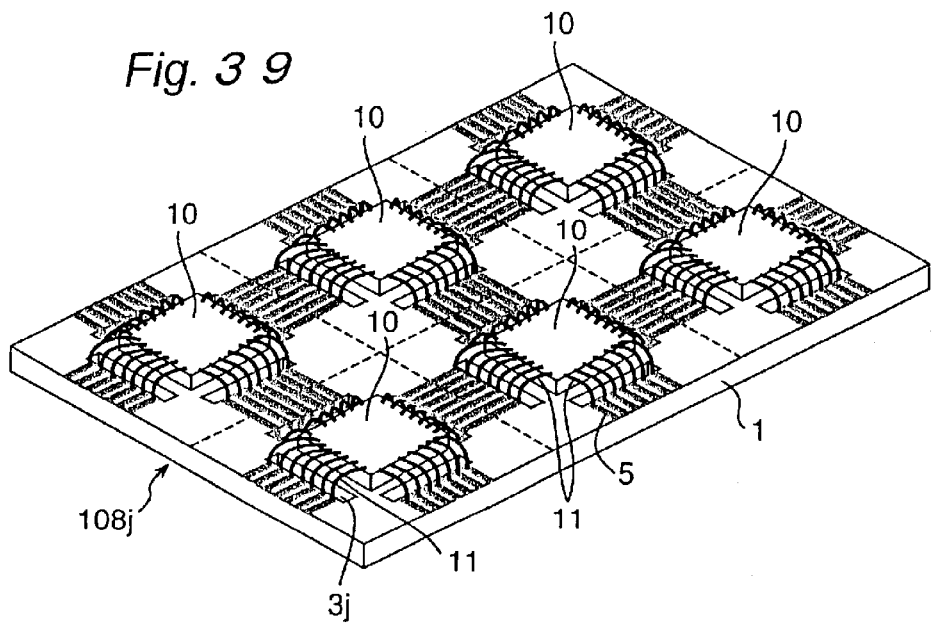
FIG. 39 is a perspective view showing a semiconductor module aggregate obtained by mounting six semiconductor chips on six semiconductor chip placement regions through the semiconductor module fabricating process of the eighth embodiment.

Through the fabricating processes of the semiconductor module of the eighth embodiment that employs the substrate sheet 8 having the aforementioned structure, as shown in FIG. 39, the semiconductor chips 10 are fixed in the six semiconductor chip placement regions 2 of the substrate sheet 8j with of an adhesive or the like. Thereafter, the respective electrode terminals of the semiconductor chips 10 are electrically connected to the corresponding inner lead sections 5 by way of wires 11 of gold or the like so as to stride over the through hole 3j. Through this process, there can be obtained a semiconductor module aggregate 108j constructed of six semiconductor modules in a state in which the semiconductor modules are connected together, as shown in FIG. 39. The semiconductor modules may be conveyed to the next step or the like or shipped as components in the form of the semiconductor module aggregate 108j.

Figure 40:
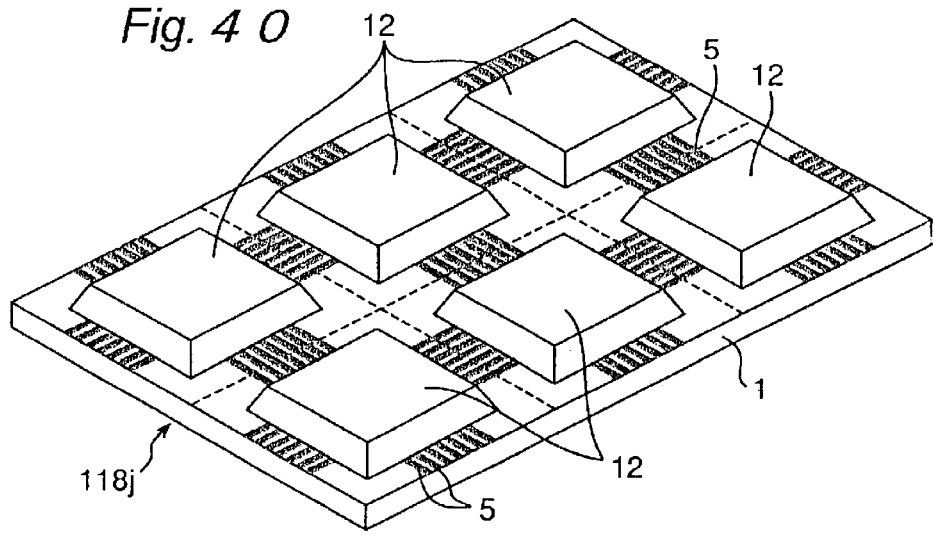
FIG. 40 is a perspective view showing a semiconductor package aggregate obtained by encapsulating the semiconductor chips mounted on the semiconductor chip placement regions of the semiconductor modules of the semiconductor module aggregate fabricated through the semiconductor module fabricating process of the eighth embodiment.

When performing encapsulation of the semiconductor module aggregate 108j, the semiconductor chips 10 placed in the respective semiconductor chip placement regions 2 of the six semiconductor modules 600 of the semiconductor module aggregate 108*j* are each encapsulated, forming a semiconductor package aggregate 118*j* as shown in FIG. 40. This encapsulating work is to encapsulate the respective electrode terminals of the semiconductor chips 10 and at least the through hole side of the respective inner lead sections 5. An encapsulation section 12 to be formed through the encapsulation may be covered with a hollow lid of ceramic or metal or the like, coated with a resin by means of a dispenser or the like, or injection molded with a resin such as epoxy resin or phenol resin. The semiconductor packages may be conveyed to the next step or the like or shipped as a component in the form of the semiconductor package aggregate 118*j*.

Figure 41:
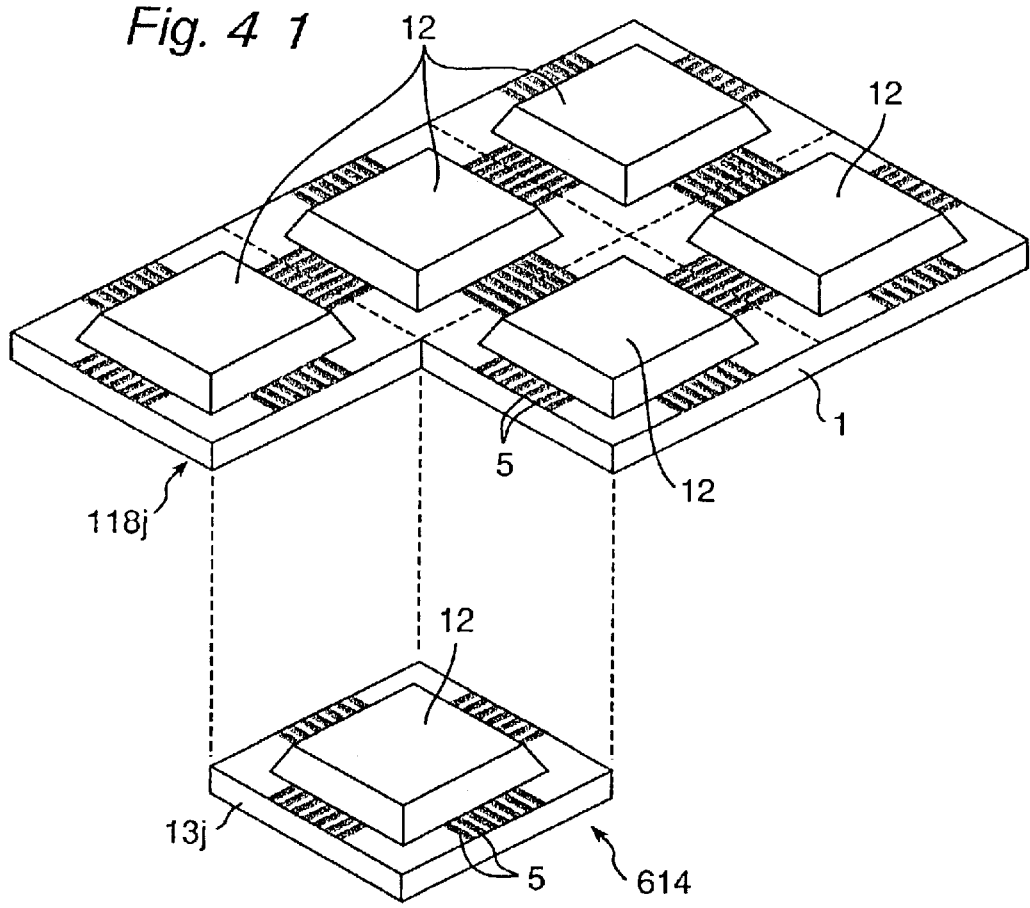
FIG. 41 is a perspective view showing a state in which semiconductor packages are cut one by one from the substrate sheet of the semiconductor package aggregate fabricated in FIG. 40.

When performing separation into individual semiconductor packages 614, as shown in FIG. 41, the semiconductor packages 614 are cut from the semiconductor package aggregate 118*j* one at a time or collectively in the multitude at a time in the portion which is located outside each semiconductor chip placement region 2 and in which the through holes 3 of each semiconductor chip placement region 2 are not formed, i.e., roughly parallel to the adjacent side. For the cutting, punching press, router working, laser beam machining, V cutting, dicer cutting, or the like, is used.

Figure 42:
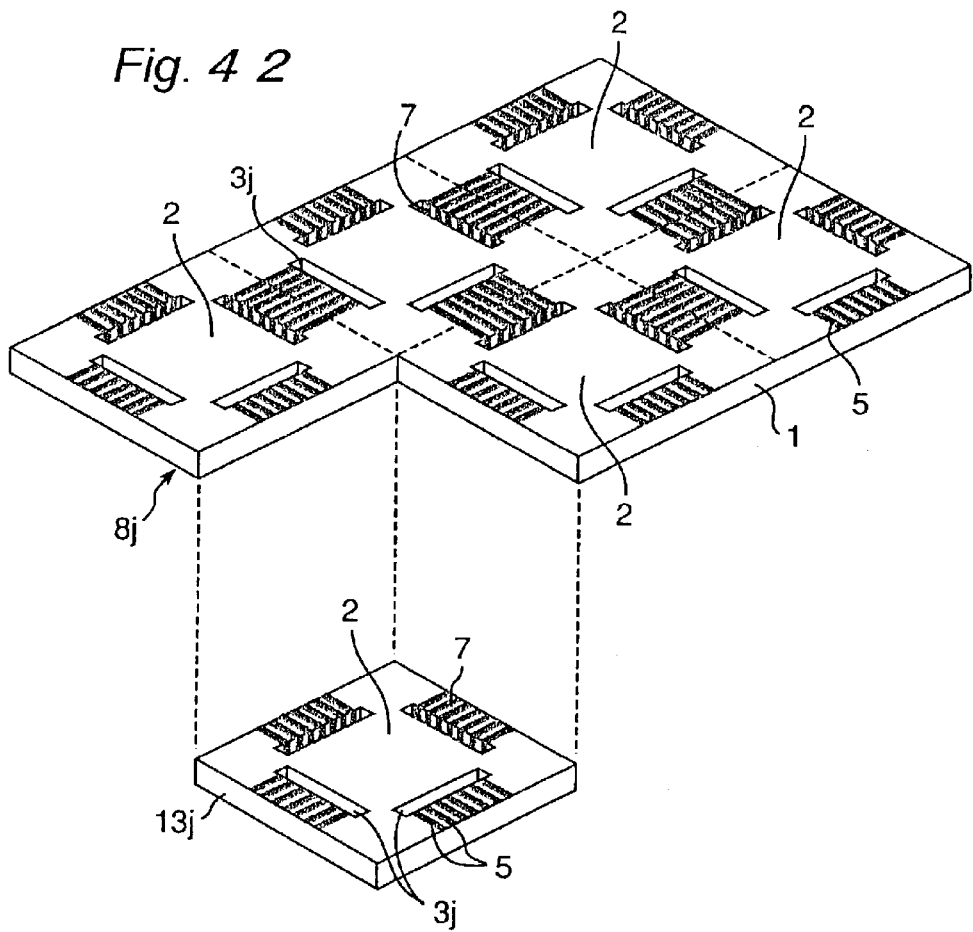
FIG. 42 is a perspective view showing a state in which semiconductor module substrates are cut one by one from the substrate sheet through the semiconductor module fabricating process according to a modified example of the eighth embodiment.

In the semiconductor module fabricating processes according to a modified example of the eighth embodiment employing the substrate sheet 8*j* having the aforementioned construction, as shown in FIG. 42, the insulating substrate, or the substrate 13*j* corresponding to one semiconductor module 600 may be cut from the semiconductor module substrate sheet 8*j* prior to the mounting of the semiconductor chip 10 on the substrate 13*j*. In detail, the substrate 13*j* is cut from the semiconductor module substrate sheet 8*j* of FIG. 42 one at a time or collectively in the multitude at a time. In the separating stage, the cutting is performed in the portion which is located outside each semiconductor chip placement region 2 of each substrate 13*j* and in which the through holes 3*j* of each semiconductor chip placement region 2 are not formed, i.e., roughly parallel to the adjacent side. For the cutting, there is used punching press, router working, laser beam machining, V cutting, dicer cutting, or the like.

Figure 43:
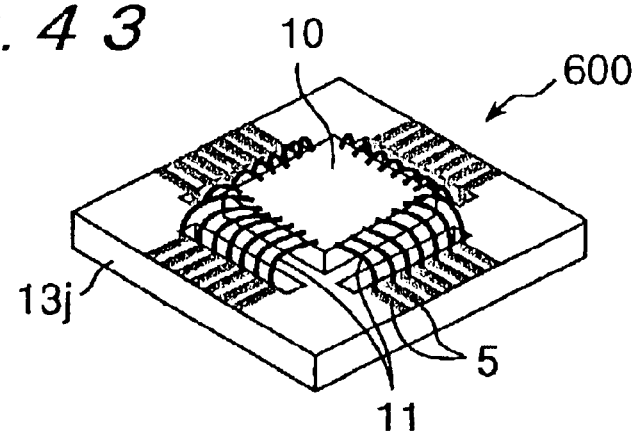
FIG. 43 is a perspective view showing a semiconductor module obtained by mounting a semiconductor chip on the semiconductor chip placement region of the semiconductor module substrate cut from the substrate sheet in FIG. 42.

Next, as shown in FIG. 43, the semiconductor chip 10 is fixed in the semiconductor chip placement region 2 of the separated substrate 13*j* with an adhesive 110 (see FIG. 54) or the like. Thereafter, the respective electrode terminals of the semiconductor chip 10 are electrically connected with the corresponding respective inner lead sections 5 by way of the wires 11 of gold or the like, obtaining a semiconductor module 600. Each semiconductor module may be conveyed to the next step or the like, or shipped as a component in the form of the semiconductor module 600.

Figure 44:
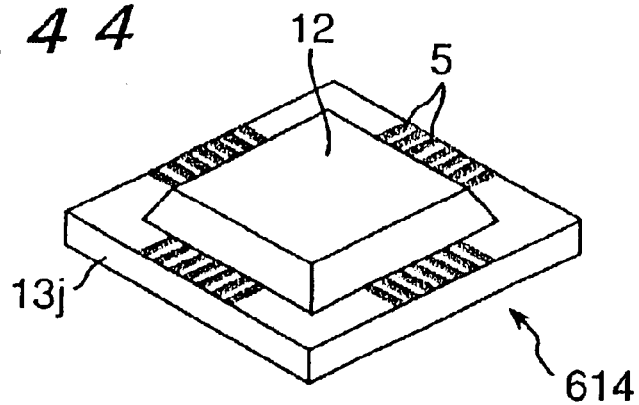
FIG. 44 is a perspective view showing a semiconductor package obtained by encapsulating the semiconductor module of FIG. 43.

Next, when performing encapsulation of the semiconductor module 600, the semiconductor chip 10 mounted on each of the semiconductor chip placement regions 2 of the semiconductor module 600 is encapsulated, forming a semiconductor package 614 as shown in FIG. 44. This encapsulating work is to encapsulate the respective electrode terminals of the semiconductor chip 10 and at least the through hole side of the respective inner lead sections 5. An encapsulation section 12 to be formed through the encapsulation may be covered with a hollow lid of ceramic or metal or the like, coated with a resin by means of a dispenser or the like, or injection molded with a resin such as epoxy resin or phenol resin. Each semiconductor package may be conveyed to the next step or the like or shipped as a component in the form of the semiconductor package 614.

Although the semiconductor modules 600 are separated one by one according to the aforementioned semiconductor module fabricating method, the present invention is not limited to this. It is acceptable to obtain a multiple semiconductor module in a state in which two semiconductor modules 600 are mounted on a substrate corresponding to two substrates 13*j* by separating the semiconductor modules 600 in pairs and electrically connecting both the modules. As a method for electrically connecting the two semiconductor modules 600, it is proper to form special inner lead sections on the front surface side of the substrate sheet for the electrical connection of the two semiconductor modules as shown in FIG. 13 or FIG. 24, form special outer lead sections having a shape similar to those of the special inner lead sections shown in FIG. 13 or the figure on the rear surface side of the substrate sheet for the electrical connection of the two semiconductor modules although not shown in concrete, or electrically connect the inner lead sections with the outer lead sections by way of metal layers or internal layer wirings on the internal surface of the through hole. It is also acceptable to obtain a multiple semiconductor module in which a greater number of semiconductor modules are mounted on one substrate by separating the semiconductor modules 600 in threes or greater arbitrary numbers. Even in this case, the three or greater arbitrary number of semiconductor modules 600 are appropriately electrically connected in a similar manner.

Figure 79:
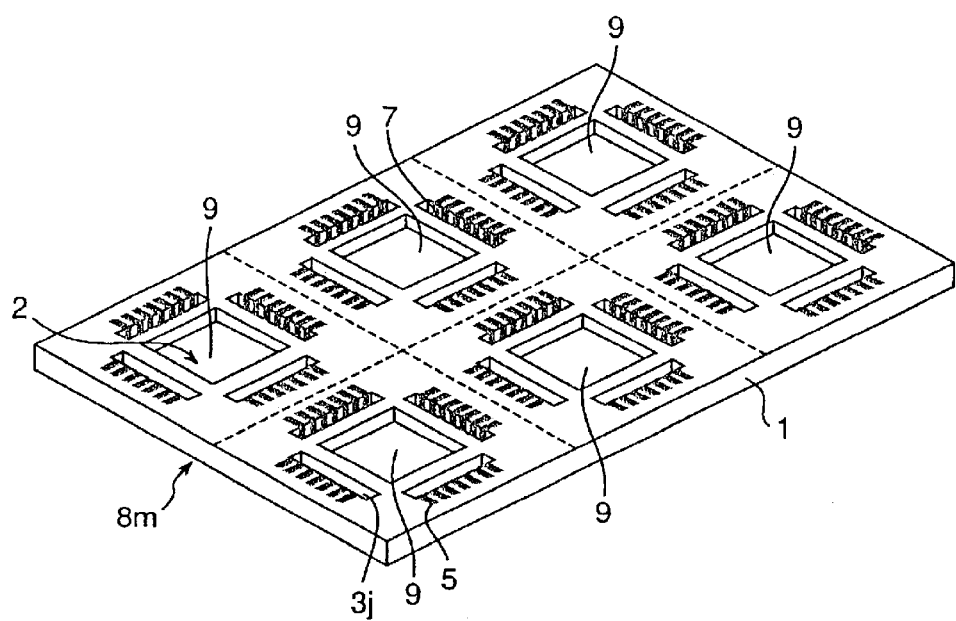
FIG. 79 is a perspective view showing the front surface of a semiconductor module substrate sheet according to a further modified example of the eighth embodiment of the present invention.
Figure 80:
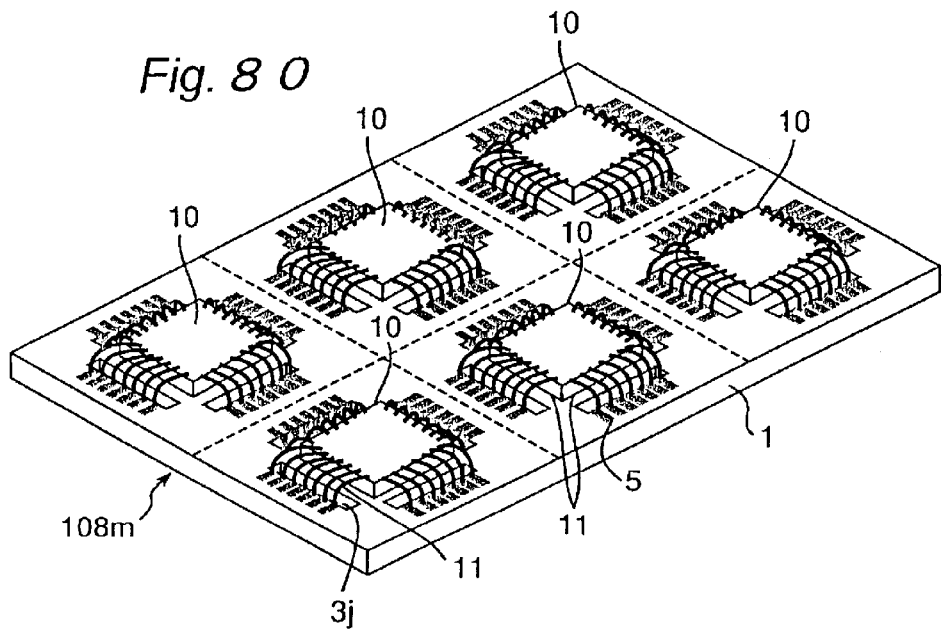
FIG. 80 is a perspective view showing a semiconductor module aggregate obtained by mounting six semiconductor chips on six semiconductor chip placement regions through the semiconductor module fabricating process according to the modified example of the eighth embodiment of FIG. 79.
Figure 81:
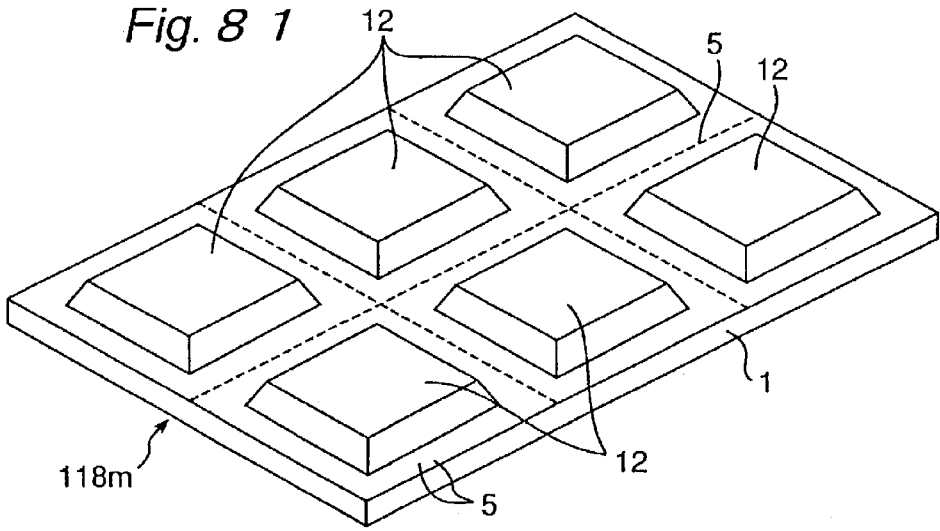
FIG. 81 is a perspective view showing a semiconductor package aggregate obtained by encapsulating the semiconductor chips mounted on the semiconductor chip placement regions of the semiconductor modules of the semiconductor module aggregate fabricated through the semiconductor module fabricating process of the modified example of the eighth embodiment of FIG. 79.

According to the aforementioned eighth embodiment and modified examples, by leading the leads out of the through holes 3*j*, the connecting sections 7 can be prevented from being exposed to the side surface of the semiconductor module or the semiconductor package. This can consequently contribute to the improvement in reliability of the product. Furthermore, according to a further modified example of the eighth embodiment, when the inner lead sections are shortened in length on the semiconductor chip placement region side by comparison with the cutting portion for the separation into individual semiconductor packages so as to be accommodated into the encapsulation section 12 as respectively indicated by the substrate sheet 8*m* of FIG. 79, the semiconductor module aggregate 108*m* of FIG. 80, and the semiconductor module aggregate 118*m* of FIG. 81, the reliability is further improved and no burr of the inner lead sections is generated even at the time of separation into individual semiconductor packages.

Reference is next made to a semiconductor module substrate sheet and a semiconductor module fabricating method employing the substrate sheet according to a ninth embodiment of the present invention.

Figure 45:
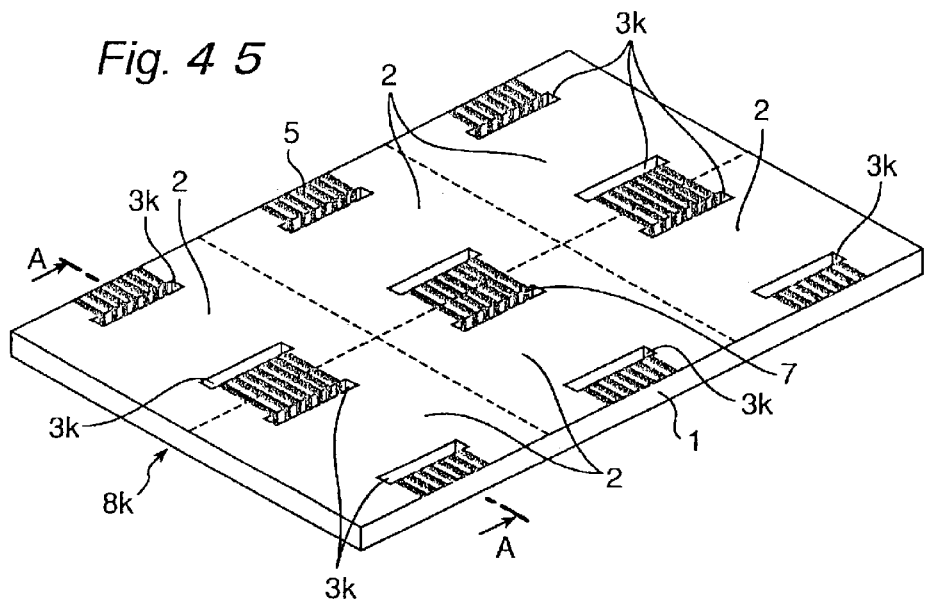
FIG. 45 is a perspective view showing the front surface of a semiconductor module substrate sheet according to a ninth embodiment of the present invention.
Figure 46:
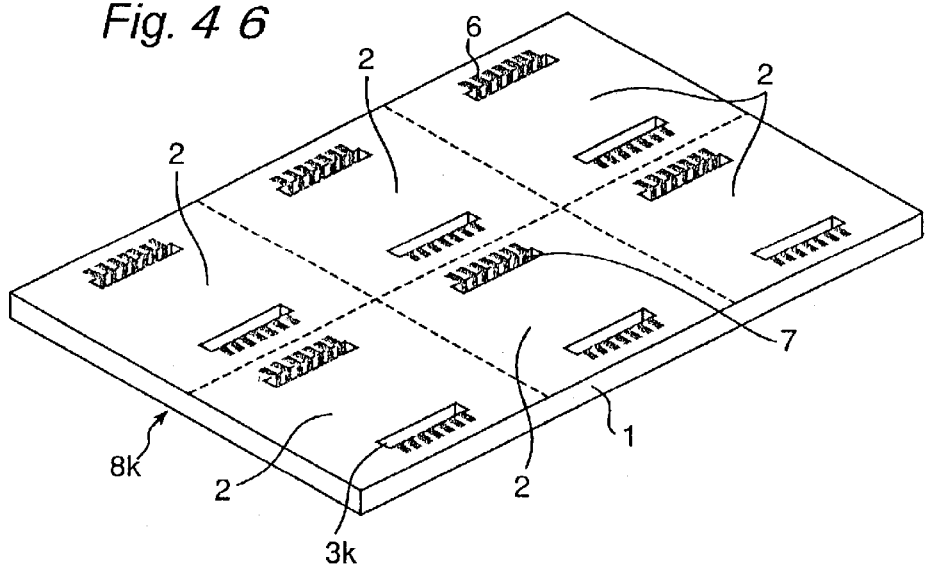
FIG. 46 is a perspective view showing the rear surface of the semiconductor module substrate sheet of the ninth embodiment of the present invention.

The semiconductor module substrate sheet 8*k* of this ninth embodiment differs from the semiconductor module substrate sheet 8*j* of the eighth embodiment in that through holes 3*k* are provided not on four sides of each semiconductor chip placement region 2, but only on two opposite sides thereof. The through holes 3*k* are elongated holes continuing so as to correspond to three semiconductor chip placement regions 2 arranged adjacently along the longitudinal direction of the substrate sheet 8*k*. Therefore, the inner lead sections 5, the outer lead sections 6, and the connecting sections 7 for connecting these inner and outer lead sections are provided not on the four sides of each semiconductor chip placement region 2 but on the through holes 3*k* located on the two opposite sides, as shown in FIGS. 45, 46, and 58.

This ninth embodiment is able to reduce the number of through holes 3*k* for one semiconductor module, reduce the efforts for processing the through holes 3*k* through the substrate sheet 8*k* for the achievement of cost reduction, and reduce the numbers of inner lead sections 5, the outer lead sections 6, and the connecting sections 7 for connecting these inner and outer lead sections, as compared with the eighth embodiment.

Figure 47:
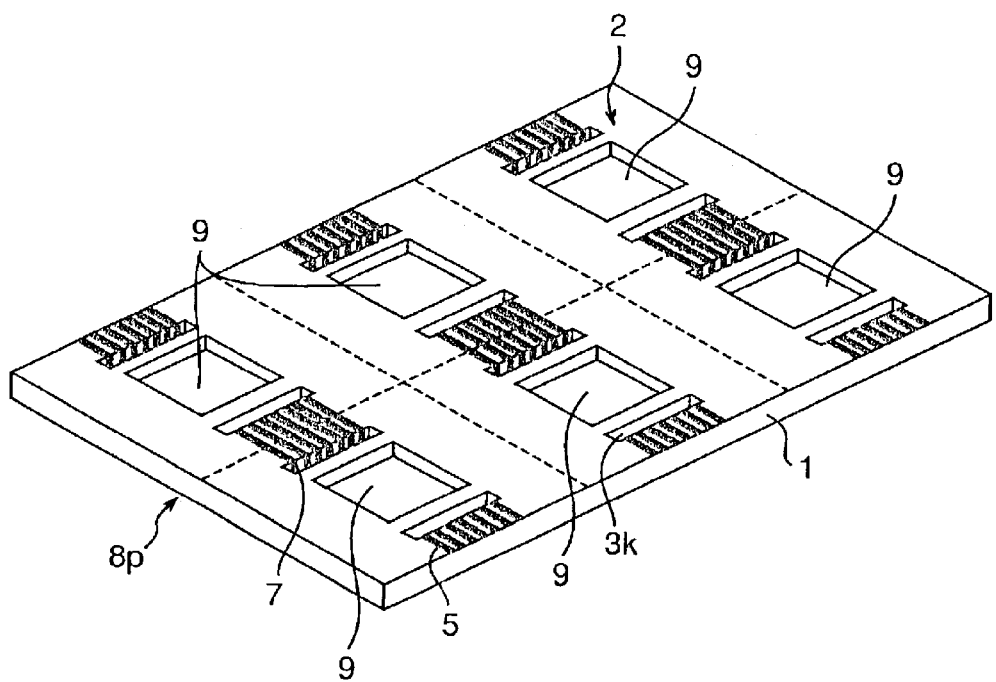
FIG. 47 is a perspective view showing the front surface of a semiconductor module substrate sheet according to a modified example of the ninth embodiment of the present invention.

As a semiconductor module substrate sheet 8p according to a modified example of the ninth embodiment of the present invention, as shown in FIG. 47, it is acceptable to provide a recess 9 having a size capable of receiving a semiconductor chip 10b at the center of each semiconductor chip placement region 2 on the surface on which the inner lead sections 5 are formed, and receive and hold the semiconductor chip 10b in the recess 9, thereby assuring more stable hold on the substrate sheet 8.

Figure 48:
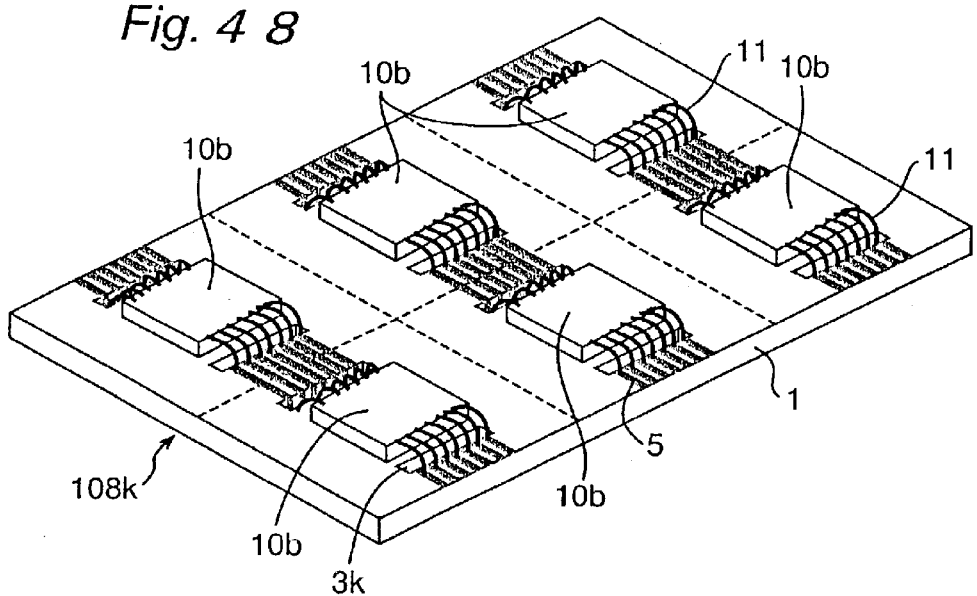
FIG. 48 is a perspective view showing a semiconductor module aggregate obtained by mounting six semiconductor chips on six semiconductor chip placement regions through the semiconductor module fabricating process of the ninth embodiment.

In the semiconductor module fabricating process of the ninth embodiment employing the substrate sheet 8k having the aforementioned structure, as shown in FIG. 48, the semiconductor chips 10 are fixed in the six semiconductor chip placement regions 2 of the substrate sheet 8k with an adhesive or the like. Thereafter, the respective electrode terminals of the semiconductor chips 10b are electrically connected with the corresponding respective inner lead sections 5 by way of wires 11 of gold or the like. Through these steps, a semiconductor module aggregate 108k constructed of mutually connected six semiconductor modules as shown in FIG. 48 can be obtained. The semiconductor modules may be conveyed to the next step or the like or shipped as components in the form of the semiconductor module aggregate 108k.

Figure 49:
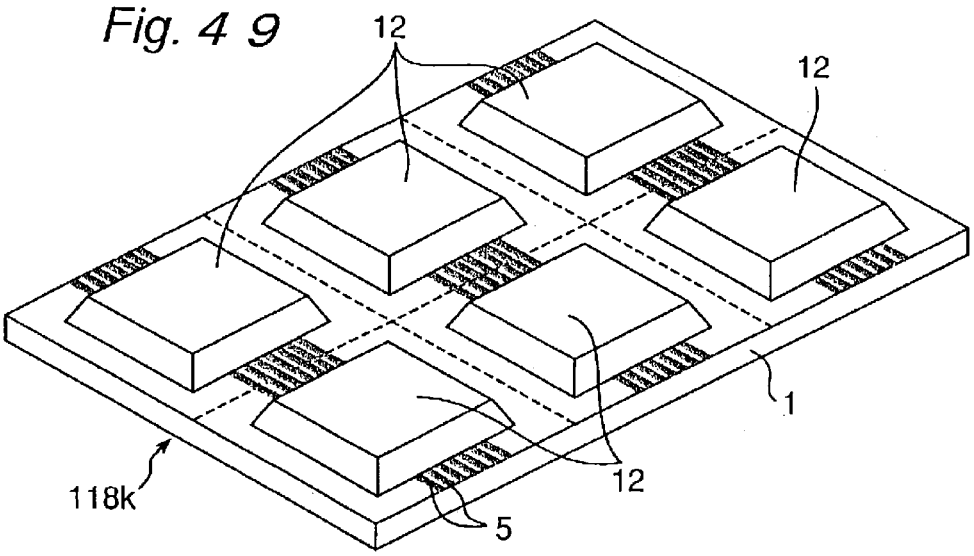
FIG. 49 is a perspective view showing a semiconductor package aggregate obtained by encapsulating the semiconductor chips mounted on the semiconductor chip placement regions of the semiconductor modules of the semiconductor module aggregate fabricated through the semiconductor module fabricating process of the ninth embodiment.

When performing encapsulation of the semiconductor module aggregate 108k, the semiconductor chips 10b mounted on the semiconductor chip placement regions 2 of the six semiconductor modules 700 of the semiconductor module aggregate 108k are each encapsulated, forming a semiconductor package aggregate 118k as shown in FIG. 49. This encapsulating work is to encapsulate the respective electrode terminals of the semiconductor chips 10b and at least the through hole side of the respective inner lead sections 5. The encapsulation section 12 to be formed through the encapsulation may be covered with a hollow lid of ceramic or metal or the like, coated with a resin by means of a dispenser or the like, or injection molded with a resin such as epoxy resin or phenol resin. The semiconductor packages may be conveyed to the next step or the like or shipped as components in the form of the semiconductor package aggregate 118k.

Figure 50:
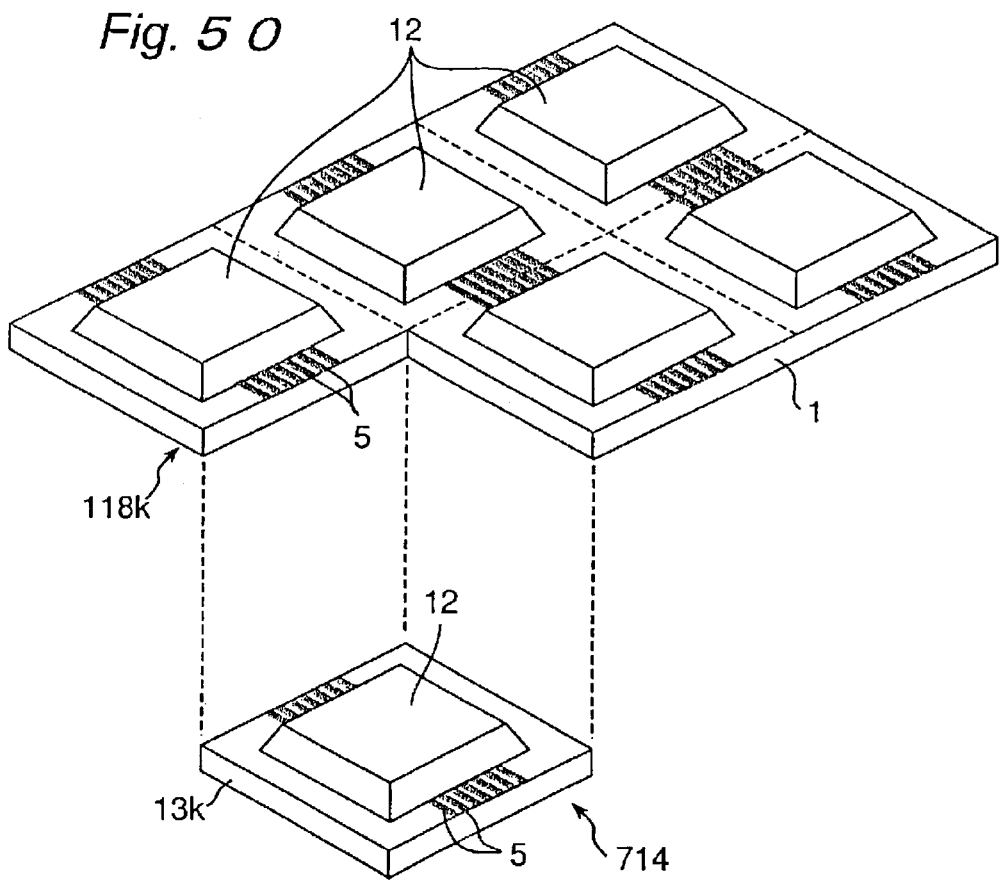
FIG. 50 is a perspective view showing a state in which semiconductor packages are cut one by one from the substrate sheet of the semiconductor package aggregate fabricated in FIG. 49.

When performing separation into individual semiconductor packages 714, as shown in FIG. 50, the semiconductor packages 714 are cut from the semiconductor package aggregate 118k one at a time or collectively in the multitude at a time outside each semiconductor chip placement region 2 into a rectangular shape roughly parallel to the four sides of each semiconductor chip placement region 2. For the cutting, punching press, router working, laser beam machining, V cutting, dicer cutting, or the like is used.

Figure 51:
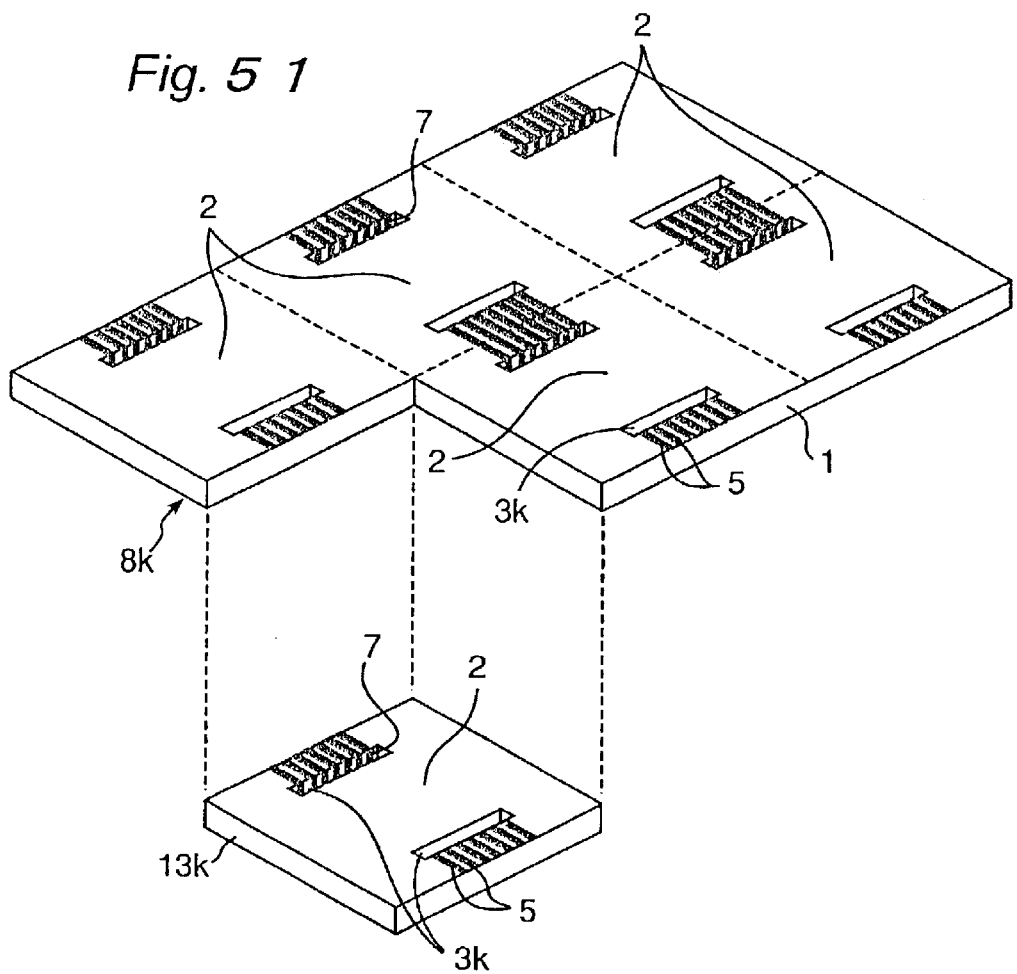
FIG. 51 is a perspective view showing a state in which semiconductor module substrates are cut one by one from the substrate sheet through the semiconductor module fabricating process according to a modified example of the ninth embodiment.

In the semiconductor module fabricating processes of the aforementioned modified example of the ninth embodiment employing the substrate sheet 8k having the aforementioned structure, as shown in FIG. 51, the insulating substrate, or the substrate 13k corresponding to one semiconductor module 700 can also be cut from the semiconductor module substrate sheet 8k prior to the mounting of the semiconductor chip 10b on the substrate 13k. In detail, the substrate 13k is cut from the semiconductor module substrate sheet 8k of FIG. 51 one at a time or collectively in the multitude at a time outside each semiconductor chip placement region 2 into a rectangular shape roughly parallel to the sides of each semiconductor chip placement region 2. For the cutting, punching press, router working, laser beam machining, V cutting, dicer cutting, or the like is used.

Figure 52:
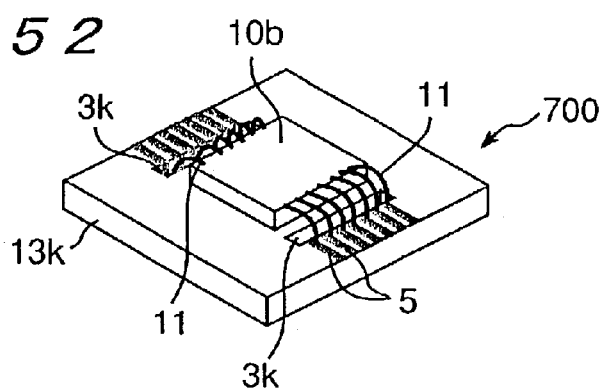
FIG. 52 is a perspective view showing a semiconductor module obtained by mounting a semiconductor chip on the semiconductor chip placement region of the semiconductor module substrate cut from the substrate sheet in FIG. 51.
Figure 54:
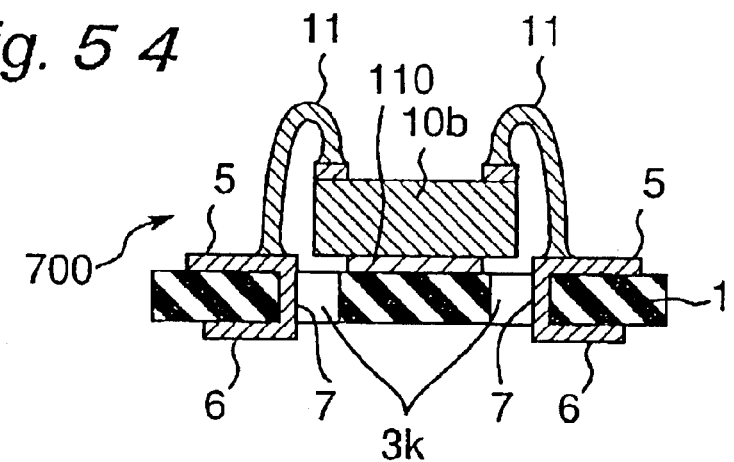
FIG. 54 is a sectional view of the semiconductor module of FIG. 53.

Next, as shown in FIGS. 52 and 54, the semiconductor chip 10b is fixed in the semiconductor chip placement region 2 of the separated substrate 13k with an adhesive 110 or the like. Thereafter, the respective electrode terminals of the semiconductor chip 10b are electrically connected with the corresponding respective inner lead sections 5 by way of the wires 11 of gold or the like, obtaining the semiconductor module 700. Each semiconductor module may be conveyed to the next step or the like or shipped as a component in the form of the semiconductor module 700.

Figure 53:
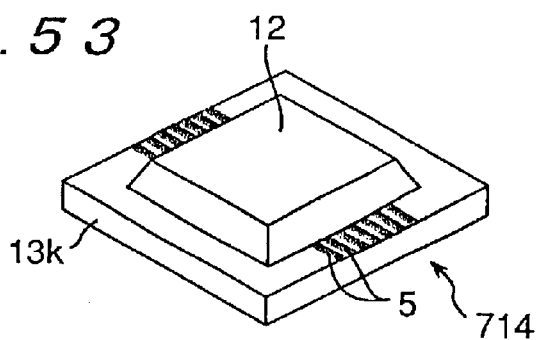
FIG. 53 is a perspective view showing a semiconductor package obtained by encapsulating the semiconductor module of FIG. 52.

Next, when performing encapsulation of the semiconductor module 700, the semiconductor chip 10b mounted on each semiconductor chip placement region 2 of the semiconductor module 700 is encapsulated, forming a semiconductor package 714 as shown in FIG. 53. This encapsulating work is to encapsulate the respective electrode terminals of the semiconductor chip 10b and at least the through hole side of the respective inner lead sections 5. An encapsulation section 12 to be formed through the encapsulation may be covered with a hollow lid of ceramic or metal or the like, coated with a resin by means of a dispenser or the like, or injection molded with a resin such as epoxy resin or phenol resin. Each semiconductor package may be conveyed to the next step or the like or shipped as a component in the form of the semiconductor package 714.

Although the semiconductor modules 700 are separated one by one according to the aforementioned semiconductor module fabricating method, the present invention is not limited to this. It is acceptable to obtain a multiple semiconductor module 214 in a state in which two semiconductor modules 700 are mounted on a substrate corresponding to two substrates 13k by separating the semiconductor modules 700 in pairs and electrically connecting both the modules. As a method for electrically connecting the two semiconductor modules 700, it is proper to form special inner lead sections on the front surface side of the substrate sheet for the electrical connection of the two semiconductor modules, as shown in FIG. 13 or FIG. 24, form special outer lead sections having a shape similar to those of the special inner lead sections shown in FIG. 13 or FIG. 24 on the rear surface side of the substrate sheet for the electrical connection of the two semiconductor modules although not shown, or electrically connect the inner lead sections with the outer lead sections by way of metal layers or internal layer wirings on the internal surface of the through hole. It is also acceptable to obtain a multiple semiconductor module in which a greater number of semiconductor modules are mounted on one substrate by separating the semiconductor modules 700 in threes or greater arbitrary numbers. Even in this case, the three or greater arbitrary number of semiconductor modules 700 are appropriately electrically connected in a similar manner. By providing the through holes on two opposite sides of the semiconductor chip placement region 2, the semiconductor chip placement regions 2 can be arranged close to one another along the two sides where no through hole is required to be formed. Therefore, the semiconductor chips can be arranged in high density on the substrate sheet, and a greater number of semiconductor modules can be formed, reducing the cost.

Reference is next made to a semiconductor module substrate sheet and a semiconductor module fabricating method employing the substrate sheet according to a tenth embodiment of the present invention.

Figure 55:
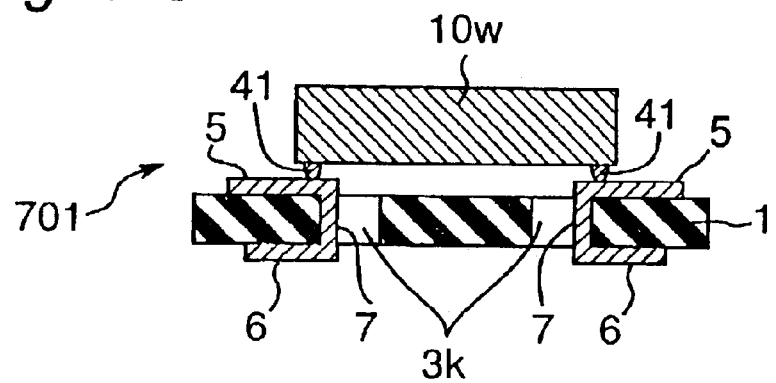
FIG. 55 is a sectional view of a semiconductor module according to a tenth embodiment of the present invention.

As shown in FIG. 55, this tenth embodiment differs from the ninth embodiment in that the semiconductor module substrate sheet 8k of the ninth embodiment is provided with through holes 3k inside the semiconductor chip placement region 2 and the electrode terminals 10a located on the bottom surface of a semiconductor chip 10w are directly connected (down-face connected) with the inner lead sections 5 located inside the semiconductor chip placement region 2 and outside the through holes so as to obtain a semiconductor module 701, eliminating the wires 11.

In this tenth embodiment, specifically, it is acceptable to obtain a semiconductor module 701 by preparing a semiconductor chip 10w having hemispheric bumps 41, as shown in FIG. 55, provided on electrode terminals 10a located on the bottom surface of the semiconductor chip 10w, mounting the semiconductor chip 10w on the substrate sheet and electrically connecting the bumps 41 to the inner lead sections 5.

Figure 56:
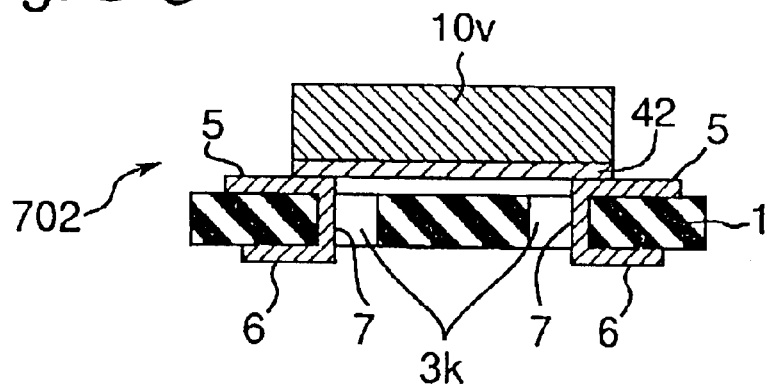
FIG. 56 is a sectional view of a semiconductor module of the tenth embodiment of the present invention.
Figure 5:
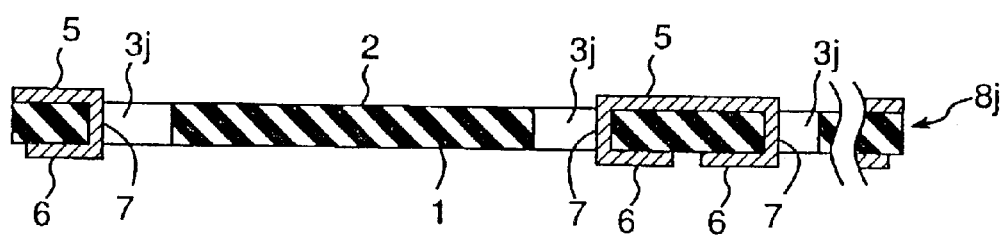
Figure 5:
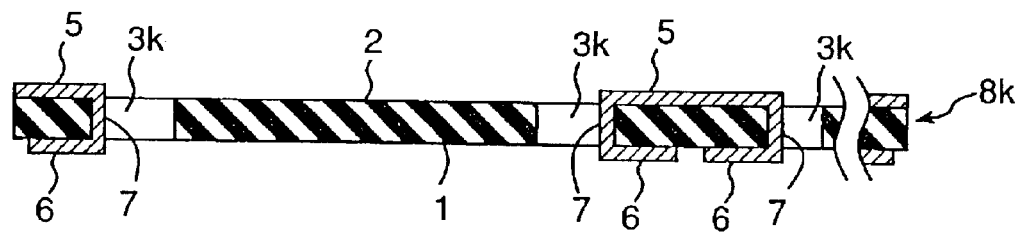

In the tenth embodiment, it is acceptable to obtain a semiconductor module 702 by electrically bonding (down-face connecting) the electrode terminals 10a located on the bottom surface of the semiconductor chip 10v to the inner lead sections 5 with interposition of an anisotropic conductive adhesive 42, as shown in FIG. 56. By virtue of the fact that wires are unnecessary and the consequent fact that the height of rise of the connecting portions of the semiconductor chip and the wire are not necessary, the semiconductor module can be lower in height. This arrangement is effective for the place where wire bonding is hard to apply to the connection of narrow-pitch inner leads with the semiconductor chip. This can also save the area of connection of the wires with the leads.

Figure 59:
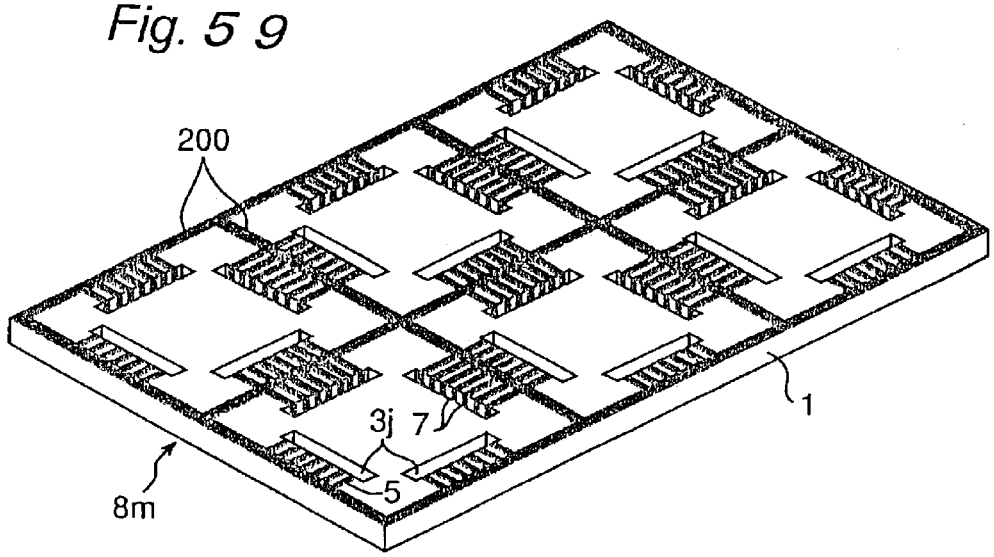
FIG. 59 is a perspective view showing the front surface of a semiconductor module substrate sheet according to an eleventh embodiment of the present invention.
Figure 60:
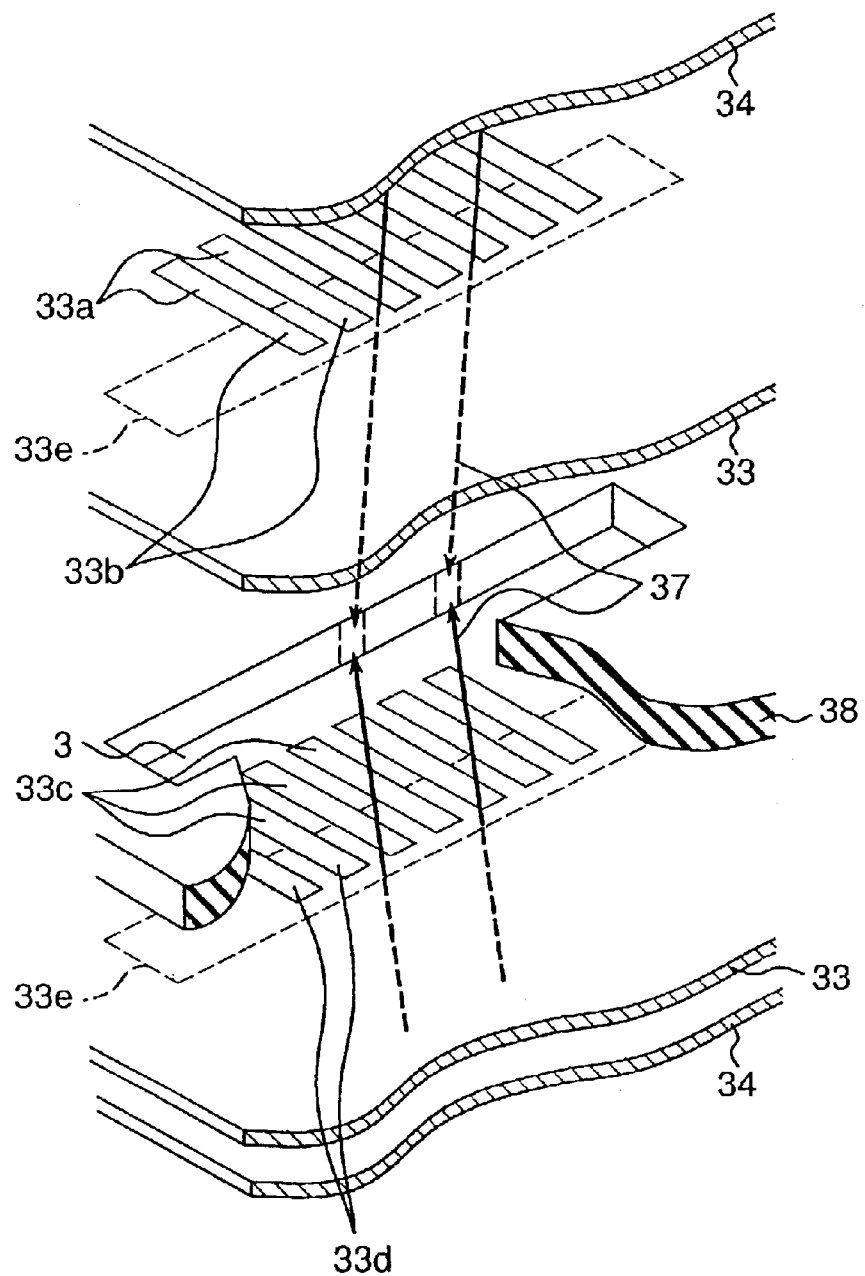
FIG. 60 is an explanatory view showing a method for partially exposing to light the photoresist film of the connecting section located on a side wall surface of the through hole of a semiconductor module substrate sheet according to twelfth through sixteenth embodiments, described later, of the present invention.
Figure 61:
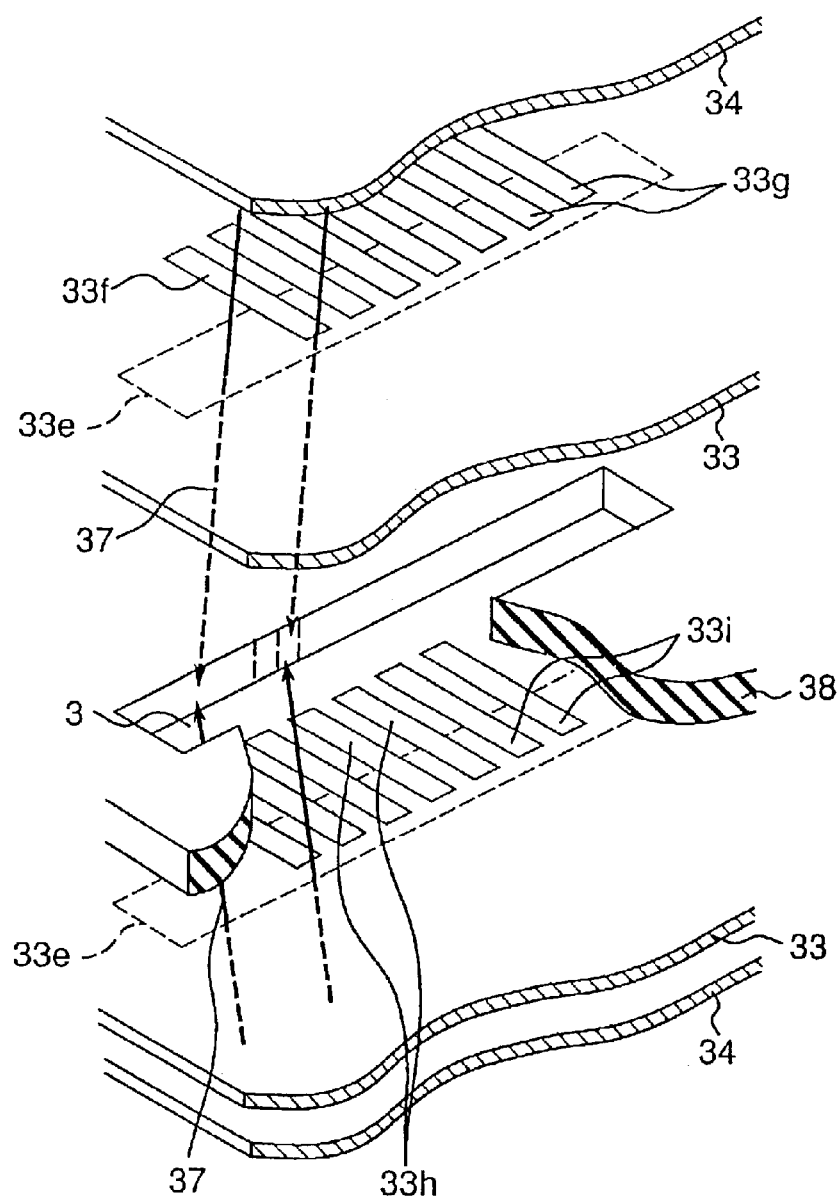
FIG. 61 is an explanatory view showing a method for partially exposing to light the photoresist film of the connecting section located on a side wall surface of the through hole of a semiconductor module substrate sheet according to modified examples of the twelfth through the sixteenth embodiments, described later, of the present invention.

Next, a semiconductor module substrate sheet 8m according to an eleventh embodiment of the present invention is shown in FIG. 59. This substrate sheet 8m has a construction in which leads 200 for surface treatment are formed together with the inner lead sections 5, or the outer lead sections 6, or the outer lead sections 6 and the inner lead sections 5, so that these lead sections can be formed by electroplating as described later. The leads 200 for surface treatment are connected to all the inner lead sections, or all the outer lead sections, or all of the inner lead sections and the outer lead sections, and therefore, the electroplating can be performed. The leads 200 for surface treatment may be electrically connected to the outer leads, or to both the inner lead sections and the outer lead sections. When separation into individual semiconductor module substrate sheets, i.e., the substrates or semiconductor modules, is performed, the cutting is effected so that the inner lead sections are not electrically connected with the outer lead sections by the leads for surface treatment. When the electroplating is performed in the above-mentioned manner, thick plating can be performed within a short plating time, improving the reliability of connection with the semiconductor chips.

As methods for forming the patterns of the inner lead sections 5, the outer lead sections 6, and the connecting sections 7 of the substrate sheets of each of the aforementioned embodiments, i.e., methods for fabricating the substrate sheet of the embodiments of the present invention, there are the following methods. It is to be noted that the reference numerals used in the first embodiment are used as a representative example in the following description. Therefore, in the following description, "the side wall surface of the through hole" means the side wall surface of the recess in the case of a substrate sheet where no through hole exists but a recess exists and means a portion such as a substrate sheet edge where connecting sections are formed in the case of a substrate where no through hole exists.

A method for fabricating a substrate sheet according to a twelfth embodiment of the present invention will be described with reference to FIG. 72.

Figure 72:
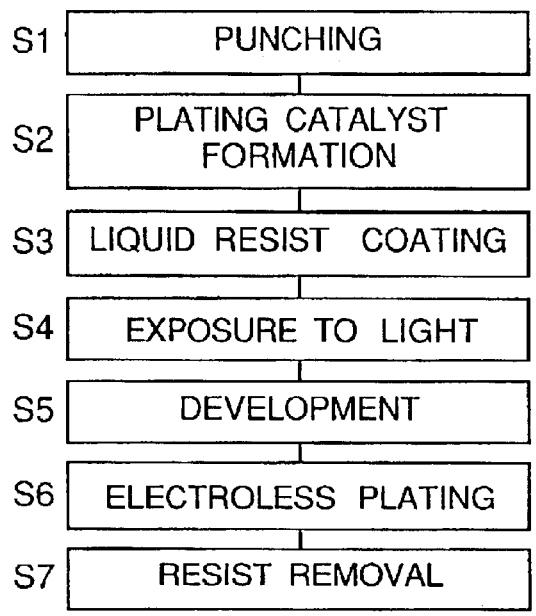
FIG. 72 is a process chart for explaining forming steps of the connecting sections and so on by the substrate sheet fabricating method of the twelfth embodiment of the present invention for the fabrication of a substrate sheet according to the above embodiment.

First of all, through holes 3 are opened through the insulating substrate 1 in step S1 of FIG. 72, and a plating catalyst of palladium or the like is formed entirely on both surfaces of the insulating substrate 1 and the side wall surfaces of the through holes 3 in step S2 of FIG. 72. Otherwise, through holes 3 are opened through a substrate obtained by sticking a conductor of a copper foil or the like entirely on both surfaces of the insulating substrate 1 in step S1 of FIG. 72. Thereafter, as a plating catalyst, palladium or the like is formed entirely on the side wall surfaces of the through holes 3 and further, entirely on both surfaces of the substrate 1 as the need arises in step S2 of FIG. 72.

Next, in steps S3 through S5 of FIG. 72, a plating resist layer is provided in portions that belong to both surfaces of the substrate and is not required to plate portions other than the portions to be respectively left as the inner lead sections 5 and the outer lead sections 6 and portions that belong to the side wall surfaces of the through holes 3 and is not required to plate portions other than the portions to be left as the connecting sections 7. As the plating resist layer, a general photosensitive plating resist material is used. The plating resist layer is formed into an arbitrary pattern in the portions that are not required to be plated through the processes of liquid resist coating (step S3), exposure to light (step S4), and development (step S5). The coating may be performed through electrodeposition coating by immersing the substrate in a photosensitive electrodeposition liquid besides the general coating method. As the photosensitive plating resist material, acrylic-based, polyvinylcinnamate-based, synthetic rubber-based, or novolak-based photocurable type or photolysis type is used.

Next, in step S6 of FIG. 72, a plating layer is formed on the portions other than the plating resist layer formed on the portions that are not required to be plated, i.e., the portions that are required to be plated by electroless plating.

Further, in step S7 of FIG. 72, the plating resist layer is removed. Through the above steps, the patterns of the inner lead sections and the outer lead sections 6 are formed on both surfaces of the substrate, respectively, and the pattern of the connecting sections 7 are formed on the side wall surface of the through holes 3. Through this process, in order to remove the plating resist layer, an appropriate release agent is used, such as sodium hydroxide, sodium metasilicate enneahydrate, methylene chloride, glycol ether, a mixed solvent of these substances, or an organic solvent of a mixed liquid of these substances and an alkaline aqueous solution, such as sodium hydroxide and potassium hydroxide. By so doing, a plating layer is formed in the portion other than the plating resist. Consequently, there can be achieved a pattern corresponding to the resolution of the resist, which is appropriate for a fine pattern. In the case of the etching resist, a portion located underneath the resin is eroded a little. Putting this factor into comparison, the plating resist conforms to the resist pattern.

As a method for forming the patterns of the inner lead sections 5, the outer lead sections 6, and the connecting sections 7, there is a method for using another plating resist layer. This will be described as a method for fabricating a substrate sheet according to a thirteenth embodiment of the present invention with reference to FIG. 73.

Figure 73:
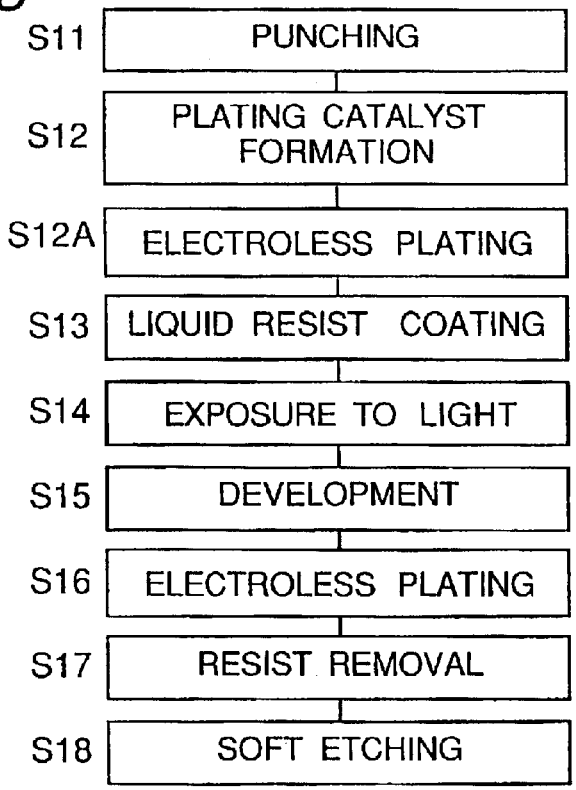
FIG. 73 is a process chart for explaining forming steps of the connecting sections and so on by the substrate sheet fabricating method of the thirteenth embodiment of the present invention for the fabrication of a substrate sheet according to the above embodiment.

First of all, through holes 3 are opened through the insulating substrate 1 in step S11 of FIG. 73 similarly to the method using the plating resist layer in the twelfth embodiment. Thereafter, as a plating catalyst, palladium or the like is formed entirely on both surfaces of the insulating substrate 1 and the side wall surfaces of the through holes 3 in step S12 of FIG. 73. Otherwise, through holes 3 are opened through a substrate obtained by sticking a conductor of copper foil or the like entirely on both surfaces of the insulating substrate 1 in step S11 of FIG. 73. Thereafter, as a planting catalyst, palladium or the like is formed entirely on the side wall surfaces of the through holes 3 and further, entirely on both surfaces of the substrate 1 as the need arises in step S12 of FIG. 73.

Next, electroless plating is performed in step S12A of FIG. 73. The conductive layer constructed of this electroless plating is appropriate for growing an electroplating layer to be formed thereon. The conductive layer constructed of the electroless plating is formed on the entire surface. The electroless plating is formed as an electric conductive layer on both whole surfaces of the insulating substrate and the side wall surfaces of the through holes and then formed of a metal such as copper, nickel, or tin for the formation of a metal layer thereon by electroplating.

Next, in steps S13 through S15 of FIG. 73, a plating resist layer is provided in portions that belong to both surfaces of the insulating substrate 1 and are not required to plate portions other than the portions to be left as the inner lead sections 5 and the outer lead sections 6 and portions that belong to the side wall surfaces of the through holes 3 and portions other than the portions to be left as the connecting sections 7. As the plating resist layer, a general photosensitive plating resist material is used, and the plating resist layer is formed into an arbitrary pattern in the portions that are not required to be plated through the processes of liquid resist coating (step S13), exposure to light (step S14), and development (step S15). The coating may be performed through electrodeposition coating by immersing the substrate in a photosensitive electrodeposition liquid besides the general coating method. As the photosensitive plating resist material, acrylic-based, polyvinylcinnamate-based, synthetic rubber-based or novolak-based photocurable type or photolysis type is used.

Next, in step S16 of FIG. 73, a plating layer is formed on the portions other than the plating resist layer formed on the portions that are not required to be plated, i.e., the portions that are required to be plated by electroplating.

Further, in step S17 of FIG. 73, the plating resist layer is removed. Through the above steps, the patterns of the inner lead sections 5 and the outer lead sections 6 are formed on both surfaces of the substrate, respectively, and the pattern of the connecting sections 7 are formed on the side wall surface of the through holes 3. Through this process, in order to remove the plating resist layer, there is used an appropriate release agent, such as sodium hydroxide, sodium metasilicate enneahydrate, methylene chloride, glycol ether, a mixed solvent of these substances, or an organic solvent of a mixed liquid of these substances and an alkaline aqueous solution such as sodium hydroxide and potassium hydroxide.

Next, soft etching is performed in step S18 of FIG. 73. This soft etching is performed in order to remove the electroless plating layer formed in step S12A in the exposed portion after the removal of resist. In this stage, the electroplating layer that becomes the inner lead sections, the outer lead sections, and the connecting sections are somewhat reduced in thickness or thinned. As a chemical liquid to be used for soft etching, ferric chloride, cupric chloride, persulfuric acid, ammonium persulfate, sodium hydroxide, similar to the chemicals for general etching are used. The electroless plating is only required to be removed, and therefore, the etching is performed more lightly than the general etching. The portion other than the plating resist formed in the arbitrary pattern is formed into a metal layer by electroplating. Therefore, a thick plating layer can be effectively formed fast, allowing a metal layer of high reliability to be formed as compared with the twelfth embodiment.

Figure 74:
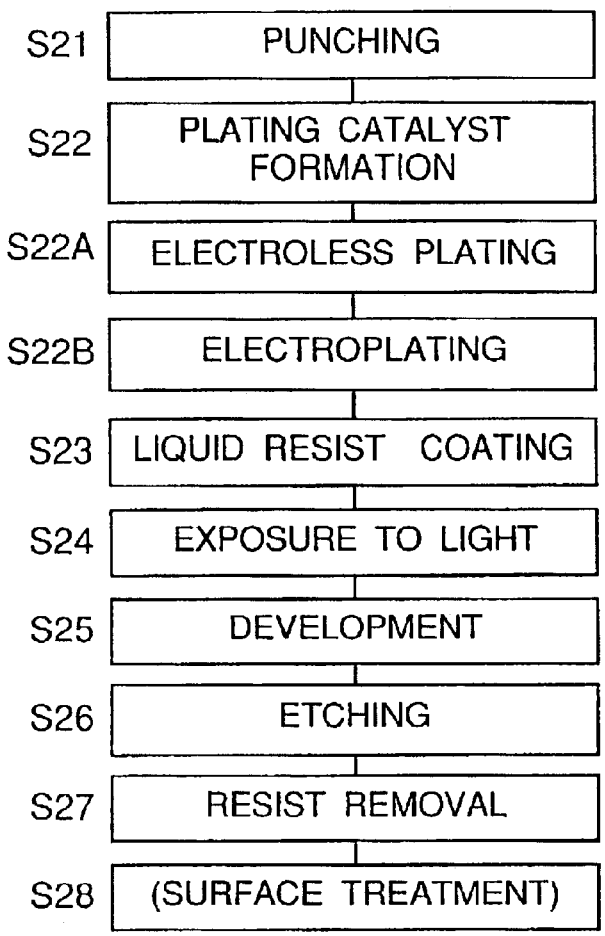
FIG. 74 is a process chart for explaining forming steps of the connecting sections and so on by the substrate sheet fabricating method of the fourteenth embodiment of the present invention for the fabrication of a substrate sheet according to the above embodiment.

A method for fabricating a substrate sheet according to a fourteenth embodiment of the present invention will be further described with reference to FIG. 74.

The substrate sheet fabricating method of this fourteenth embodiment by sequentially performing punching (step S21), plating catalyst formation (step S22), electroless plating (step S22A), electroplating (step S22B), liquid resist coating (step S23), exposure to light (step S24), development (step S25), etching (step S26), resist removal (step S27), and surface treatment (step S28).

The steps S21 through S22A are similar to the steps S11 through S12A of the thirteenth embodiment of FIG. 73.

In the case of electroplating (step S22B), by electroplating both whole surfaces of the insulating substrate and the side wall surfaces of the through holes of the insulating substrate, the side wall surfaces of the through holes of a substrate that has undergone electroless plating or a substrate obtained by sticking a metal foil of copper or the like on both surfaces of an insulating substrate, and both whole surfaces of the substrate that have undergone electroless plating as well as the through holes, the reliability is improved with the increase in thickness of the metal layers on both whole surfaces of the substrate and the side wall surfaces of the through holes. This is normal electroplating.

Through the steps S23 through S24, an etching resist layer is completely formed in the portions where plating is desired to be left, i.e., in the portions corresponding to the inner lead sections, the outer lead sections, and the connecting sections. As the etching resist layer, a general photosensitive anti-etching resist material is used, and the etching resist layer is formed into an arbitrary pattern in the portions where plating is desired to be left by performing coating (step S23), exposure to light (step S24), and development (step S25). The coating may be performed through electrodeposition coating by immersing the substrate in a photosensitive electrodeposition liquid besides the general coating method. As the photosensitive anti-etching resist material, acrylic-based polyvinylcinnamate-based, synthetic rubber-based or novolak-based, photocurable type or photolysis type is used. In the etching process (step S26), the electroless plating layer and the electroplating layer on the portions that are not covered with the etching resist layer are removed. The step S27 is similar to the step S17 of the thirteenth embodiment of FIG. 73. The surface treatment process (step S28) may be eliminated and may properly be performed as the need arises. According to this method, when increasing the thickness of the metal layer for the improvement of reliability, the thickness of the etching resist layer may be thinner than the thickness of the electroplating metal layer. Furthermore, no subsequent soft etching is required, as opposed to the thirteenth embodiment, and therefore, none of the inner lead sections, the outer lead sections, and the connecting sections are reduced in thickness.

Figure 75:
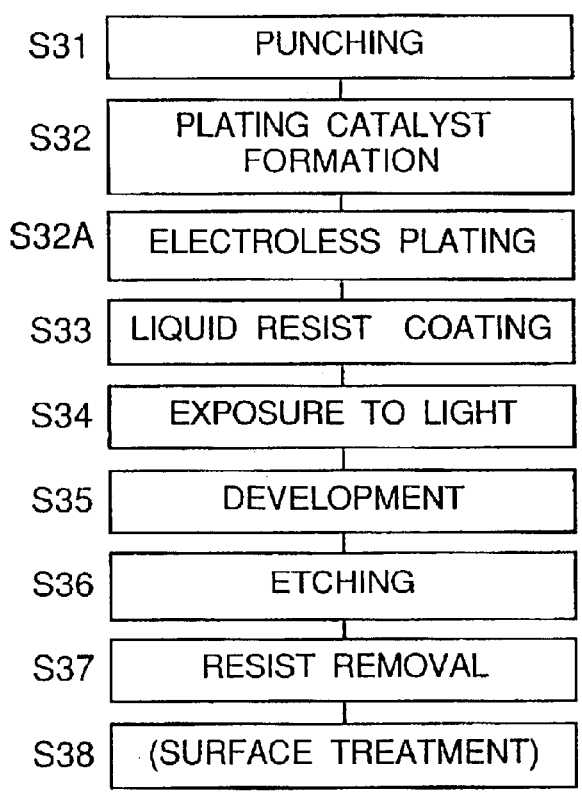
FIG. 75 is a process chart for explaining forming steps of the connecting sections and so on by the substrate sheet fabricating method of the fifteenth embodiment of the present invention for the fabrication of a substrate sheet according to the above embodiment.

A method for fabricating a substrate sheet according to a fifteenth embodiment of the present invention will be further described with reference to FIG. 75.

The method for fabricating the substrate sheet of this fifteenth embodiment is by sequentially performing punching (step S31), plating catalyst formation (step S32), electroless plating (step S32A), liquid resist coating (step S33), exposure to light (step S34), development (step S35), etching (step S36), resist removal (step S37), and surface treatment (step S38).

The steps S31 through S32A are similar to the steps S11 through S12A of the thirteenth embodiment of FIG. 73. Through the steps S33 through S35, an etching resist layer is completely formed in the portions where plating is desired to be left, i.e., in the portions corresponding to the inner lead sections, the outer lead sections, and the connecting sections. As the etching resist layer, a general photosensitive anti-etching resist material is used, and the etching resist layer is formed into an arbitrary pattern on the portions where plating is desired to be left by performing coating (step S33), exposure to light (step S34), and development (step S35). The coating may be performed through electrodeposition coating by immersing the substrate in a photosensitive electrodeposition liquid besides the general coating method. As the photosensitive anti-etching resist material, acrylic-based, polyvinylcinnamate-based, synthetic rubber-based, or novolak-based photocurable type or photolysis type is used. In the etching process (step S36), the electroless plating layer in the portions that are not covered with the etching resist layer is removed. The step S37 is similar to the step S17 of the thirteenth embodiment of FIG. 73. The surface treatment process (step S38) may be eliminated and may properly be performed as the need arises.

Figure 76:
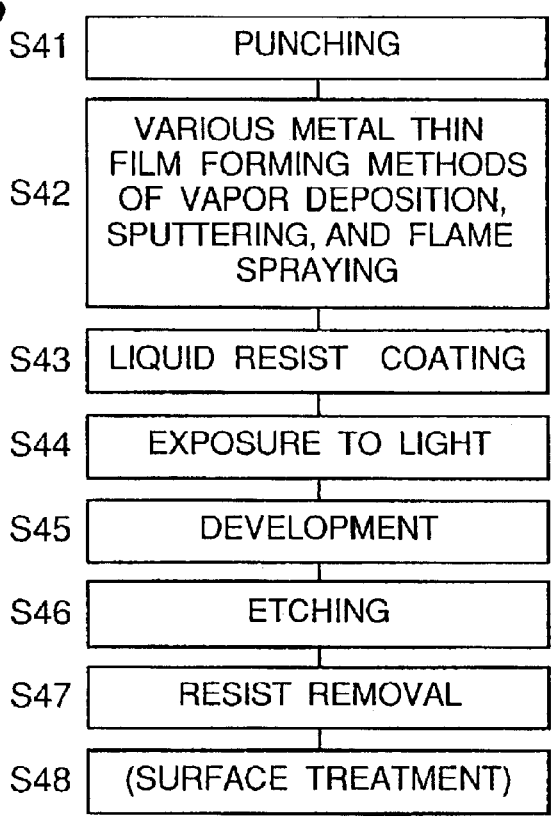
FIG. 76 is a process chart for explaining forming steps of the connecting sections and so on by the substrate sheet fabricating method of the sixteenth embodiment of the present invention for the fabrication of the substrate sheet according to the above embodiment.

A method for fabricating a substrate sheet according to a sixteenth embodiment of the present invention will be further described with reference to FIG. 76.

The substrate sheet fabricating method of this sixteenth embodiment is by sequentially performing punching (step S41), various metal thin layer forming methods such as vapor deposition, sputtering, and flame spraying (step S42), liquid resist coating (step S43), exposure to light (step S44), development (step S45), etching (step S46), resist removal (step S47), and surface treatment (step S48).

The step S41 is similar to the step S11 of the thirteenth embodiment of FIG. 73.

According to the various metal thin layer forming methods such as vapor deposition, sputtering, and flame spraying (step S42), the vapor deposition is performed by putting the insulating substrate in a vacuum vapor deposition device and heating and vaporing the vapor deposition material so as to deposit the same on the insulating substrate for the formation of a metal layer. The sputtering is performed by putting the insulating material in a vacuum sputtering device, applying a beam to a metal target material and then flying the metal target material so as to deposit the same on the insulating substrate for the formation of a metal layer. The flame spraying is to melt a metal material with heat with a burner or the like, and spraying the metal material with air or the like so as to deposit the metal layer on an insulating material.

Through the steps S43 through S45, an etching resist layer is completely formed on the portions where the metal layer is desired to be left, i.e., in the portions corresponding to the inner lead sections, the outer lead sections, and the connecting sections. As the etching resist layer, a general photosensitive anti-etching resist material is used, and the etching resist layer is formed into an arbitrary pattern on the portions where the metal layer is desired to be left by performing liquid resist coating (step S43), exposure to light (step S44), and development (step S45). The coating may be performed through electrodeposition coating by immersing the substrate in a photosensitive electrodeposition liquid besides the general coating method. As the photosensitive anti-etching resist material, acrylic-based, polyvinylcinnamate-based, synthetic rubber-based, or novolak-based photocurable type or photolysis type is used. In the etching process (step S46), the metal layer that is not covered with the etching resist layer is removed. The step S47 is similar to the step S17 of the thirteenth embodiment of FIG. 73. The surface treatment process (step S48) may be eliminated and may properly be performed as the need arises. This method is effective for forming a metal thin film on an insulating material, such as ceramic, to which the electroless plating is hard to adhere or on an insulating material such as a polyester film or a polyimide film that are hard to obtain adhesion strength.

Figure 77:
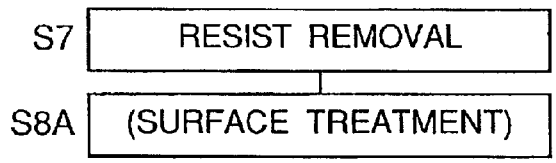
FIG. 77 is a process chart for explaining forming steps of the connecting sections and so on according to a modified example of the twelfth embodiment.

Furthermore, as shown in FIG. 77, a surface treatment process (step S8A) may be performed as the need arises after the resist removal process (step S7) of the twelfth embodiment.

Figure 78:
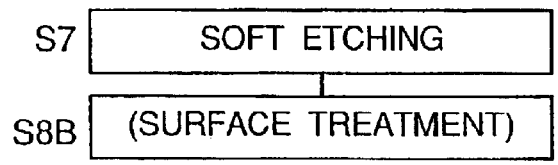
FIG. 78 is a process chart for explaining forming steps of the connecting sections and so on according to a modified example of the thirteenth embodiment.

Furthermore, as shown in FIG. 78, a surface treatment process (step S8B) may be performed as the need arises after the soft etching process (step S18) of the thirteenth embodiment.

The exposure method for forming the connecting sections 7 will be described in detail next with reference to FIG. 60 through FIG. 69. Also, in the following description, the reference numerals used in the first embodiment are used as a representative example in the following description. Therefore, in the following description, the statement of "the side wall surface of the through hole" means the portion such as a substrate sheet edge where connecting sections are formed in the case of a substrate where no through hole exists.

Specifically, four methods will be described herein.

Figure 64:
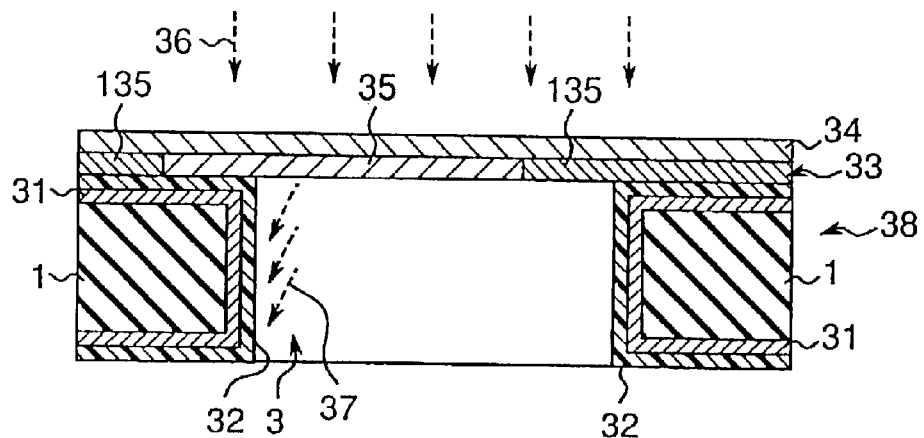
FIG. 64 is a sectional view showing a method for partially exposing to light the above photoresist film.
Figure 65:
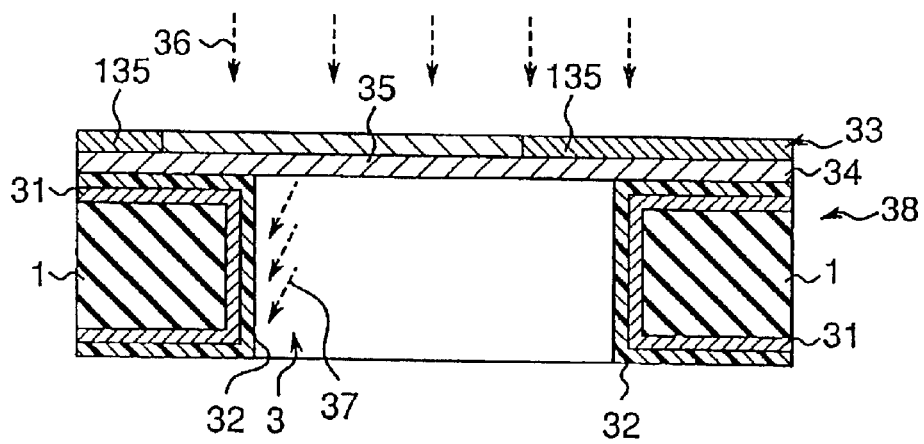
FIG. 65 is a sectional view showing a method for partially exposing to light the above photoresist film.
Figure 66:
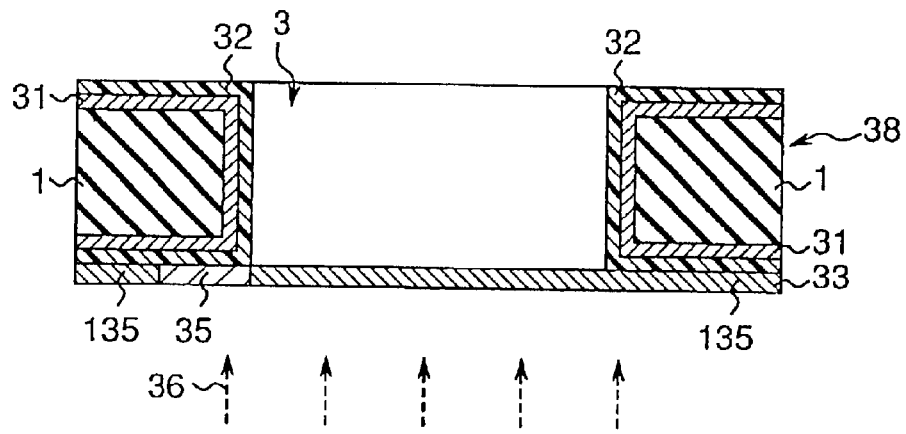
FIG. 66 is a sectional view showing a method for partially exposing to light the above photoresist film.

As shown in FIGS. 64 and 66, the first method is a method for exposing an insulating substrate 38 covered with a photoresist film (this becomes the insulating substrate 1 after the completion) to light surfaces are by one in the order of FIG. 64 and FIG. 66 or in the reverse order, when a light control sheet 34 is used for only one surface of the insulating substrate 38. FIG. 65 shows a modified example in which the positional relation between a mask 33 and the light control sheet 34 may be reverse to the positional relation of FIG. 64, with respect to the insulating substrate 38.

Figure 67:
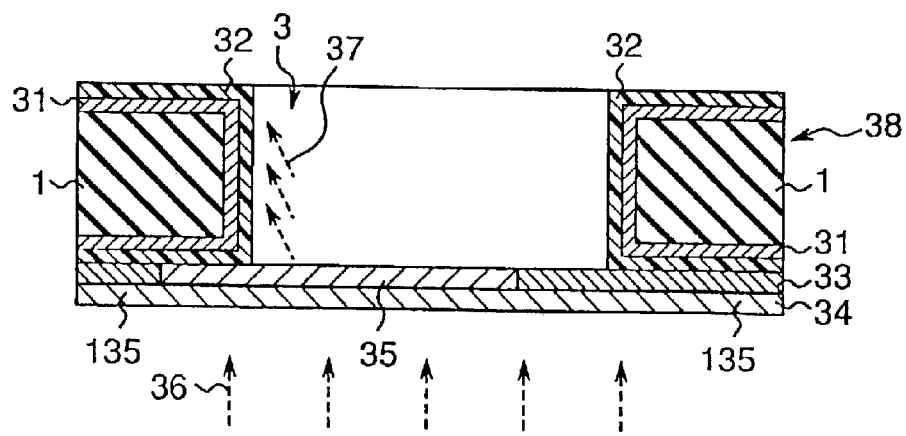
FIG. 67 is a sectional view showing a method for partially exposing to light the above photoresist film.

As shown in FIGS. 64 and 67, the second method is a method for exposing an insulating substrate 38 covered with a photoresist film to light 'surfaces one by one in the order of FIG. 64 and FIG. 67 or in the reverse order, when the light control sheet 34 is used for both surfaces of the insulating substrate 38.

Figure 68:
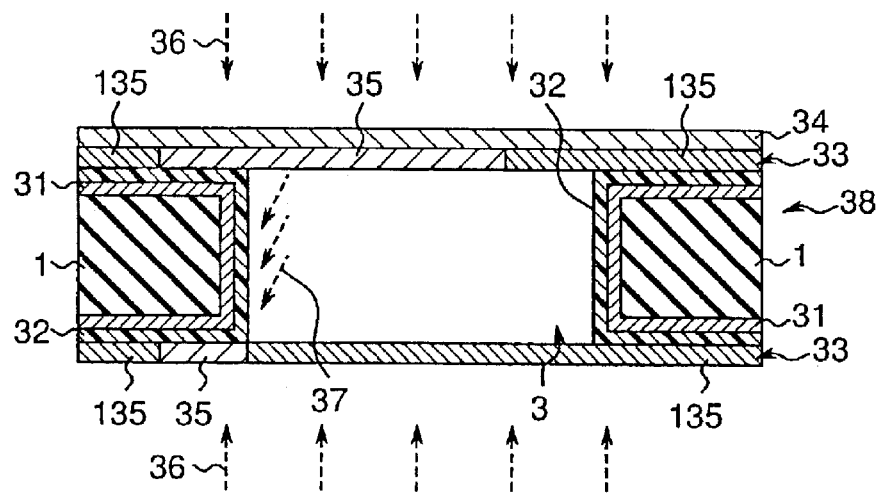
FIG. 68 is a sectional view showing a method for partially exposing to light the above photoresist film.

As shown in FIG. 68, the third method is a method for exposing an insulating substrate 38 covered with a photoresist film to light concurrently, both surfaces of the insulating substrate 38, when the light control sheet 34 is used for only one surface.

Figure 69:
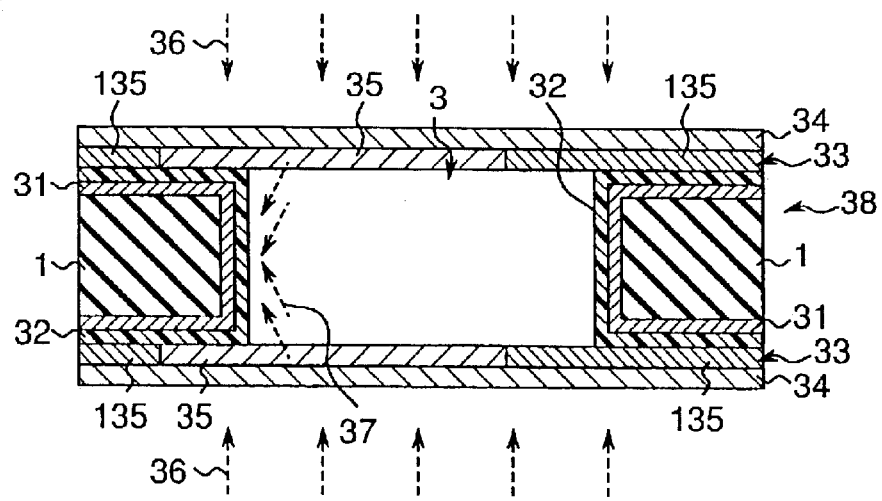
FIG. 69 is a sectional view showing a method for partially exposing to light the above photoresist film.
Figure 70:
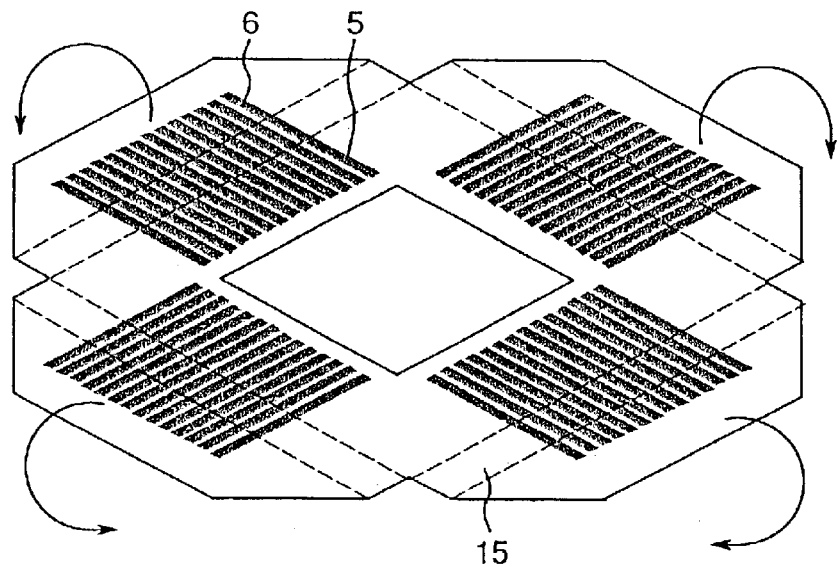
FIG. 70 is a development showing a film to be used for a semiconductor package that has connecting sections for connecting inner lead sections with outer lead sections on a substrate side surface according to a prior art.
Figure 71:
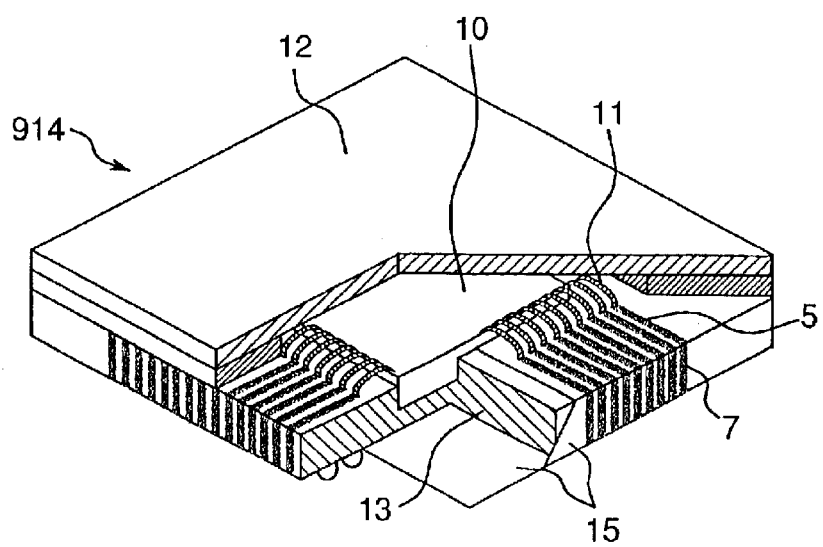
FIG. 71 is a view showing a semiconductor package in which the film of FIG. 70 is put around a substrate.

As shown in FIG. 69, the fourth method is a method for exposing an insulating substrate 38, covered with a photoresist film, to light concurrently, both surfaces of the insulating substrate 38, when the light control sheet 34 is used for both surfaces.

In more detail, according to the aforementioned first method, the photoresist film 32 for forming the etching resist layer and the plating resist layer is exposed to light as follows.

Figure 62:
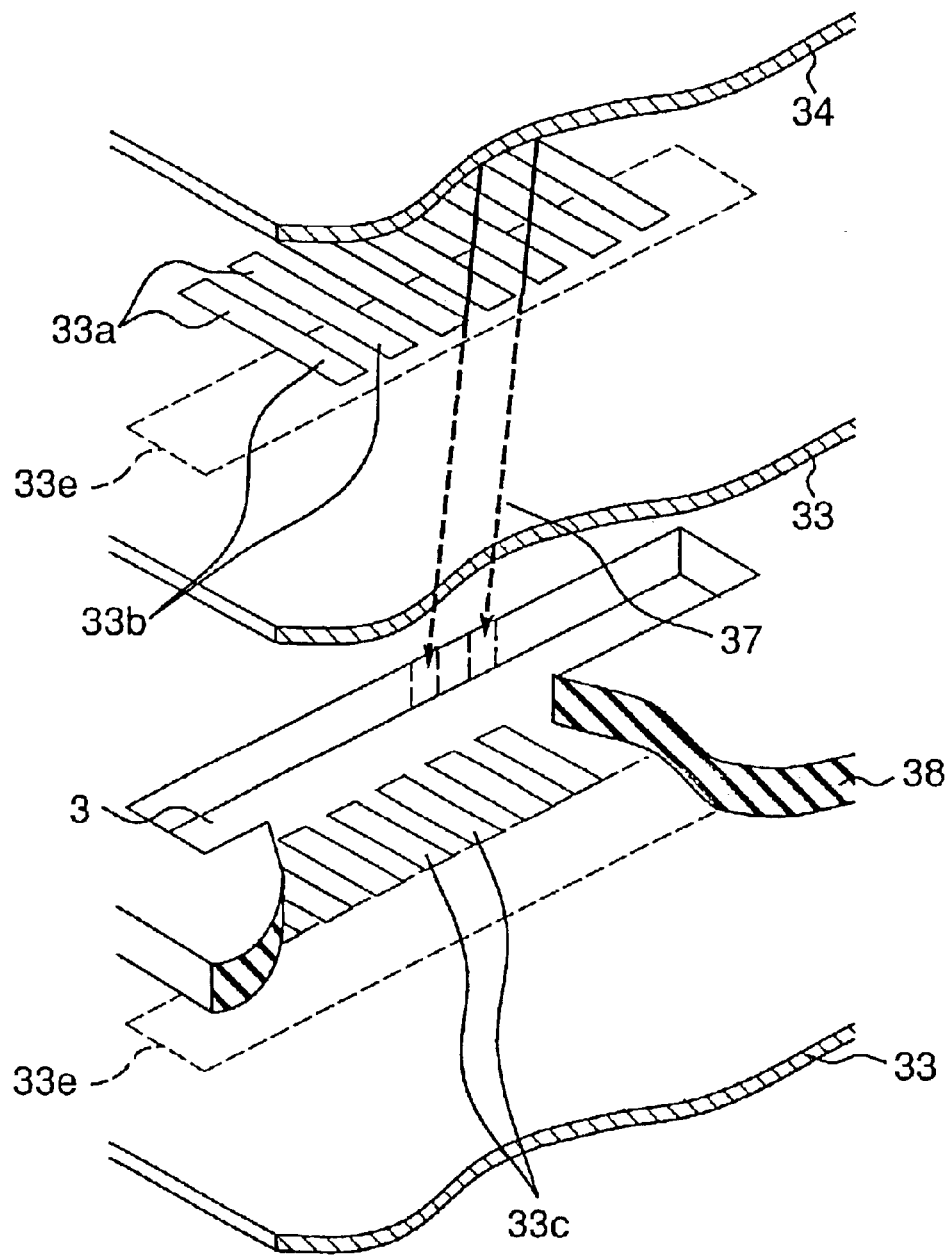
FIG. 62 is an explanatory view showing a method for partially exposing to light the photoresist film of the connecting section located on a side wall surface of the through hole of a semiconductor module substrate sheet according to another modified example of the twelfth through the sixteenth embodiments, described later, of the present invention.

First, the mask 33 and the light control sheet 34 are stacked on one surface of the insulating substrate 38 or, for example, the upper surface of FIG. 62. Thereafter, the photoresist film 32 is exposed to light downward from the upper side through the light control sheet 34 and light transmitting sections 35 of the mask 33 as shown in FIG. 64. This mask 33 and other masks 33 described hereinbelow can be made of glass, an acrylic film sheet, or the like.

Next, another mask 33 is stacked on the other surface of the insulating substrate 38 or, for example, the lower surface of FIG. 62. Thereafter, as shown in FIG. 66, the photoresist film 32 is exposed to light upward from the lower side through the light transmitting sections 35 of the mask 33.

Subsequently, the photoresist film 32 is developed to form an etching resist layer or a plating resist layer having a pattern corresponding to the pattern of the mask 33.

According to the aforementioned first method, when forming an etching resist employing a photocurable type material as the photoresist film 32, as shown in FIG. 62, lead pattern forming-sections 33a formed by patterning in correspondence with the inner lead sections 5 and connection pattern forming-sections 33b that are formed by patterning in correspondence with the connecting sections 7 to be connected to the inner lead sections 5 and connected to the lead pattern forming-sections 33a are formed transparent as the light transmitting sections 35. The other sections are formed opaque as light shield sections with regard to the front surface side mask 33 (the upper side mask 33 in FIG. 62) arranged on the front surface side of the insulating substrate 1 among the two masks 33. Accordingly, the sections corresponding to the lead pattern forming-sections 33a and the connection pattern forming-sections 33b are the light transmitting sections 35 that transmit light. Therefore, the sections corresponding to the lead pattern forming-sections 33a and the connection pattern forming-sections 33b of the photoresist film 32 are cured as a consequence of exposure to the transmitted light, while the other sections are not cured as a consequence of no exposure to the transmitted light. On the other hand, with regard to the rear surface side mask 33 (the lower side mask 33 in FIG. 62) arranged on the rear surface side of the insulating substrate 1, only lead pattern forming-sections 33c formed by patterning in correspondence with the outer lead sections 6 are formed transparent as the light transmitting sections 35. The other sections are formed opaque as light shielding sections. Accordingly, the sections corresponding to the lead pattern forming-sections 33c are the light transmitting sections 35 that transmit light. Therefore, the sections that belong to the photoresist film 32 and correspond to the lead pattern forming-sections 33c and the connection pattern forming-sections 33d of the photoresist film 32 are cured as a consequence of exposure to light, while the other sections are not cured as a consequence of no exposure to light. As a result, in the development process subsequent to the exposure to light, the sections that have not been cured are removed by a developing liquid, while the cured sections are not removed by a developing liquid but left, consequently forming an etching resist layer in the sections corresponding to the inner lead sections 5, the connecting sections 7, and the outer lead sections 6. It is to be noted that a rectangle 33e indicated by the dotted lines on each mask 33 in FIG. 62 indicates the position of stack on the through hole 3. As described in detail later, the light control sheet 34 is to diffuse or refract an incident light, thereafter emit the light from the side opposite from the incident side and then apply the light to the photoresist film 32 located on the side wall surface on which the connecting sections 7 of the through holes 3 are desired to be formed.

Figure 63:
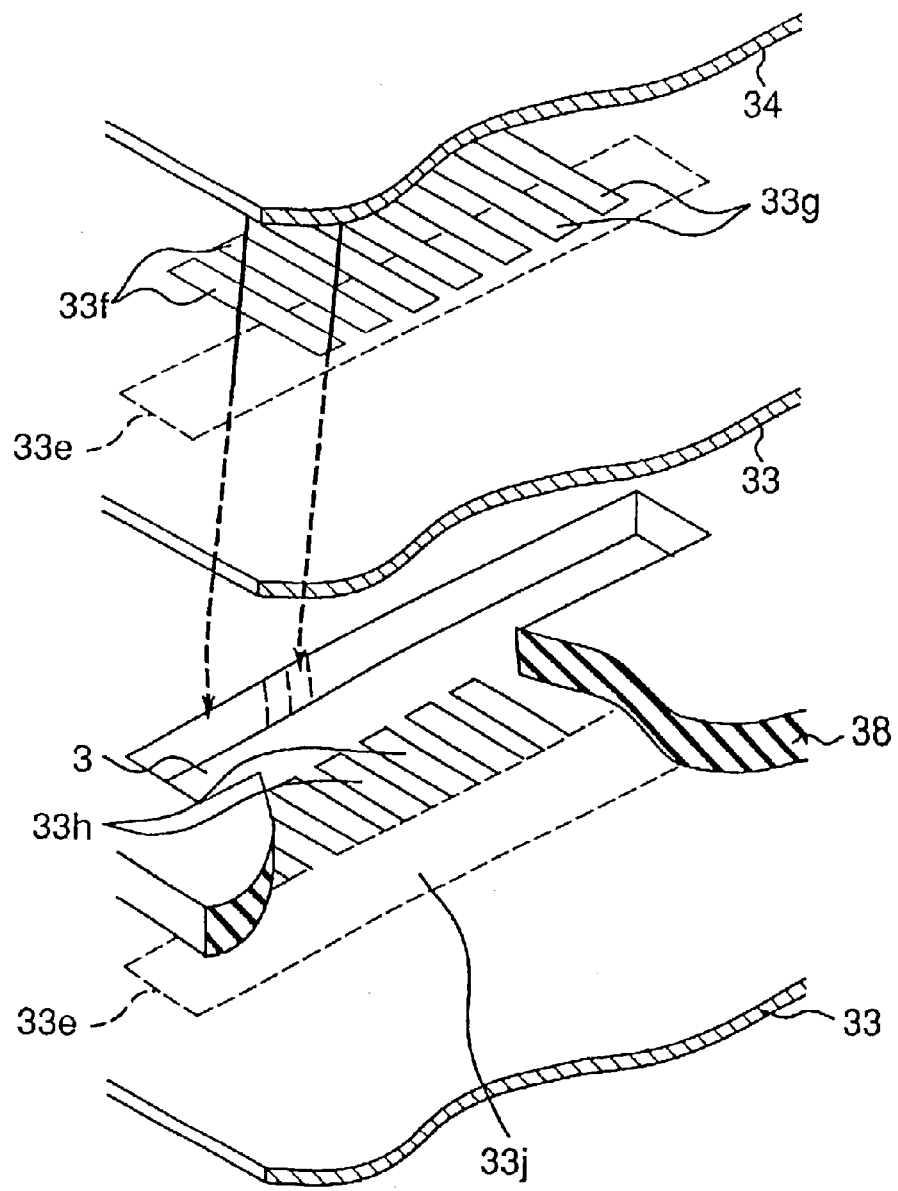
FIG. 63 is an explanatory view showing a method for partially exposing to light the photoresist film of the connecting section located on a side wall surface of the through hole of a semiconductor module substrate sheet according to another modified example of the twelfth through the sixteenth embodiments, described later, of the present invention.

According to the aforementioned first method, when forming an etching resist employing a photolysis type material as the photoresist film 32, as shown in FIG. 63, lead pattern shielding-sections 33f formed by patterning in correspondence with the inner lead sections 5 and connection pattern shielding-sections 33g that are formed by patterning in correspondence with the connecting sections 7 to be connected to the inner lead sections 5 and connected to the lead pattern shielding-sections 33f are formed opaque as the light shielding-sections 135. The other sections are formed transparent as light transmitting sections 35 with regard to the front surface side mask 33 (the upper side mask 33 in FIG. 63) arranged on the front surface side of the insulating substrate 1 among the two masks 33. Accordingly, the sections corresponding to the lead pattern shielding-sections 33f and the connection pattern shielding-sections 33g are the light shielding-sections 135 that transmit no light. Therefore, the sections corresponding to the lead pattern shielding-sections 33f and the connection pattern shielding-sections 33g of the photoresist film 32 do not undergo photolysis as a consequence of no exposure to the transmitted light, while the other sections undergo photolysis as a consequence of exposure to the transmitted light. On the other hand, with regard to the rear surface side mask 33 (the lower side mask 33 in FIG. 63) arranged on the rear surface side of the insulating substrate 1, lead pattern shielding-sections 33h formed by patterning in correspondence with the outer lead sections 6 and the sections 33e to be superposed on the through holes 3 are formed opaque as the light shielding-sections 135. The other sections are formed transparent as the light transmitting sections 35. Accordingly, the sections corresponding to the lead pattern shielding-sections 33h and the sections 33e to be superposed are the light shielding-sections 135 that transmit no light. Therefore, the sections that belong to the photoresist film 32 and correspond to the lead pattern shielding-sections 33h do not undergo photolysis as a consequence of no exposure to light. The sections corresponding to the connection pattern shielding-sections 33g do not undergo photolysis as a consequence of no exposure to light of the side wall surfaces of the through hole of the photoresist film 32. The other sections undergo photolysis as a consequence of exposure to the transmitted light. As a result, in the development process subsequent to the exposure to light, the sections that have undergone photolysis are removed by a developing liquid, while the sections that have not undergone photolysis are not removed by the developing liquid but left, consequently forming an etching resist layer in the sections corresponding to the inner lead sections 5, the connecting sections 7, and the outer lead sections 6. It is to be noted that a rectangle 33e indicated by the dotted lines on each mask 33 in FIG. 63 indicates the position of a stack on the through hole 3.

Next, the aforementioned second method is the same as the aforementioned first method except that, the light control sheet 34 is also stacked, as shown in FIG. 67, when another mask 33 is stacked on the other surface of the insulating substrate 38. The photoresist film 32 is exposed to light upward from the lower side through the light control sheet 34 and through the light transmitting sections 35 of the mask 33 and that the mask pattern located on the lower side is different (see FIGS. 60 and 61).

When the photoresist film 32 is the photocurable type, lead pattern forming-sections 33c formed by patterning in correspondence with the outer lead sections 6 and connection pattern forming-sections 33d that are formed by patterning in correspondence with the connecting sections 7 to be connected to the outer lead sections 6 and connected to the lead pattern forming-sections 33c are formed transparent as the light transmitting sections 35. The other sections are formed as light shielding-sections with regard to the rear surface side mask 33 (the lower side mask 33 in FIG. 60) arranged on the rear surface side of the insulating substrate 1. Accordingly, the sections corresponding to the lead pattern forming-sections 33c and the connection pattern forming-sections 33d are the light transmitting sections 35 that transmit light. Therefore, the sections corresponding to the lead pattern forming-sections 33c and the connection pattern forming-sections 33d of the photoresist film 32 are cured as a consequence of exposure to light, while the other sections are not cured as a consequence of no exposure to light. When the photoresist film 32 is the photolysis type, lead pattern forming-sections 33c formed by patterning in correspondence with the outer lead sections 6 and connection pattern forming-sections 33d that are formed by patterning in-correspondence with the connecting sections 7 to be connected to the outer lead sections 6 and connected to the lead pattern forming-sections 33c are formed opaque as the light shielding-sections 135. The other sections are formed transparent as light transmitting sections with regard to the rear surface side mask 33 (the lower side mask 33 in FIG. 61) arranged on the rear surface side of the insulating substrate 1. Accordingly, the sections corresponding to the lead pattern forming-sections 33c and the connection pattern forming-sections 33d are the light shielding-sections that transmit no light. Therefore, the sections other than the sections corresponding to the lead pattern forming-sections 33c and the connection pattern forming-sections 33d of the photoresist film 32 undergo photolysis as a consequence of exposure to light, while the sections corresponding to the lead pattern forming-sections 33c and the connection pattern forming-sections 33d do not undergo photolysis as a consequence of no exposure to light.

Next, as shown in FIG. 68, the aforementioned third method is to simultaneously perform the process of FIG. 64 and the process of FIG. 66 of the first embodiment. As shown in FIG. 69, the aforementioned fourth method is to simultaneously perform the process of FIG. 64 and the process of FIG. 67 of the second method.

In FIG. 60 through FIG. 63 of the first through fourth methods, the insulating substrate 38 covered with the photoresist film 32 is shown. However, when forming an etching resist layer, a metal layer exists between the photoresist film 32 and the insulating substrate 38 as a natural consequence. When forming the plating resist layer according to the first through fourth methods, the mask is set in a replacing manner so that a resist layer is formed through the exposure process and the development process in the sections other than the inner lead sections 5, the connecting sections 7, and the outer lead sections 6.

According to the first through fourth methods, the light control sheet 34 changes a parallel light 36 from a light source into diffused light or refracted light 37 and performs control so as to direct part of the light toward the side wall surfaces of the through holes 3 (see FIG. 64). As the light control sheet 34, there can be employed a sheet whose surface is provided with minute undulations as of, for example, a diffuser sheet or internally provided with minute particles or bubbles or a sheet whose surface is provided with prismatic projections as of a prism sheet. In the absence of the light control sheet 34, light transmitted through the light transmitting sections 35 of the mask 33 is scarcely applied to the side wall surfaces of the through holes 3, failing to form a patterned etching resist layer or plating resist layer on the side wall surfaces of the through holes 3. That is, by performing exposure to light with the light control sheet 34 and the mask 33, an etching resist layer or a plating resist layer can be concurrently formed on the front surface or the rear surface or both the front and rear surfaces of the substrate 38 and the side wall surfaces of the through holes 3, allowing the steps to be reduced in number.

The case where the prism sheet is employed as the light control sheet 34 and the case where the diffuser sheet is employed are herein compared with each other for examination. In the case of the prism sheet (bidirectional refraction sheet), the quantity of light directed in two directions becomes greater than that of the diffuser sheet due to its shape. Conversely speaking, in the case of the diffuser sheet, light is also directed toward the directions besides the two directions. Therefore, the quantity of light directed in the two directions becomes smaller than that of the prism sheet, resulting in weaker exposure to light. Accordingly, a relatively sharp image can be formed with the prism sheet by comparison with the diffuser sheet, if it is used to try to form the connecting sections on an end surface in the direction in which light travels, i.e., the side wall surfaces of the through holes 3 of the substrate sheet or the side wall surfaces at the edge portions of the substrate sheet, which is advantageous.

With regard to the order of stacking the mask 33 and the light control sheet 34, the light control sheet 34 may be underlaid (see FIG. 65). The light to be used for the exposure is provided by sunlight or a light source of a mercury lamp, a xenon lamp, an arc lamp, argon laser, or the like. The exposure to light of one surface of the substrate 38 and the exposure to light of the other surface may be carried out concurrently or sequentially one surface by one surface. FIG. 64 and FIG. 65 show examples in which an etching resist layer is formed. In the case of the plating resist layer, the metal layer 31 is eliminated.

When the photoresist film 32 is the photocurable type, the aforementioned development process is performed by using sodium carbonate or the like, as the developing liquid, and selectively removing the uncured sections of the photoresist film 32. When the photoresist film 32 is the photolysis type, the development process is performed by using sodium metasilicate enneahydrate or the like, as the developing liquid, and selectively removing the portions that belong to the photoresist film 32 and have undergone photolysis.

As a method for forming a pattern of the connecting sections 7 toward the inside of the through holes 3, the method of using the etching resist layer or the plating resist layer is most preferable. However, the metal layer 31 can be scraped off physically by laser or the like.

The inner lead sections 5 or the outer lead sections 6 may be partially treated through an insulating process with a solder resist. As a material for the solder resist, there is epoxy resin, varnish, enamel, or the like. As a method for forming the solder resist, there is screen printing, roll coater, curtain coater, spray, electrostatic coating, or the like.

The inner lead sections 5 or the outer lead sections 6 may be partially or entirely subjected to surface treatment. For the surface treatment, there is solder leveler, gold plating, solder plating, nickel plating, silver plating, palladium plating, or the like. A plurality of surface treatment layers may be appropriately combined with one another to be formed through the surface treatment or a single surface treatment layer may be provided. As an exception, the gold plating layer is not singly sufficient, and the gold plating layer is normally laminated on a nickel plating layer. The plating layer of surface treatment is provided by only electroless plating in the case of a type whose leads are led to the inside of the through holes 3. However, in the case of a type whose leads are led to the outside of the through holes 3, electroplating may be performed, besides the electroless plating, if the leads 200 for surface treatment are provided on the substrate sheet 8m, as shown in FIG. 59. It is to be noted that the leads 200 are required so as not to be left on the semiconductor module or the semiconductor package by avoiding the leads 200 in separating and cutting each semiconductor package or each substrate.

With regard to the mask 33, the lead pattern forming-sections 33a are formed by patterning in correspondence with the inner lead sections 5, while the connection pattern forming-sections 33b are formed by patterning in correspondence with the connecting sections 7 to be connected to the inner lead sections 5 and connected to the lead pattern forming-sections 33a. The lead pattern forming-sections 33c are formed by patterning in correspondence with the outer lead sections 6, while the connection pattern forming-sections 33d are formed by patterning in correspondence with the connecting sections 7 to be connected to the outer lead sections 6 and connected to the lead pattern forming-sections 33c. However, the present invention is not limited to this. That is, by reversing the positional relation of the two masks 33 with respect to the substrate 38, it is acceptable to form by patterning the lead pattern forming-sections 33a in correspondence with the outer lead sections 6, form by patterning the connection pattern forming-sections 33b in correspondence with the connecting sections 7 to be connected with the outer lead sections for connection of the connection pattern forming-sections 33b to the lead pattern forming-sections 33a, form by patterning the lead pattern forming-sections 33c in correspondence with the inner lead sections 5, and form by patterning the connection pattern forming-sections 33d in correspondence with the connecting sections 7 to be connected to the inner lead sections 5 for connection of the connection pattern forming-sections 33d to the lead pattern forming-sections 33c.

Likewise, the lead pattern shielding-sections 33f are formed by patterning in correspondence with the inner lead sections 5, while the connection pattern shielding-sections 33g are formed by patterning in correspondence with the connecting sections 7 to be connected to the inner lead sections 5 and connected to the lead pattern shielding-sections 33f. The lead pattern shielding-sections 33h are formed by patterning in correspondence with the outer lead sections .6. However, the present invention is not limited to this. That is, by reversing the positional relation of the two masks 33 with respect to the substrate 38, it is acceptable to form by patterning the lead pattern shielding-sections 33f in correspondence with the outer lead sections 6, form by patterning the connection pattern shielding-sections 33g in correspondence with the connecting sections 7 to be connected to the outer lead sections 6 for connection of the connection pattern shielding-sections 33g to the lead pattern shielding-sections 33f, and form by patterning the lead pattern shielding-sections 33h in correspondence with the inner lead sections 5. Except for the case where the scrapping-off is performed physically means such as with a laser, these methods, through exposure to light can expose the inner lead sections, the connecting sections, and the outer lead sections through a continuous process or concurrently, allowing the inner lead sections, the connecting sections and the outer lead sections to be subjected to the formation of etching resist or plating resist through one development process. Therefore, the inner lead sections, the connecting sections, and the outer lead sections can be concurrently effectively formed at low cost by etching or plating.

More concrete working examples based on the aforementioned embodiments will be described below.

WORKING EXAMPLE 1

A BT resin double-sided substrate CCLHL-800 (having a thickness of 0.3 mm and a copper foil of 18 μm on both sides) having a size of 340 mm×510 mm, produced by MITSUBISHI GAS CHEMICAL CO., INC. is prepared, and rectangular through holes of 1 mm wide×26.3 mm long are formed by punching on respective four sides of 2104 28-mm square semiconductor chip placement regions of this substrate, except for the connecting portions at four corners.

Next, a square recess is formed so that a semiconductor chip could be mounted at the center of each semiconductor chip placement region 2 of a surface on which the inner lead sections are formed. Each recess is processed with a drill so that the depth of the recess becomes 0.2 mm, not larger than the thickness of the semiconductor chip and the external shape of the recess becomes 11 mm, slightly greater than the external shape of the semiconductor chip.

Next, a 8-μm thick copper plating is provided on the entire surface, including the recesses, by electroless plating and electroplating. Then a photocurable type photoresist film is formed-on the front surface, the side wall surfaces of the through holes, and the rear surface of the substrate. Thereafter, by patterning through exposure to light and development, and etching for the removal of the copper plating layer and the copper foil in the portions that are not covered with the photoresist pattern, the following sections are formed. That is, a number of inner lead sections directed from the through holes toward the center region of each semiconductor chip placement region 2 are formed in pattern on one surface of the insulating substrate. On the other surface of the insulating substrate, a number of outer lead sections directed from the through holes toward the center region of each semiconductor chip placement region 2 are formed in a pattern. On the side wall surfaces of the through holes, a number of connecting sections are formed in a pattern between the inner lead sections and the outer lead sections provided on both surfaces of the insulating substrate. The wiring pitch is set to 0.23 mm at the end portions of the inner lead sections and set to 0.5 mm at the end portions of the outer lead sections. The exposure of the photoresist film is performed by superposing, on one surface of the substrate, a mask whose lead pattern forming-sections and divided-connection pattern forming-sections transmit light and a light control sheet for diffusing or refracting incident light and then emitting the light from the opposite side and superposing on the other surface of the substrate, another mask whose lead pattern forming-sections and connection pattern forming-sections transmit light and a light control sheet.

Next, Ni/Au plating is performed on the conductor surface for surface treatment, obtaining a semiconductor module substrate sheet.

With the semiconductor module substrate sheet as described above, a semiconductor chip having 200 electrode terminals is mounted at the center of each semiconductor chip placement region 2 of the surface on which the inner lead sections are formed, and the respective electrode terminals of the semiconductor chip and the respective inner lead sections are electrically connected together by gold wire bonding.

Next, by placing the semiconductor module substrate sheet inside a die for injection molding and injecting epoxy resin, the semiconductor chip and at least the through hole side of the inner lead sections are encapsulated.

Finally, by cutting the connecting portions between the through holes of the semiconductor module substrate sheet with a press, 104 monolithic IC's are obtained.

WORKING EXAMPLE 2

A BT resin double-sided substrate CCLHL-830 (having a thickness of 0.1 mm and a copper foil of 18 μm on both sides) having a size of 340 mm×255 mm, produced by MITSUBISHI GAS CHEMICAL CO., INC. is prepared. An array in which eight semiconductor chip placement regions, each having a size of 2.4 mm long×3 mm wide, are arranged at a pitch of 3 mm in the lateral direction and 41 semiconductor chip placement regions are arranged at a pitch of 2.4 mm in the longitudinal direction is used as one set. Six sets in the lateral direction by 3 sets in the longitudinal direction of the semiconductor chip placement regions are arranged, and through holes of 0.9 mm wide×25 mm long are provided by punching on the sides in the lateral direction of the semiconductor chip placement region owned by each set (note that each through hole has a length 0.5 mm longer than that of the semiconductor chip placement region at both ends). In other words, through holes are provided on respective opposite two sides of 5904 semiconductor chip placement regions of this substrate.

Next, a 18-μm thick copper plating is provided on the entire surface by electroless plating and electroplating. Then a photolysis type photoresist film on the front surface, the side wall surfaces of the through holes, and the rear surface of the substrate is formed. Thereafter, by patterning through exposure to light and development, and etching for the removal of the copper plating layer and the copper foil in the portions that are not covered with the photoresist pattern, the following sections are formed. That is, a number of inner lead sections directed from the through holes toward the center region of each semiconductor chip placement region 2 are formed in pattern on one surface of the insulating substrate. On the other surface of the insulating substrate, a number of outer lead sections directed from the through holes toward the center region of each semiconductor chip placement region 2 are formed in pattern. On the side wall surfaces of the through holes, a number of connecting portions are formed in a pattern between the inner lead sections and the outer lead sections provided on both surfaces of the insulating substrate. The wiring pitch is set to 0.23 mm at the end portions of the inner lead sections and set to 0.5 mm at the end portions of the outer lead sections. The exposure of the photoresist film is performed by superposing on one surface of the substrate, a mask whose lead pattern shielding-sections and connection pattern shielding-sections obstruct light and a light control sheet for diffusing or refracting incident light and then emitting the light from the opposite side and superposing on the other surface of the substrate another mask whose lead pattern shielding-sections and connection pattern shielding-sections obstruct light and a light control sheet.

Next, Ni/Au plating is performed on the conductor surface for surface treatment. Thereafter, nine semiconductor module substrate sheets, each of which includes two sets in the lateral direction and each of which has a size of 103 mm long×65 mm wide, are obtained by cutting with a press.

With the use of the respective semiconductor module substrate sheets as described above, a semiconductor chip having eight electrode terminals is mounted at the center of each semiconductor chip placement region 2 of the surface on which the inner lead sections are formed. The respective electrode terminals of the semiconductor chip and the respective inner lead sections are electrically connected together by gold wire bonding.

Next, by placing the semiconductor module substrate sheet inside a die for injection molding and injecting epoxy resin, the semiconductor chip and at least the through hole side of the inner lead sections are encapsulated.

Finally, by cutting the semiconductor module substrate sheet outside each semiconductor chip placement region 2 and roughly parallel to the remaining sides of each semiconductor chip placement region 2 by means of a dicer, 656 monolithic IC's are obtained from one semiconductor module substrate sheet. Concrete working examples of the connecting section forming process are thus, provided.

WORKING EXAMPLE 3

As a substrate material, a 0.1-mm thick plate made of glass cloth-incorporated BT (bismaleimide-triazine) resin produced by MITSUBISHI GAS CHEMICAL CO., INC. laminated with a 0.018-mm thick Cu foil on both surfaces thereof is used. As a metal layer, an 18-μm thick Cu layer is formed by electroless plating and electroplating. As a resist, a positive type electrodeposition etching resist (photolysis type) produced by NIPPON PAINT CO., LTD is coated. The thickness is 0.007 mm to 0.008 mm. Exposure is performed at 600 mJ/cm$^2$ with a high-pressure mercury lamp. Development is carried out at 32° C. with 1% sodium metasilicate enneahydrate aqueous solution being sprayed. This is carried out for about 60 seconds. Etching is carried out at 50° C. with 45-Baume ferric chloride aqueous solution being sprayed. This is carried out for about four minutes. Resist removal is carried out by immersion in a 3–5% caustic soda aqueous solution at normal temperature for about five minutes. Through these processes, the connecting sections 7 are formed.

Figure 82:
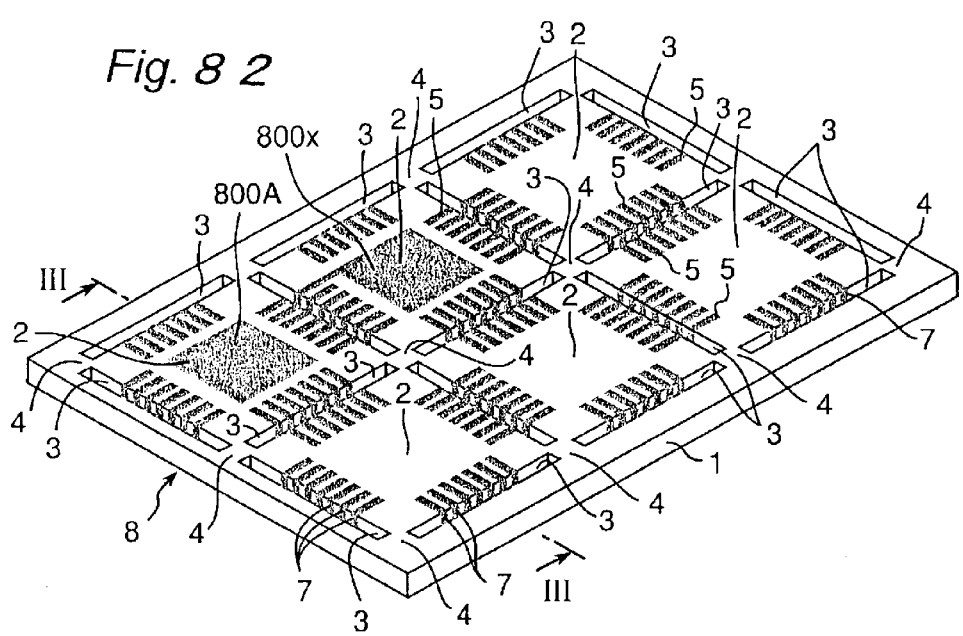
FIG. 82 is a perspective view showing the front surface of a semiconductor module substrate sheet that corresponds to FIG. 1 and is related to a modification example of the above embodiment of the present invention.
Figure 83:
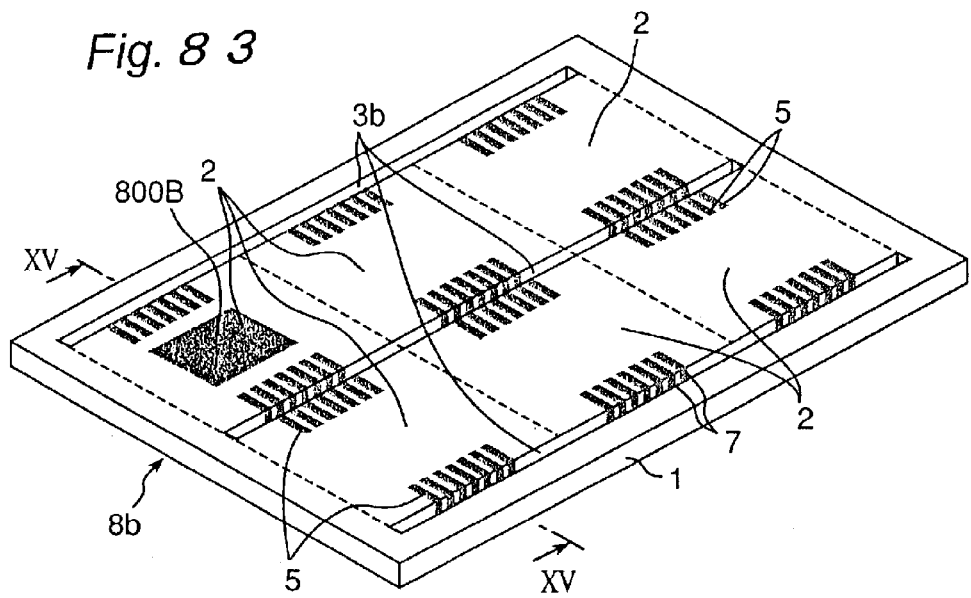
FIG. 83 is a perspective view showing the front surface of a semiconductor module substrate sheet that corresponds to FIG. 14 and is related to a modified example of the above embodiment of the present invention.
Figure 84:
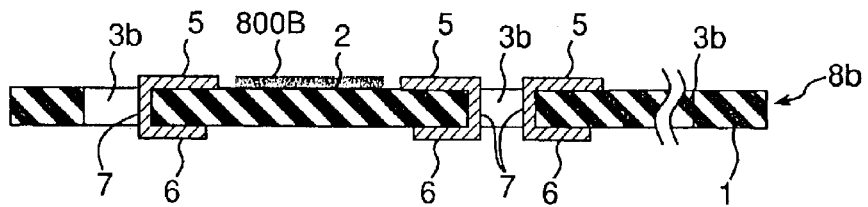
FIG. 84 is a sectional view taken along the line XV—XV of FIG. 84.

As modified examples of the above embodiments, the semiconductor chip placement region 2 may be provided with metal conductor sections 800A, 800B, 800C, or 800D) having a size equal to or greater than the size of the semiconductor chip, as shown in FIG. 82 corresponding to FIG. 1, FIG. 83 corresponding to FIGS. 14 and 15, and FIGS. 84 and 85 corresponding to FIG. 15, respectively.

As described above, if the semiconductor chip placement region is provided with the metal conductor sections, then there are the following effects.

(1) When sticking the semiconductor chip to the semiconductor chip placement region, in particular, with a metal adhesive or diffused joint, the adhesion of the metal conductor section to the semiconductor chip is effective in terms of strength.

(2) Since the metal conductor section is in the metal layer, heat conduction from the semiconductor chip is good. In particular, if the metal conductor section is larger than the semiconductor chip, then this is effective for heat dissipation. More effective heat dissipation can be achieved by connecting a metal cover or a ceramic cover to this metal conductor section.

(3) The inner lead section may be extended to serve as a metal conductor section.

Figure 93:
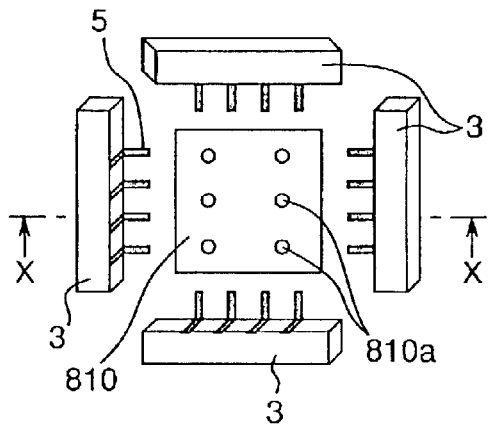
FIG. 93 is an enlarged plan view showing part of the front surface of a semiconductor module substrate sheet according to a modified example of the above embodiment of the present invention.
Figure 94:
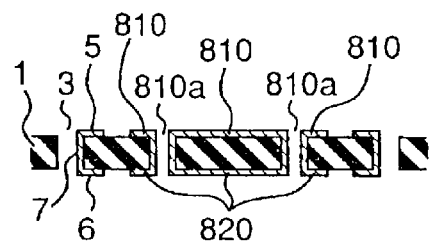
FIG. 94 is a sectional view taken along the line X—X of FIG. 93.

As shown in FIGS. 93 and 94, it is possible to arrange a first metal conductor section 810 having a size equal to or larger than the size of the semiconductor chip in the semiconductor chip placement region 2, provide a second metal conductor section 820 in a region on the rear surface of the insulating substrate 1 opposite to the first metal conductor section 810 on the front surface side of the insulating substrate 1 via the insulating substrate 1, and connect the first metal conductor section 810 with the second metal conductor section 820 by way of metal layers formed on the inner walls of through holes 810a. As described above, if the front and rear metal conductor sections, i.e., the first metal conductor section 810 and the second metal conductor section 820, are connected to each other by way of the through holes 810*a*, then heat from the semiconductor chip can be conducted by way of the through holes, allowing the heat to dissipate from not only the front surface metal conductor section but also the rear surface metal conductor section.

Figure 95:
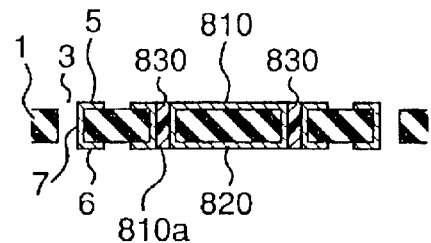
FIG. 95 is a sectional view taken along the line X—X of FIG. 93 according to a modified example of FIG. 93.

As shown in FIG. 95, the hole portions of the through holes 810*a* for connecting the first metal conductor section 810 with the second metal conductor section 820 shown in FIG. 94, can be filled up with resin 830. With this arrangement, in addition to the effect of connecting the front and rear metal conductor sections with each other by way of the through holes, the semiconductor chip can be protected by filling up the through holes with resin.

Figure 96:
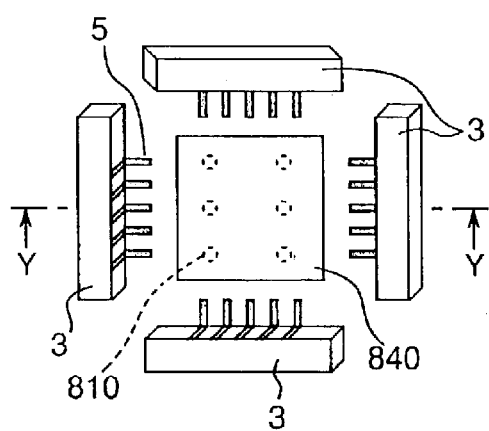
FIG. 96 is an enlarged plan view showing part of the front surface of a semiconductor module substrate sheet according to a modified example of the above embodiment of the present invention.
Figure 97:
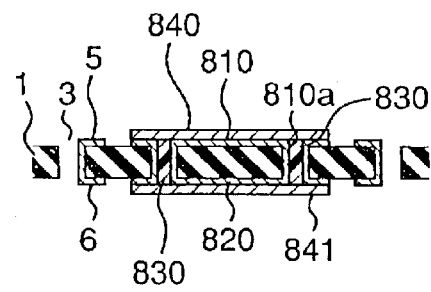
FIG. 97 is a sectional view taken along the line Y—Y of FIG. 96.

As shown in FIGS. 96 and 97, it is also possible to further arrange from above metal layers 840 and 841 on the first metal conductor section 810 and the second metal conductor section 820, respectively, which are connected to each other by way of the through holes 810*a* of FIG. 95 and of which the hole portions are filled up with the resin, covering, with the metal layers, the first metal conductor section 810, the second metal conductor section 820, and the through holes 810*a* filled up with the resin. If the through holes 810*a* for connecting the first metal conductor section 810 with the second metal conductor section 820 are provided so as to be covered with the semiconductor chip by filling up the through holes with resin and further providing the metal layer on the through holes, then the resin buried in the through holes do not withstand the heating temperature when, in particular, the metal adhesive or the like is used for adhesion and cured. Therefore, by covering the resin surface further with the metal layer, the aforementioned issue can be solved.

As indicated by 800*x* in FIG. 82, it is acceptable to extend part of the inner lead sections 5 or part of the outer lead sections 6 to the semiconductor chip placement region 2 and form the metal conductor section in a size capable of mounting the semiconductor chip.

Figure 85:
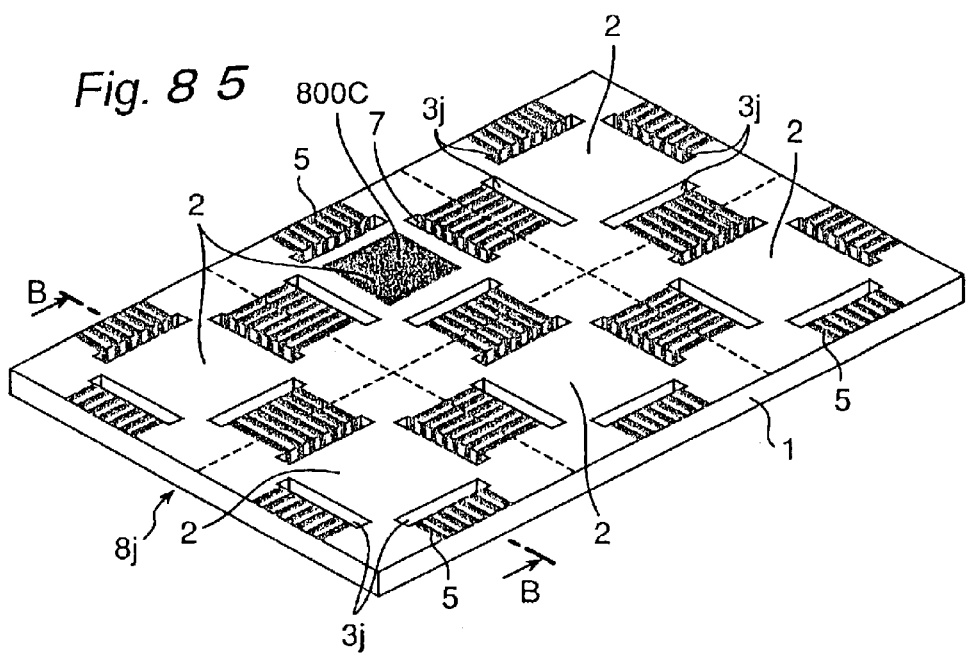
FIG. 85 is a perspective view showing the front surface of a semiconductor module substrate sheet that corresponds to FIG. 35 and is related to a modified example of the above embodiment of the present invention.

As shown in FIG. 85, on a semiconductor substrate sheet which is provided with connecting sections 7 provided on the side wall surface opposite to the semiconductor chip placement region by forming through holes through the insulating substrate 1, with the inner lead sections 5 extended in a direction away from the connecting sections 7, and with the outer lead sections 6 extended from the connecting sections 7 in a direction away from a region corresponding to the rear surface of the semiconductor chip placement region 2, it is acceptable to form the metal conductor section 800C in the semiconductor chip placement region 2.

Figure 86:
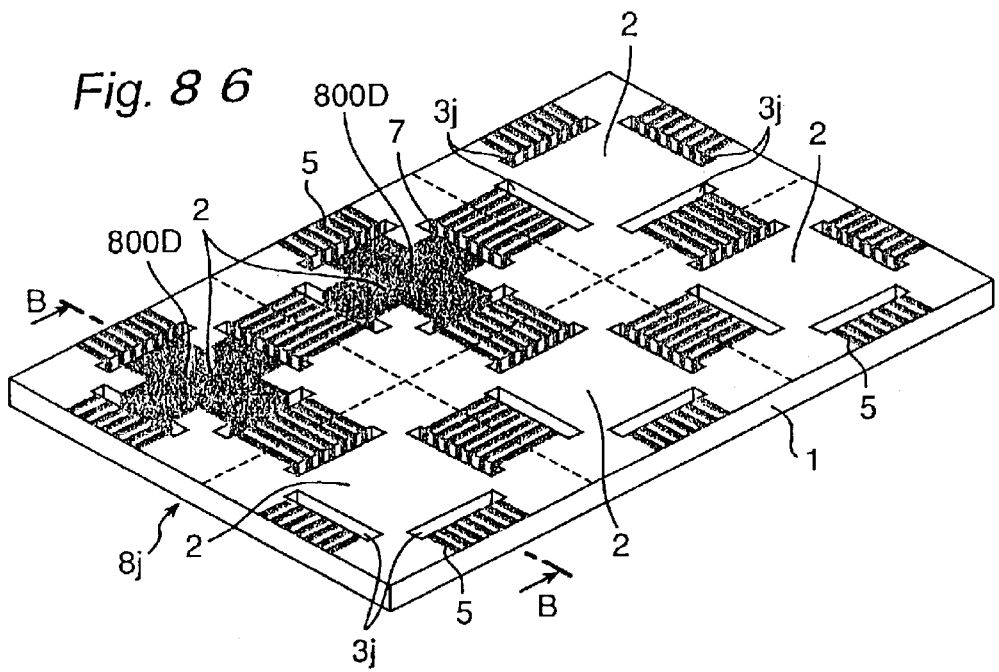
FIG. 86 is a perspective view showing the front surface of a semiconductor module substrate sheet that corresponds to FIG. 35 and is related to a modified example of the above embodiment of the present invention.
Figure 98:
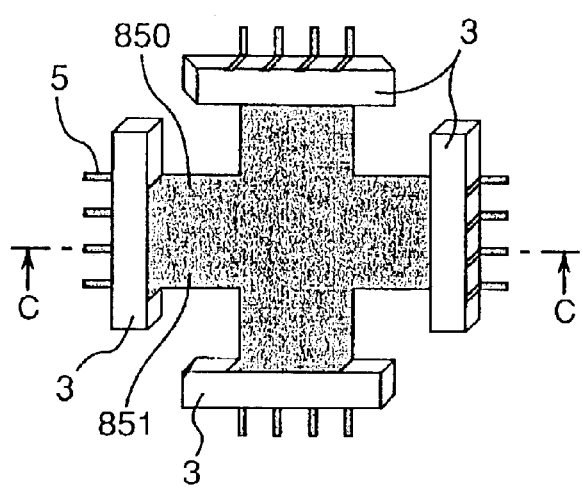
FIG. 98 is an enlarged plan view showing part of the front surface of a semiconductor module substrate sheet according to a modified example of the above embodiment of the present invention.
Figure 99:
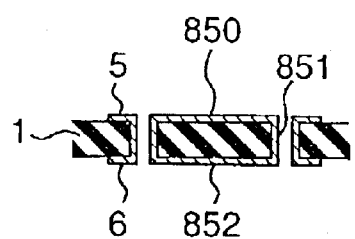
FIG. 99 is a sectional view taken along the line X—X of FIG. 98.

Further, on a semiconductor substrate sheet which is provided with connecting sections 7 provided on the side wall surface opposite to the semiconductor chip placement region by forming through holes through the insulating substrate 1, with the inner lead sections 5 extended in a direction away from the connecting sections 7, and with the outer lead sections 6 extended from the connecting sections 7 in a direction away from a region corresponding to the rear surface of the semiconductor chip placement region 2, as shown in FIGS. 86, 98, and 99, it is performed to provide another connecting section 851 so that the another connecting section 851 does not come in contact with the connecting section on the side wall surface located on the semiconductor chip placement region side of the through holes, provide a metal conductor section 850 (800D in FIG. 86) in the semiconductor chip placement region 2, provide a metal layer section 852 in the region corresponding to the rear surface of the semiconductor chip placement region 2, and connect the metal conductor section 850 located on the front surface of the substrate sheet with the metal layer section 852 located on the rear surface of the substrate sheet by way of the another connecting section 851.

With the above arrangement, by forming the another connecting section 851 on the side wall surface located on the semiconductor placement region side of the through holes and forming the metal conductor section 850 and the rear surface metal layer section 852, heat from the semiconductor chip can be dissipated from the front surface and from the another connecting section 851 and the rear surface metal layer section 852 by heat conduction.

Figure 100:
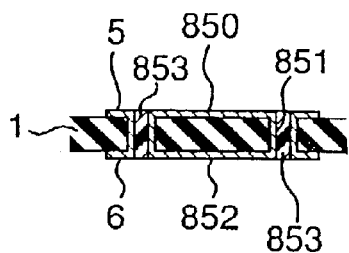
FIG. 100 is a sectional view taken along the line X—X of FIG. 98 according to a modified example of FIG. 98.

Further, in the above construction, as shown in FIG. 100, the through holes can be filled up with resin 853. With this arrangement, by filling the inner lead sections 5, the outer lead sections 6, and the through holes located in the semiconductor chip placement region 2 with resin, the mechanical strength of the substrate sheet, the semiconductor module, and the semiconductor package can be increased.

Furthermore, the shape of the front surface of the metal conductor section arranged on the surface of the substrate sheet side on which the inner lead sections 5 are formed can be made flat. With this arrangement, the inclination of the semiconductor chip due to the flat shape of the front surface of the metal conductor section can be eliminated.

Figure 87:
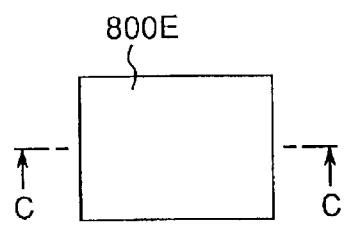
FIG. 87 is a plan view of a metal conductor section that can be used in FIGS. 82–86.
Figure 88:
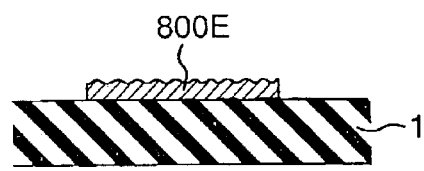
FIG. 88 is a sectional view taken along the line C—C of FIG. 87.
Figure 89:
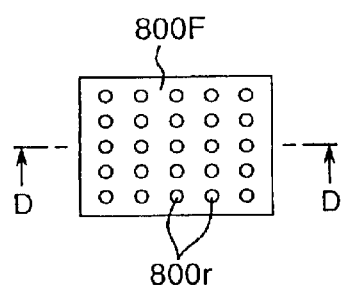
FIG. 89 is a plan view of a metal conductor section that can be used in FIGS. 82 through 86.
Figure 90:
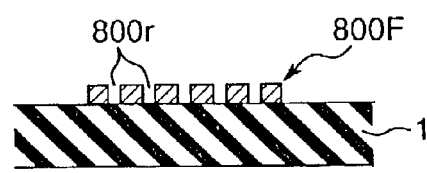
FIG. 90 is a sectional view taken along the line D—D of FIG. 89.
Figure 91:
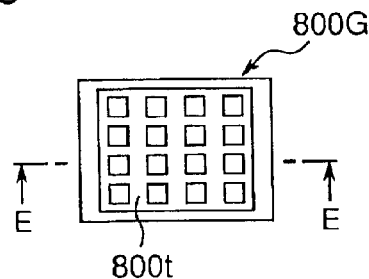
FIG. 91 is a plan view of a metal conductor section that can be used in FIGS. 82 through 86.
Figure 92:
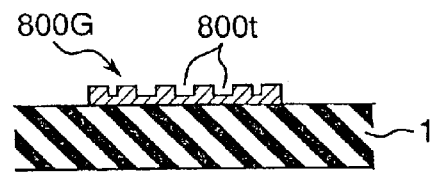
FIG. 92 is a sectional view taken along the line E—E of FIG. 91.

Furthermore, minute undulations, as shown in FIGS. 87 and 88, can be provided on the flat surface of the metal conductor'section (die pad section) 800E arranged on the surface of the substrate sheet side on which the inner lead sections 5 are formed. Patterned recesses 800*r* as shown in FIGS. 89 and 90, can be provided on the flat surface of the metal conductor section (die pad section) 800F arranged on the surface of the substrate sheet side on which the inner lead sections 5 are formed. Patterned recesses 800*t*, as shown in FIGS. 91 and 92, can be provided on the flat surface of the metal conductor section (die pad section) 800G arranged on the surface of the substrate sheet side on which the inner lead sections 5 are formed. As described above, by providing the surface of the metal conductor section with minute undulations or patterned recesses, the adhesion strength can be increased when sticking the semiconductor chip to the metal conductor section with an adhesive.

The method for forming the respective metal conductor sections is as follows.

The metal conductor sections located on the front surface and the rear surface in the semiconductor chip placement region of the substrate sheet are formed concurrently with the formation of the inner lead sections and the outer lead sections by the same steps and method as those for forming the inner lead sections and the outer lead sections.

The method for electrically connecting the metal conductor section located on the front surface and the metal conductor section on the rear surface, by way of the through holes, may have the procedure of forming through holes with a drill, a router, laser, or the like, similar to the through holes when forming through holes to be used for the connecting sections, forming metal layers on the wall surfaces of the through holes by the same steps and method as those for forming the metal layer that serves as connecting sections on the side walls of the through holes. Thereafter, the metal conductor section located on the front surface side and the metal conductor section located on the rear surface side are concurrently formed by the same steps and method as those for forming the inner lead sections and the outer lead sections.

The through holes are formed by being filled up with epoxy resin or the like, by means of a dispenser, screen printing, a blade, or the like and then cured. In order to further provide metal layers on the metal conductor section and the rear surface metal conductor section whose holes are filled up, a metal layer is formed on the entire insulating substrate surface by electroless plating and electroplating after filling up the holes. Thereafter, the metal layers are concurrently formed by the same processes and method as those for forming the inner lead sections and the outer lead sections.

The method for forming the another connecting sections is as follows.

The another connecting sections 851 are formed on the side wall surfaces located on the semiconductor chip placement region side of the through holes concurrently with the formation of the connecting sections of the inner lead sections and the outer lead sections by the same steps and method as those for forming the connecting sections of the inner lead sections and the outer lead sections. It is to be noted that the shape of the another connecting sections on the side wall surfaces may have the same shape as that of the inner lead sections and the outer lead sections or another shape. There may be no pattern. The through holes in this example are filled up with resin by the same method as that of filling up the above through holes.

The shape of each metal conductor section has a size larger than the size of the semiconductor chip. If the metal conductor section is smaller than the size of the semiconductor chip, then there is a concern about the breaking of the semiconductor chip section projecting out of the metal conductor section.

Each metal conductor section has a shape that does not come in contact with the inner lead sections. It is to be noted that the inner lead sections are partially extended to the inside of the semiconductor chip placement region and used as the metal conductor section while made to have a shape that does not come in contact with the other inner lead sections.

The surface of the metal conductor section has a flat surface similar to the surface of the inner lead sections and the outer lead sections. However, minute undulations or patterned recesses may be formed as the need arises. As a surface treatment for the metal conductor section, it is proper to perform the same surface treatment as that of the inner lead sections, the outer lead sections, and the connecting sections, or to perform no surface treatment.

The semiconductor module substrate sheet, the semiconductor module substrate sheet fabricating method, the semiconductor module, and the fabricating method of the module of each of the aforementioned embodiments of the present invention, which have the aforementioned constructions and operations, produce the following effects.

In detail, there are provided an insulating substrate having a semiconductor chip placement region on which a semiconductor chip can be placed, a plurality of inner lead sections that are formed on a surface identical to that of the semiconductor chip placement region of the insulating substrate and respectively electrically connected to a plurality of electrode terminals of the semiconductor chip placed on the semiconductor chip placement region so as to form a semiconductor module, a plurality of outer lead sections formed on a surface opposite to that of the semiconductor chip placement region of the insulating substrate, and a plurality of connecting sections that respectively connect the plurality of inner lead sections with the plurality of outer lead sections on a side wall surface of the insulating substrate.

More specifically, there is employed a semiconductor module substrate sheet having an insulating substrate having a single or a plurality of semiconductor chip placement regions. Through holes, recesses, or edges are arranged on four sides, except for part of connecting portions of the semiconductor chip placement region or regions or on opposite two sides of each semiconductor chip placement region. A plurality of inner lead sections are formed in a pattern on one surface of the insulating substrate and extended from the through holes, recesses, or edges toward each semiconductor chip placement region. A plurality of outer lead sections are formed in pattern on the other surface of the insulating substrate and extended from through holes, recesses, or edges toward each semiconductor chip placement region. A number of connecting sections are formed by patterning on the side wall surfaces of the through holes, recesses or edges between the inner lead sections and the outer lead sections provided on both surfaces of the insulating substrate. Before or after performing cutting outside each semiconductor chip placement region or the plurality of semiconductor chip placement regions in correspondence with each semiconductor chip placement region or the plurality of semiconductor chip placement regions, the semiconductor chips are mounted, and the electrode terminals of the semiconductor chips are electrically connected with the inner lead sections, obtaining a semiconductor module. Further, through the steps for encapsulating the semiconductor chips and at least the through hole side of the inner lead sections, a semiconductor package is obtained.

Therefore, by virtue of the inner lead sections directly formed on the substrate of the semiconductor module, there is required a reduced number of semiconductor module fabricating steps.

Furthermore, by virtue of the inner lead sections directly formed on the substrate of the semiconductor module, even if inner lead sections having many pins are formed at narrow pitches as in some semiconductor modules, then a high-density compacted semiconductor module can be fabricated while maintaining the dimensional accuracy of the narrow-pitch inner lead sections having many pins.

By virtue of the outer lead sections provided on the rear surface of the substrate of the semiconductor module and the inner lead sections and the outer lead sections connected together by way of the connecting sections provided on the side surfaces of the substrate, the semiconductor module or the semiconductor package is surface-mounted. Therefore, the lead material is not required to have rigidity.

The semiconductor module substrate sheet, the semiconductor module substrate sheet fabricating method, and the semiconductor module of the present invention, which have the following constructions and operations, produce the following effects.

In detail, there is provided an insulating substrate having a semiconductor chip placement region on which a semiconductor chip can be placed. A plurality of inner lead sections are formed on a surface identical to that of the semiconductor chip placement region of the insulating substrate and respectively electrically connected to a plurality of electrode terminals of the semiconductor chip placed on the semiconductor chip placement region so as to form a semiconductor module. A plurality of outer lead sections are formed on a surface opposite to that of the semiconductor chip placement region of the insulating substrate. A plurality of connecting sections are respectively connected the plurality of inner lead sections with the plurality of outer lead sections on a side wall surface of the insulating substrate.

Therefore, by virtue of the inner lead sections directly formed on the substrate sheet that serves as the substrate of the semiconductor module, there is required a reduced number of semiconductor module fabricating steps.

Furthermore, by virtue of the inner lead sections directly formed on the substrate sheet that serves as the substrate of the semiconductor module, even if inner lead sections having many pins are formed at narrow pitches as in some semiconductor modules, a high-density compacted semiconductor module can be fabricated while maintaining the dimensional accuracy of the narrow-pitch inner lead sections having many pins.

The semiconductor module or the semiconductor package is surface-mounted in the state in which the outer lead sections are provided on the rear surface of the substrate sheet that serves as the substrate of the semiconductor module. The inner lead sections and the outer lead sections are connected together by way of the connecting sections provided on the side surfaces of the substrate sheet that serves as the substrate. The lead material is not required to have rigidity.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for fabricating a semiconductor module substrate sheet, said method comprising:
   forming photoresist films on both surfaces of an insulating substrate and the side wall surface of the insulating substrate; thereafter partially exposing the photoresist films to light and then developing the photoresist films for patterning of plating resist layers that exist in unnecessary portions of inner lead sections and outer lead sections and unnecessary portions of connecting sections on the side wall surface of the insulating substrate; and thereafter performing electroless plating or electroplating to form the inner lead sections, the outer lead sections, and the connecting sections in portions that belong to both surfaces of the insulating substrate and the side wall surface and are not covered with the plating resist layer.

2. A semiconductor module substrate sheet fabricating method as defined in claim 1, wherein the photoresist film is a photocurable type when patterning the plating resist layer, and wherein the exposing to light is performed with a ninth mask in which lead pattern forming-sections for forming the inner lead sections and connection pattern forming-sections for forming the connecting sections do not transmit light and the other portions transmit light and a light control sheet that diff-uses or refracts incident light and then emits the light from a side opposite from an incident side superposed on one surface of the substrate and the exposing to light is performed with a tenth mask in which lead pattern forming-sections for forming the outer lead sections and connection pattern forming-sections for forming the connecting sections do not transmit light and the other portions transmit light and a light control sheet that diffuses or refracts incident light and then emits the light from a side opposite from an incident side superposed on the other surface of the substrate, resulting in curing of only exposed portions of the photoresist film; and thereafter developing the photoresist film is performed for the removal of uncured portions other than cured portions to form the plating resist layer in portions other than portions where the inner lead sections, the outer lead sections, and the connecting sections are formed.

3. A semiconductor module substrate sheet fabricating method as defined in claim 1, wherein the photoresist film is a photolysis type when patterning the plating resist layer, and wherein the exposing to light is performed with an eleventh mask in which lead pattern forming-sections for forming the inner lead sections and connection pattern forming-sections for forming the connecting sections transmit light and the other portions obstruct light and a light control sheet that diffuses or refracts incident light and then emits the light from a side opposite from an incident side superposed on one surface of the substrate and the exposing to light is performed with a twelfth mask in which lead pattern forming-sections for forming the outer lead sections and connection pattern forming-sections for forming the connecting sections transmit light and the other portions obstruct light and a light control sheet that diffuses or refracts incident light and then emits the light from a side opposite from an incident side superposed on the other surface of the substrate, resulting in photolysis of only exposed portions of the photoresist film, and thereafter developing the photoresist film is performed for the removal of only portions that have undergone photolysis to form the plating resist layer in portions other than portions where the inner lead sections, the outer lead sections, and the connecting sections are formed.

4. A semiconductor module substrate sheet fabricating method as defined in claim 1, wherein the photoresist film is a photocurable type when patterning the plating resist layer; and wherein the exposing to light is performed with a thirteenth mask in which lead pattern forming-sections for forming either one of the inner lead sections and the outer lead sections and connection pattern forming-sections for forming the connecting sections do not transmit light and the other portions transmit light and a light control sheet that diffuses or refracts incident light and then emits the light from a side opposite from an incident side superposed on one surface of the substrate and the exposing to light is performed with a fourteenth mask in which lead pattern forming-sections for forming the other one of the inner lead sections and the outer lead sections and portions to be superposed on the through holes do not transmit light and the other portions transmit light superposed on the other surface of the substrate, resulting in curing of only exposed portions of the photoresist film; and thereafter developing the photoresist film is performed for the removal of uncured portions other than cured portions to form the plating resist layer in portions other than portions where the inner lead sections, the outer lead sections, and the connecting sections are formed.

5. A semiconductor module substrate sheet fabricating method as defined in claim 1, wherein the photoresist film is a photolysis type when patterning the plating resist layer, and wherein the exposing to light is performed with a fifteenth mask in which lead pattern forming-sections for forming either one of the inner lead sections .and the outer lead sections and connection pattern forming-sections for forming the connecting sections transmit light and the other portions obstruct light and a light control sheet that diffuses or refracts incident light and then emits the light from a side opposite from an incident side superposed on one surface of the substrate and the exposing to light is performed with a sixteenth mask in which only lead pattern forming-sections for forming the other one of the inner lead sections and the outer lead sections transmit light and the other portions obstruct light superposed on the other surface of the substrate, resulting in photolysis of only exposed portions of the photoresist film; and thereafter developing the photoresist film is performed for the removal of only portions that have undergone photolysis to form the plating resist layer in portions other than portions where the inner lead sections, the outer lead sections, and the connecting sections are formed.

* * * * *